(12) United States Patent
Ootsuka

(10) Patent No.: US 9,515,114 B2
(45) Date of Patent: Dec. 6, 2016

(54) SOLID-STATE IMAGING DEVICE, METHOD OF FORMING MICROLENS IN SOLID-STATE IMAGING DEVICE, AND ELECTRONIC APPARATUS

(71) Applicant: Sony Corporation, Tokyo (JP)

(72) Inventor: Yoichi Ootsuka, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/368,720

(22) PCT Filed: Feb. 27, 2013

(86) PCT No.: PCT/JP2013/001188
§ 371 (c)(1),
(2) Date: Jun. 25, 2014

(87) PCT Pub. No.: WO2013/128925
PCT Pub. Date: Sep. 6, 2013

(65) Prior Publication Data
US 2015/0102442 A1    Apr. 16, 2015

(30) Foreign Application Priority Data

Mar. 1, 2012  (JP) ................................ 2012-045286
Oct. 3, 2012  (JP) ................................ 2012-220931
Jan. 29, 2013  (JP) ................................ 2013-014563

(51) Int. Cl.
*H01L 27/146*    (2006.01)
*H04N 5/369*    (2011.01)
*H04N 5/232*    (2006.01)

(52) U.S. Cl.
CPC ... *H01L 27/14627* (2013.01); *H01L 27/14623* (2013.01); *H04N 5/23212* (2013.01); *H04N 5/3696* (2013.01); *H01L 27/14643* (2013.01)

(58) Field of Classification Search
CPC .................... H01L 27/14627; H01L 27/14643; H01L 27/14645; H04N 5/23212; H04N 5/3696
See application file for complete search history.

(56) References Cited

U.S. PATENT DOCUMENTS

2009/0008687 A1    1/2009  Katsuno et al.
2009/0251556 A1*   10/2009  Mabuchi .......... H01L 27/14621
                                                        348/222.1
(Continued)

FOREIGN PATENT DOCUMENTS

EP    2 362 257 A1    8/2011
JP    2009-109965 A    5/2009

*Primary Examiner* — Whitney T Moore
(74) *Attorney, Agent, or Firm* — Chip Law Group

(57) ABSTRACT

A solid-state imaging device comprises an imaging pixel located in a light receiving region, the imaging pixel being a component of a unit pixel that is one of a plurality of unit pixels arranged in an array direction. A phase difference detection pixel is located in the light receiving region and is a component of the unit pixel, and has a corresponding photodiode with an upper surface. A first microlens corresponds to the imaging pixel, and a second microlens corresponding to the phase difference detection pixel. The second microlens has a first bottom surface in the array direction and a second bottom surface in a direction diagonal to the array direction, the second bottom surface being closer to the upper surface of the photodiode than the first bottom surface.

18 Claims, 49 Drawing Sheets

(56) References Cited

U.S. PATENT DOCUMENTS

| | | | |
|---|---|---|---|
| 2010/0091161 A1* | 4/2010 | Suzuki | H01L 27/14609 348/302 |
| 2010/0188532 A1 | 7/2010 | Kusaka et al. | |
| 2011/0221947 A1* | 9/2011 | Awazu | G02B 3/0043 348/311 |
| 2011/0242376 A1* | 10/2011 | Ando | H01L 27/14623 348/294 |
| 2012/0043634 A1* | 2/2012 | Kurihara | G02B 3/0018 257/432 |
| 2012/0225514 A1* | 9/2012 | Wada | H01L 27/14618 438/65 |
| 2015/0236066 A1* | 8/2015 | Tayanaka | H01L 27/14627 257/432 |
| 2016/0035780 A1* | 2/2016 | Itahashi | H04N 5/3765 348/294 |

\* cited by examiner

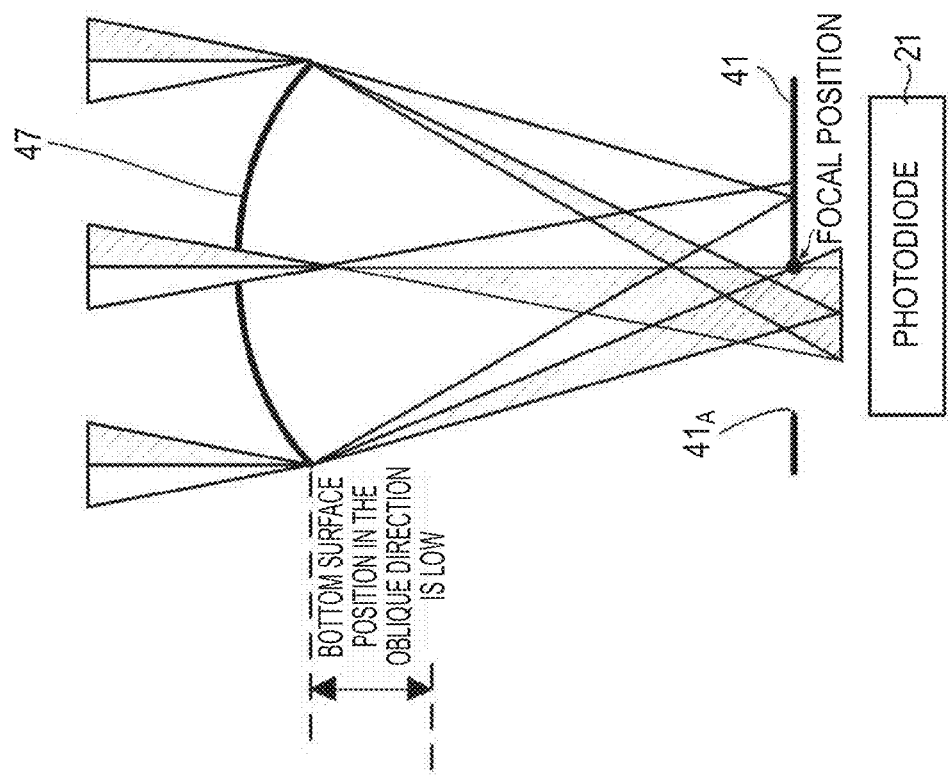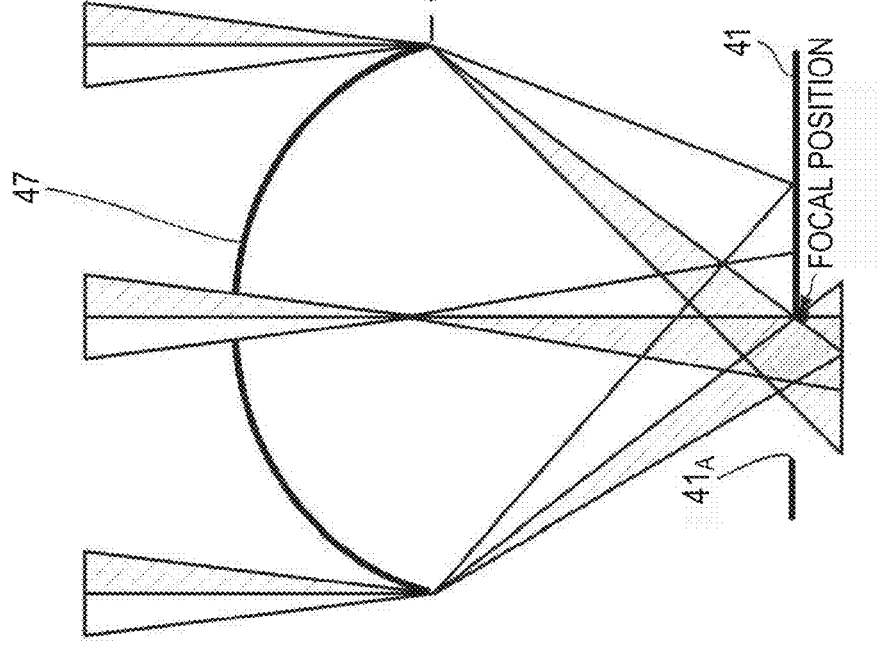

FIG.22
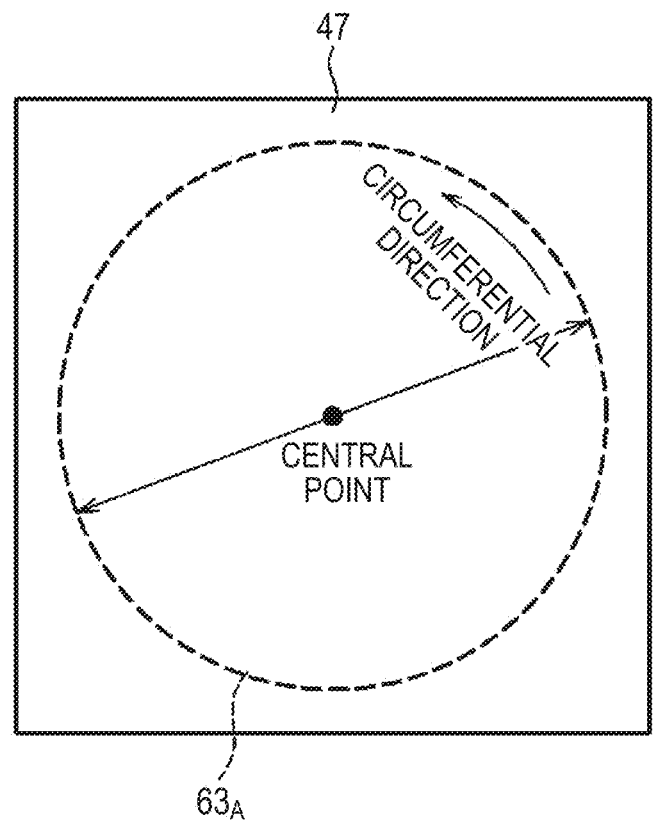
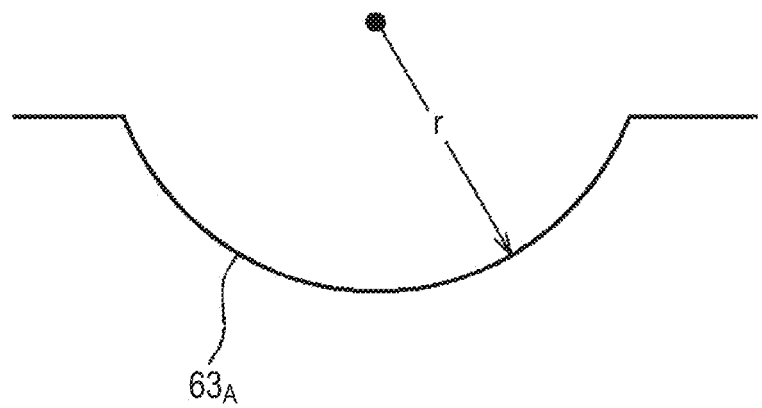

FIG.26
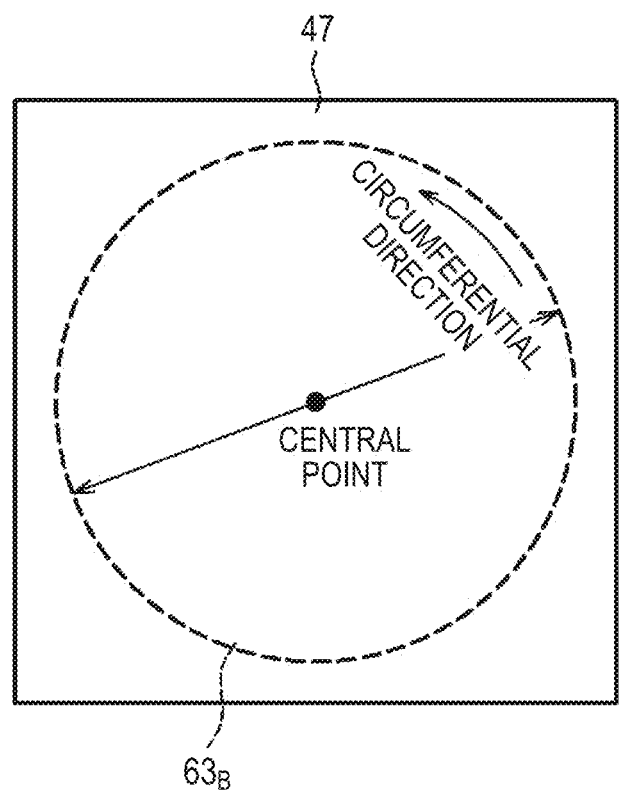
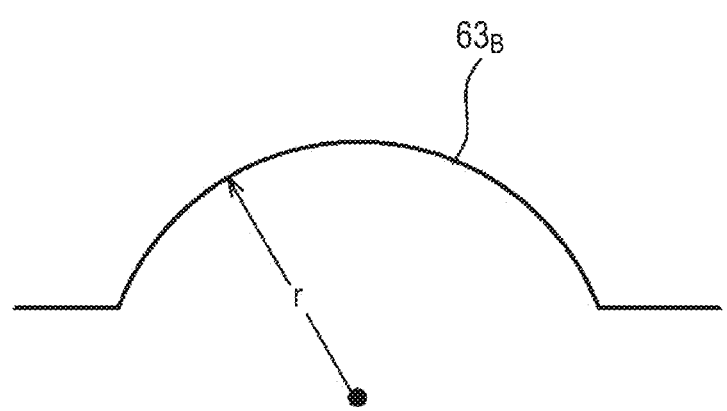

FIG.29
PROCESS 1
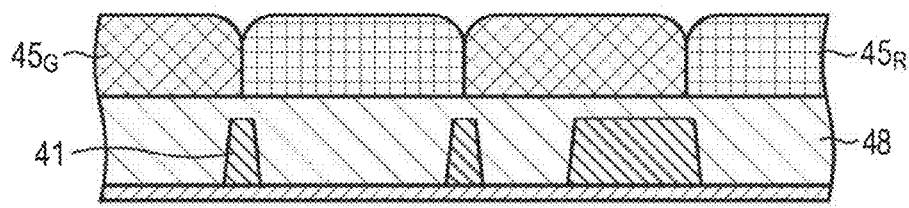
PROCESS 2
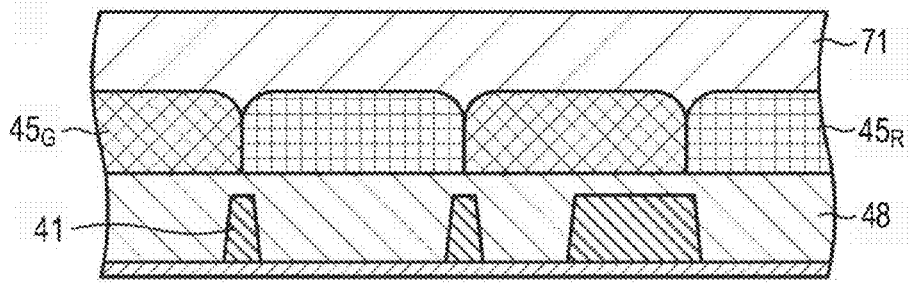
PROCESS 3
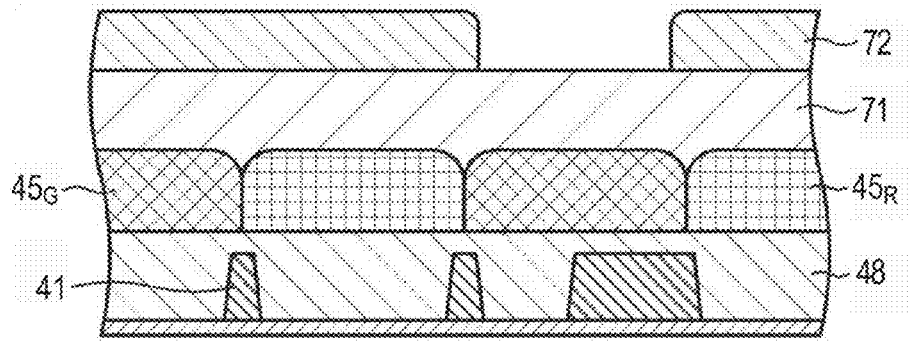
PROCESS 4
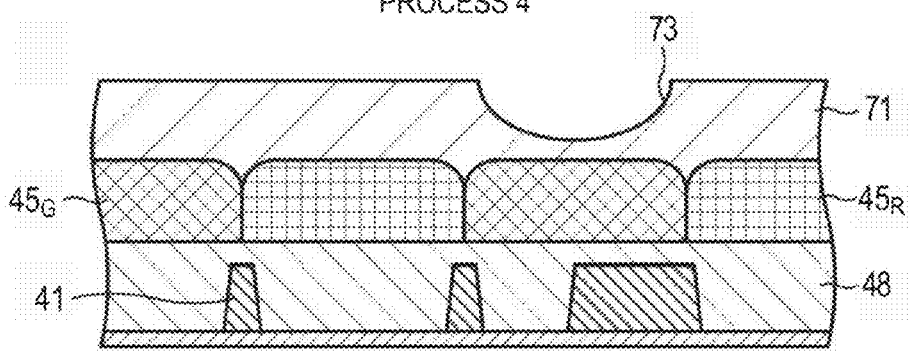

FIG.30
PROCESS 5
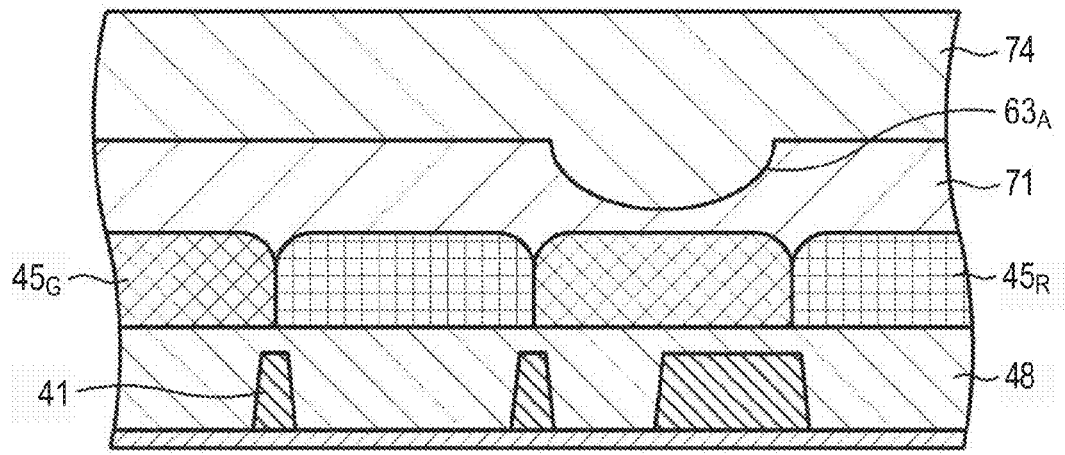
PROCESS 6
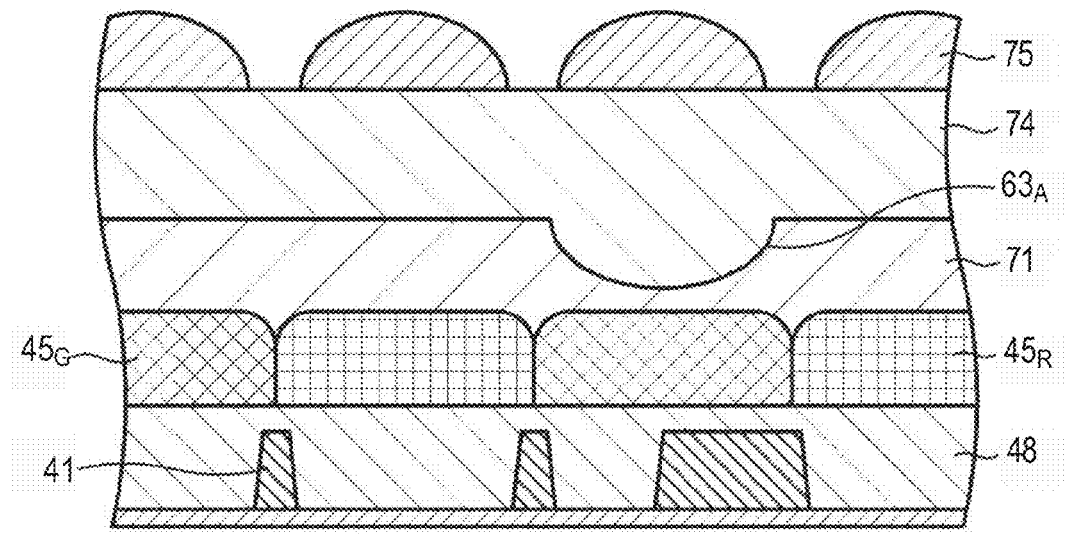

FIG.31
PROCESS 7
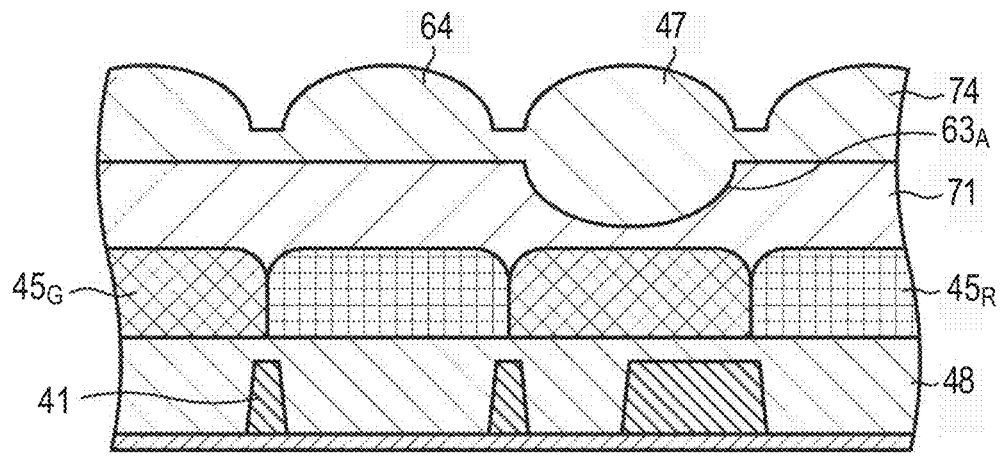
PROCESS 8
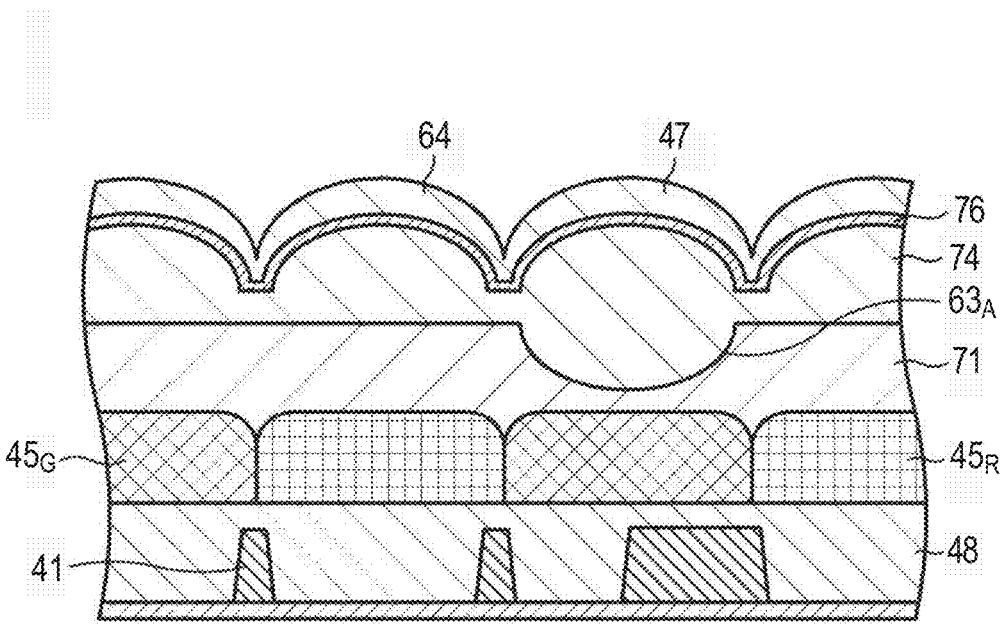

FIG.32
PROCESS 1
PROCESS 2
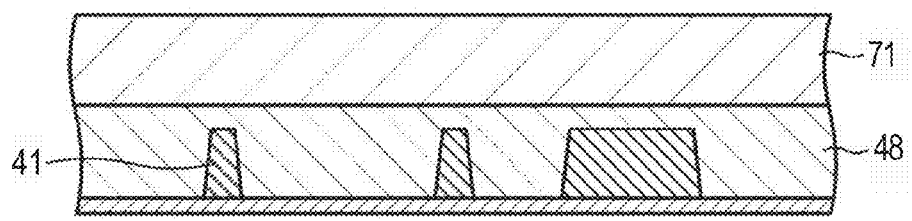
PROCESS 3
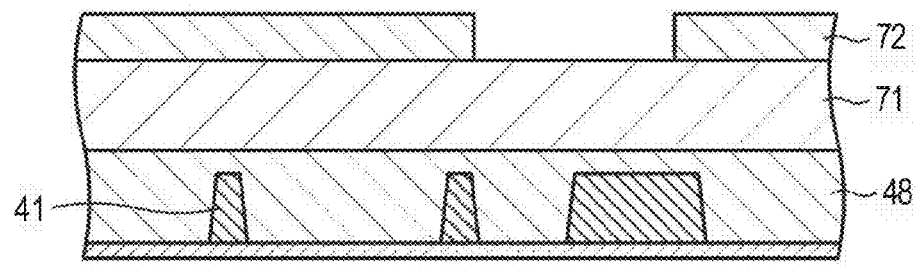
PROCESS 4
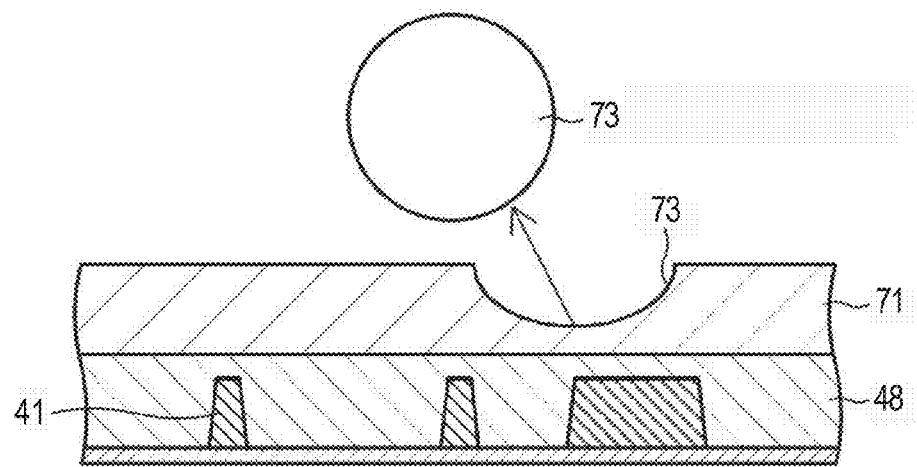

FIG.33
PROCESS 5
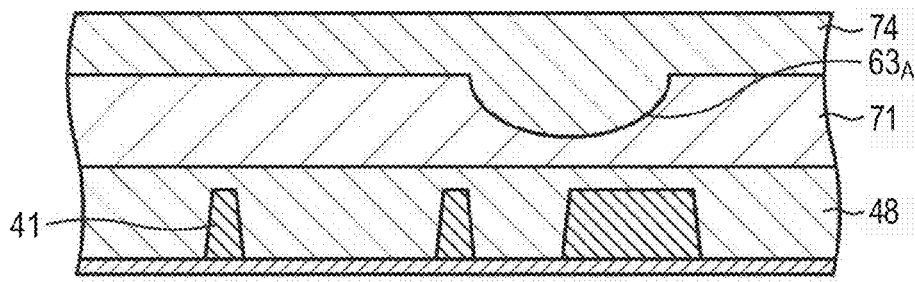
PROCESS 6
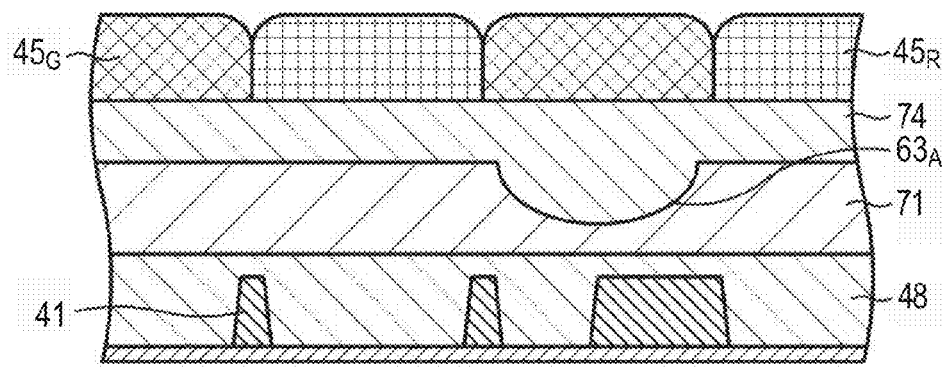
PROCESS 7
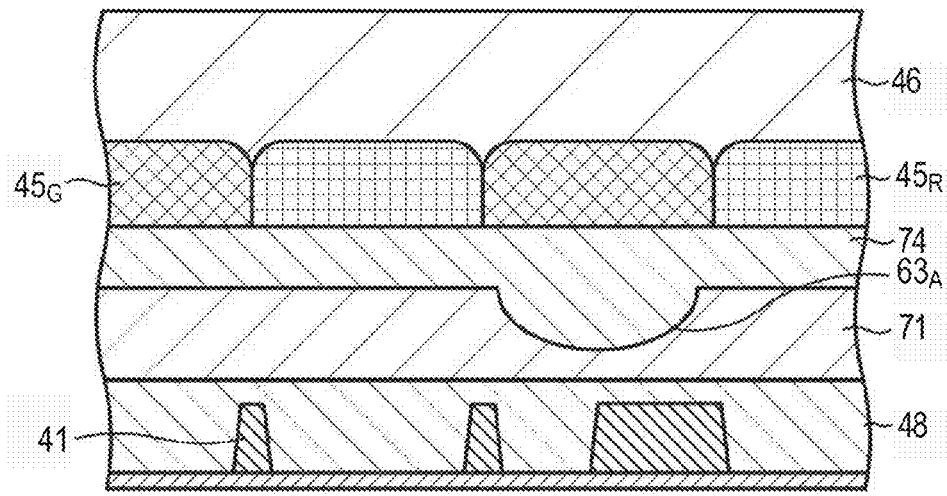

FIG.34
PROCESS 8
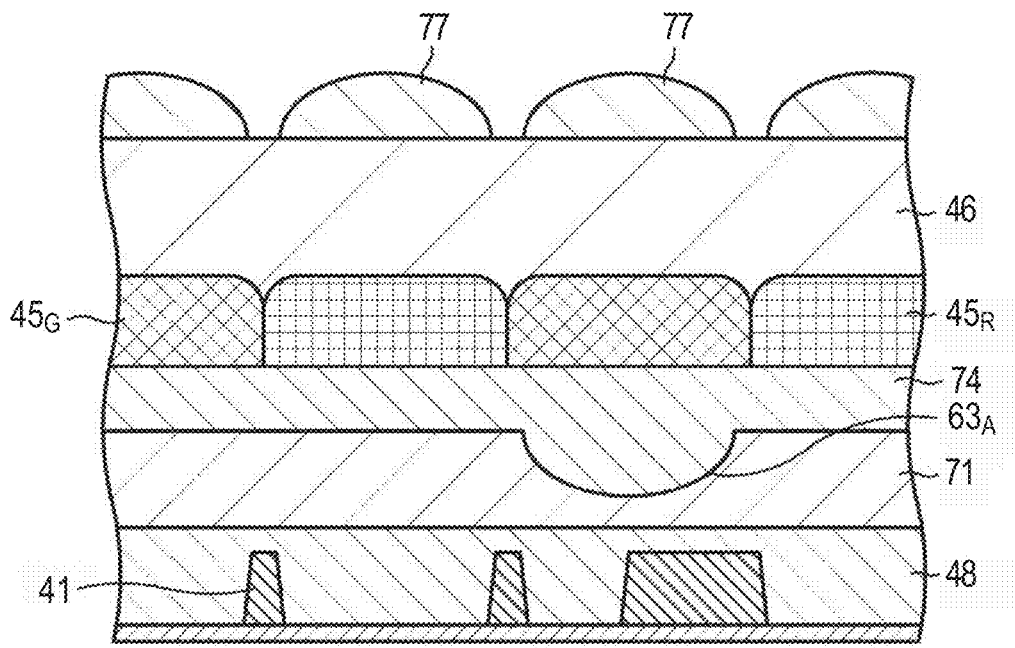
PROCESS 9
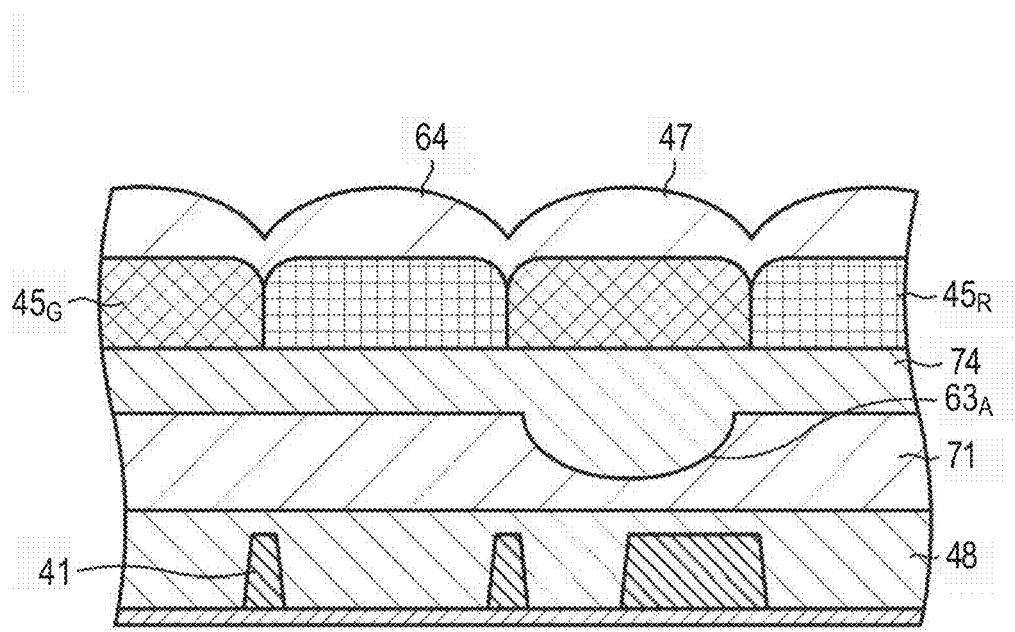

FIG.35
PROCESS 1
PROCESS 2
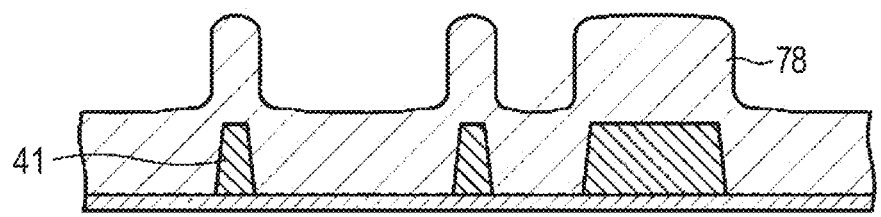
PROCESS 3

FIG.36
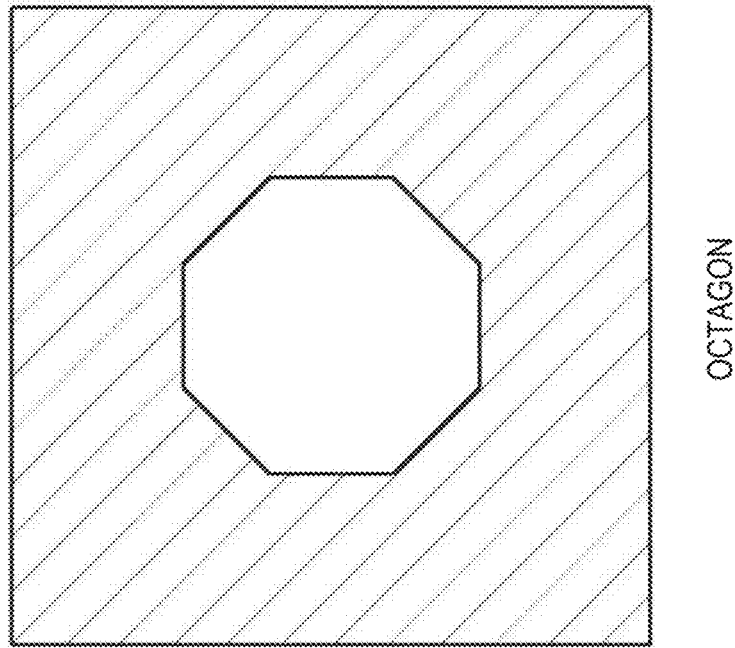
OCTAGON
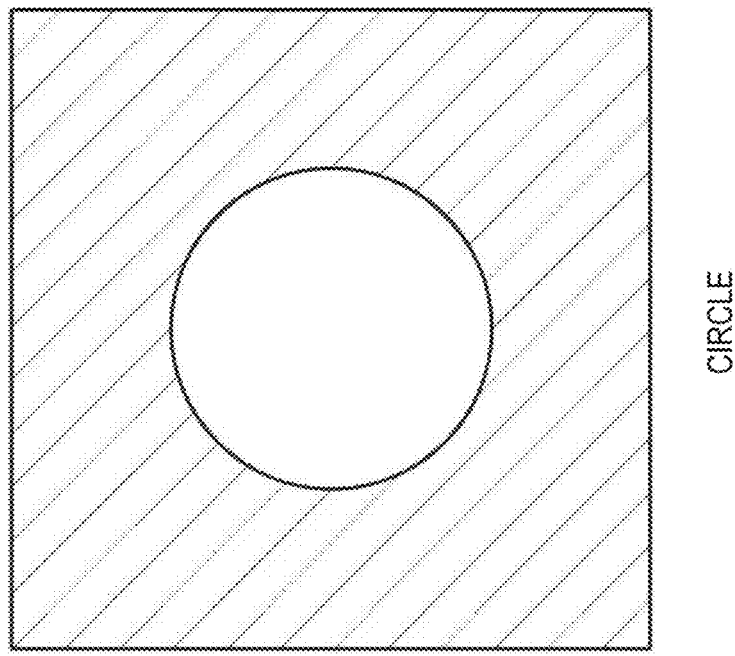
CIRCLE

FIG.37
PROCESS 1
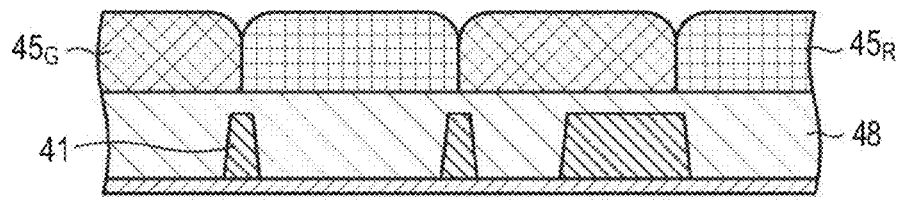
PROCESS 2
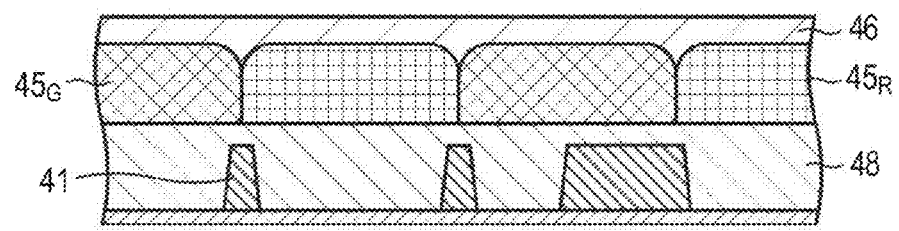
PROCESS 3
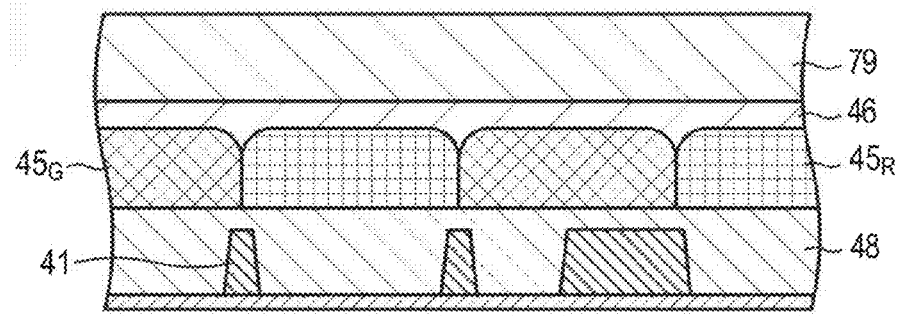
PROCESS 4
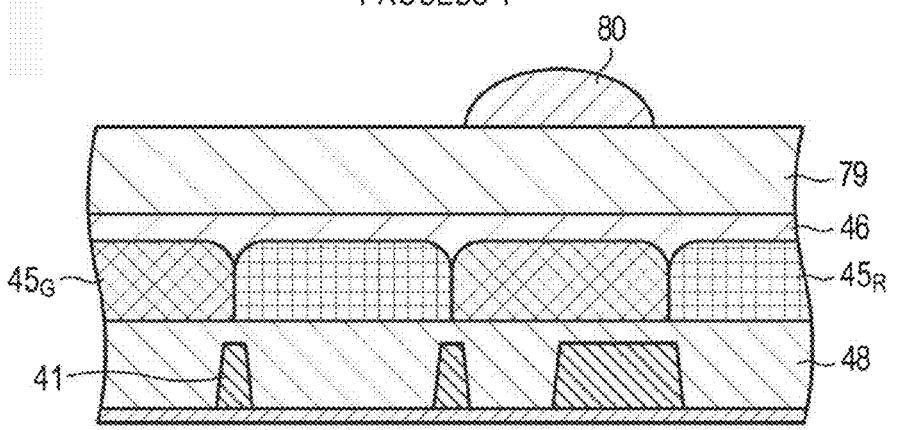

FIG. 38
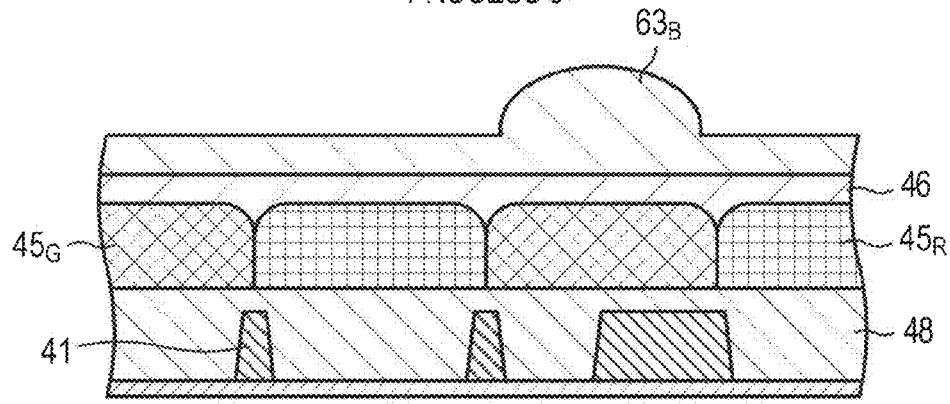
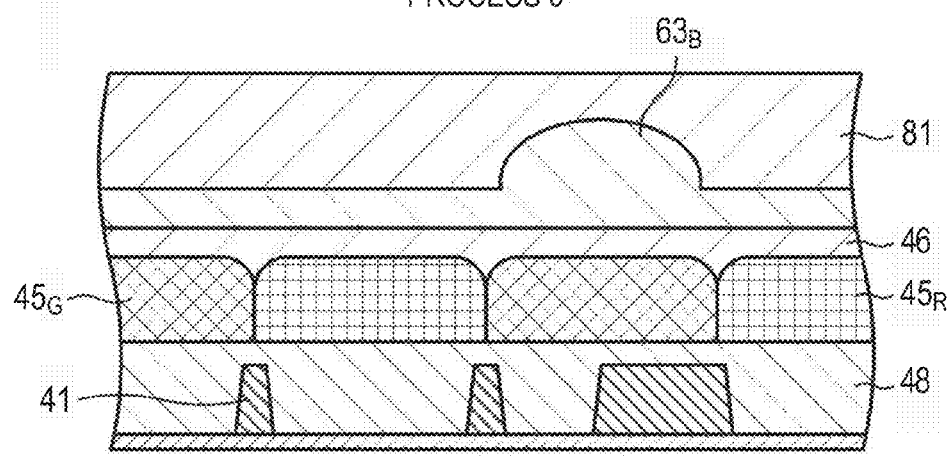
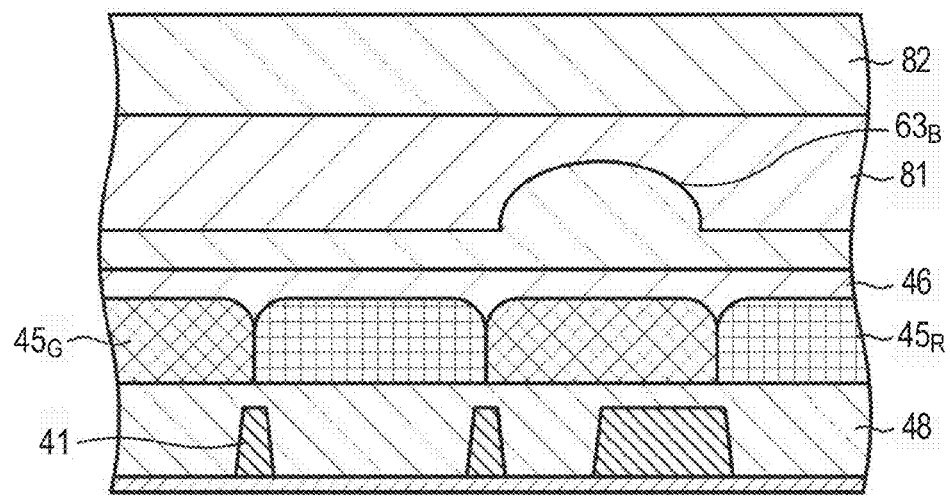

FIG.39
PROCESS 8
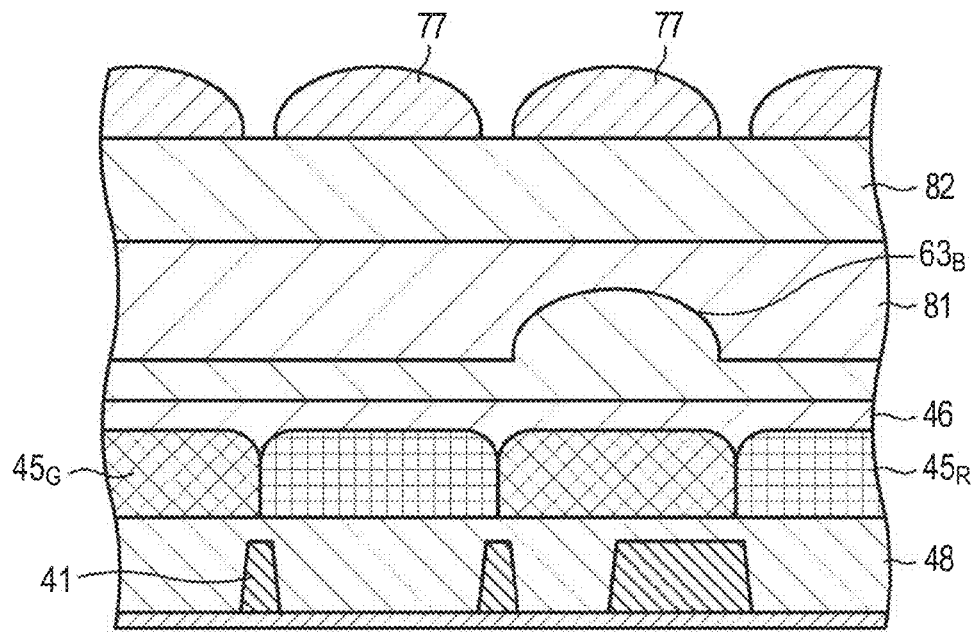
PROCESS 9
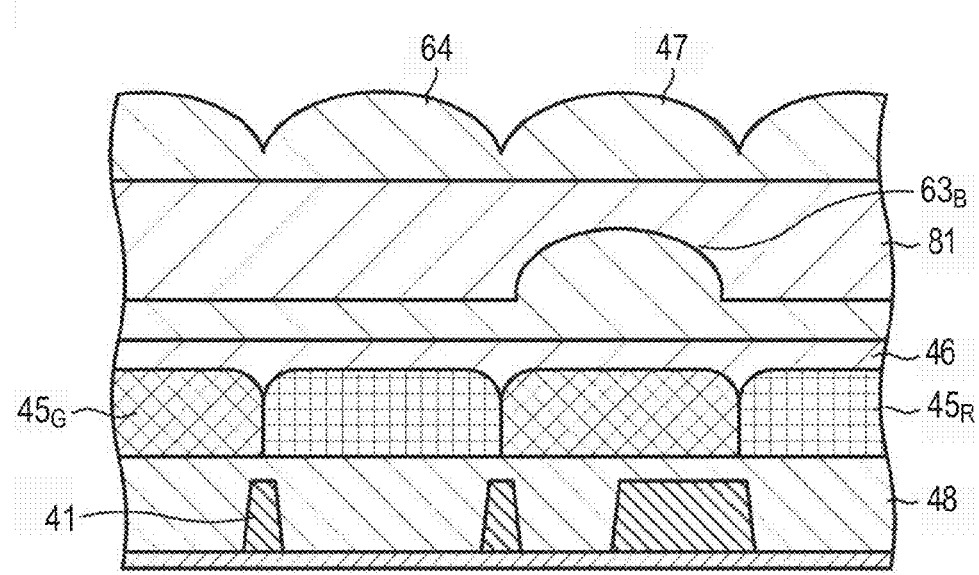

FIG.40
PROCESS 1
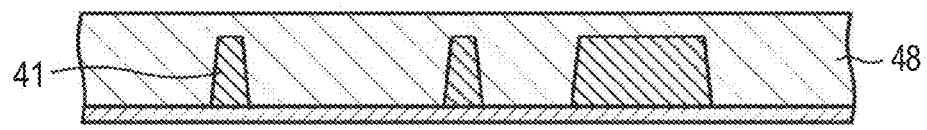
PROCESS 2
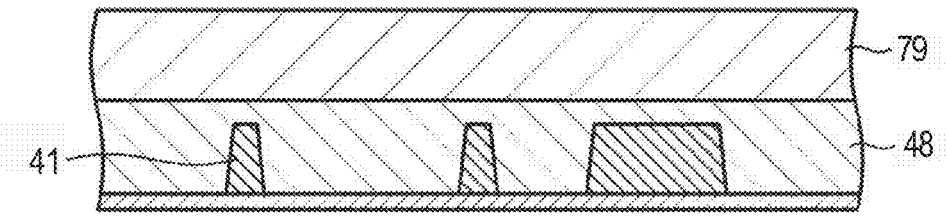
PROCESS 3
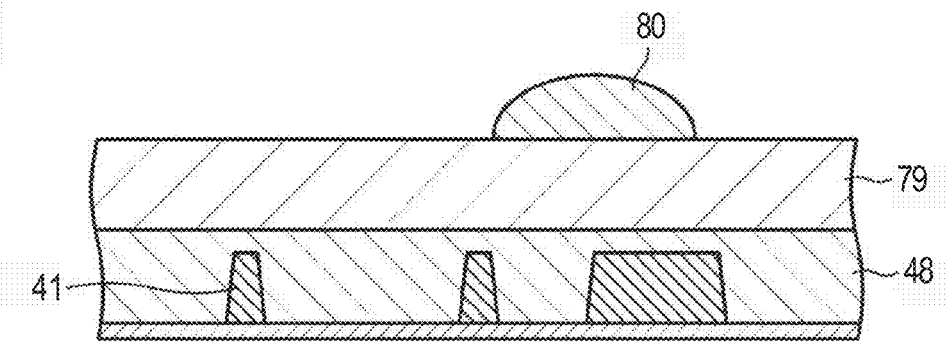
PROCESS 4
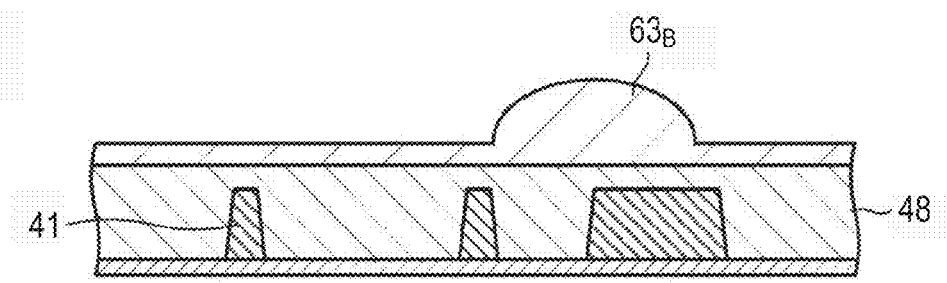

FIG.41
PROCESS 5
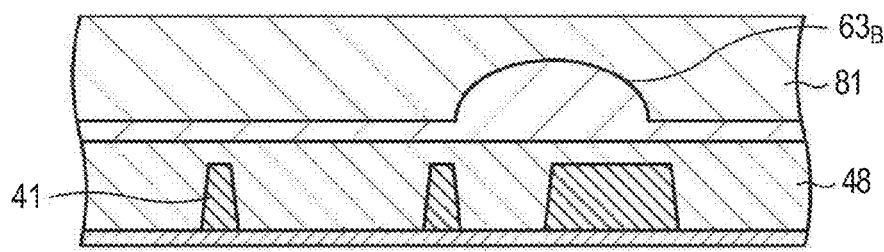
PROCESS 6
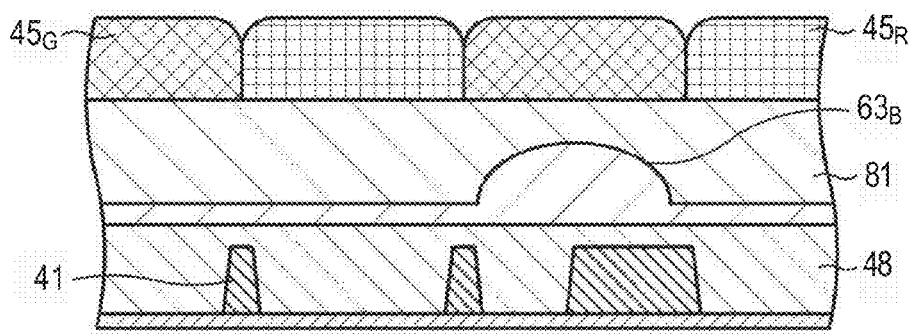
PROCESS 7
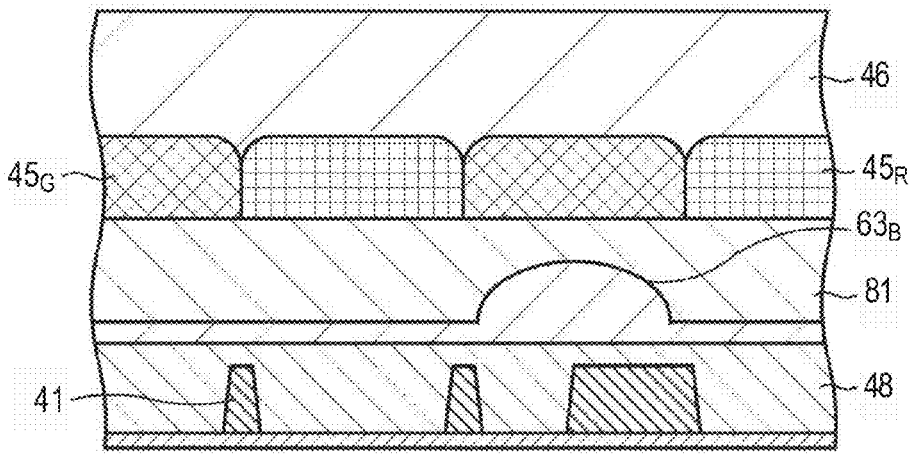

FIG.42
PROCESS 8
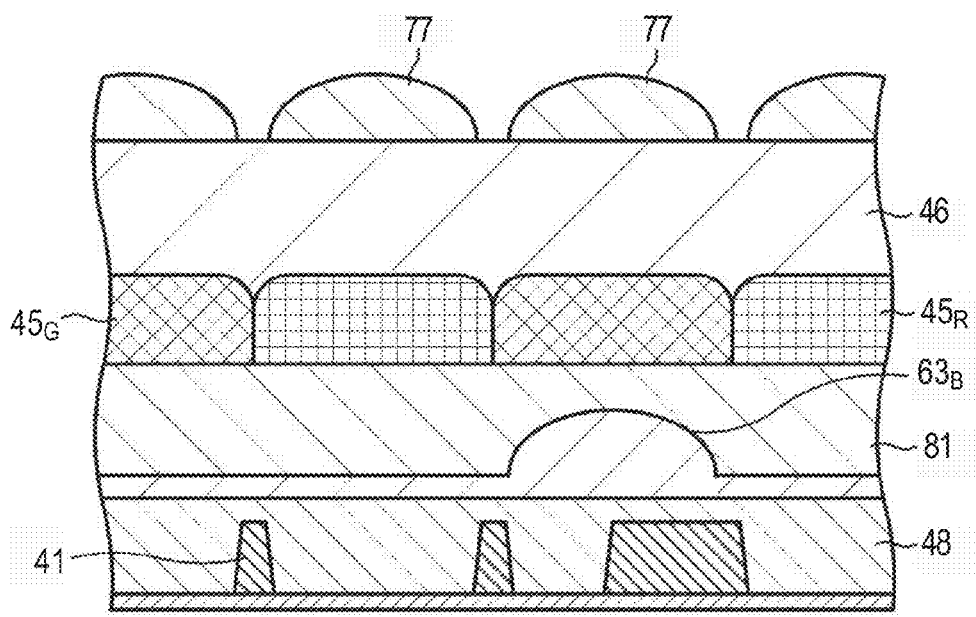
PROCESS 9
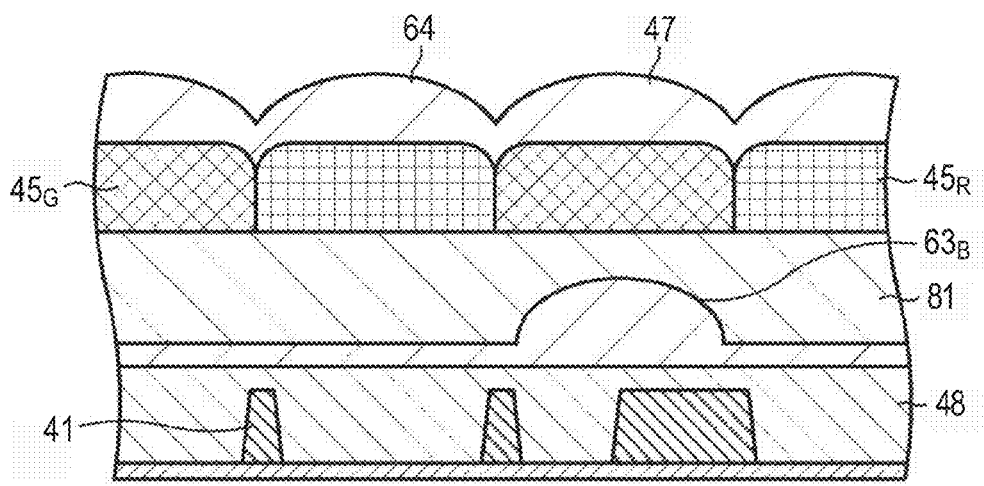

*FIG. 43*
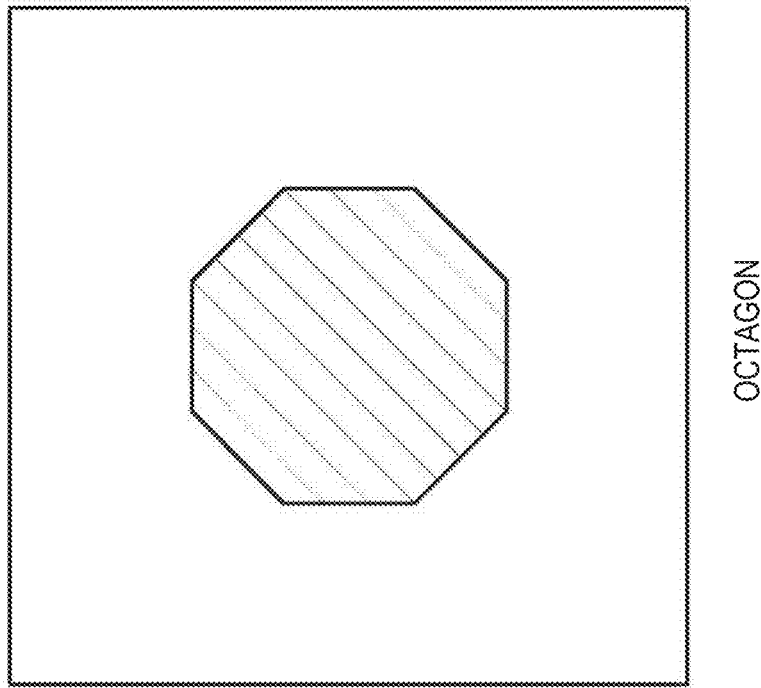
OCTAGON
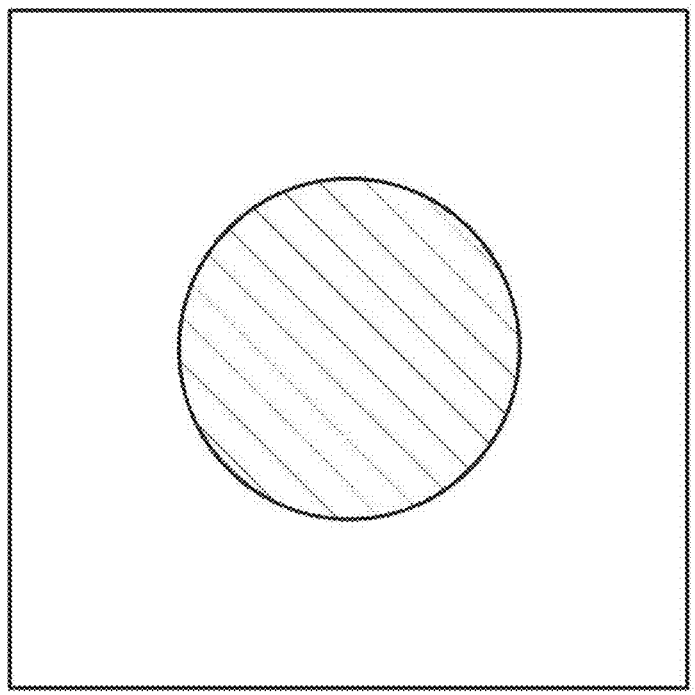
CIRCLE

SOLID-STATE IMAGING DEVICE, METHOD OF FORMING MICROLENS IN SOLID-STATE IMAGING DEVICE, AND ELECTRONIC APPARATUS

TECHNICAL FIELD

The present disclosure relates to a solid-state imaging device, a method of forming a microlens in the solid-state imaging device and an electronic apparatus.

BACKGROUND ART

In an imaging device, an auto focus (AF) technique for automatically achieving a focused state is generally classified into a contrast detection method and a phase difference detection method. The phase difference detection method is capable of a high-speed AF operation, which is superior to the contrast detection method.

As the phase difference detection method, a pupil-division phase difference detection method is generally known. The pupil-division phase difference method is a method in which a phase difference detection pixel or a focus detection pixel (hereinafter, generally referred to as a "phase difference detection pixel) in addition to imaging pixels are arranged in the same light receiving region (imaging region) to measure an AF distance in an imaging area, that is to obtain a phase difference detection signal indicating a shift direction and a shift amount of a focus.

In a case where the phase difference detection pixel is arranged in the imaging region of the solid-state imaging device, it is necessary to enhance the detection sensitivity of the phase difference detection pixel while maintaining a high sensitivity characteristic of the imaging pixels. Thus, in the related art, in a light blocking film formed to have an opening corresponding to each pixel, the opening corresponding to the phase difference detection pixel is formed to have a size smaller than that of the opening corresponding to the imaging pixel. Further, the focus of a microlens corresponding to the phase difference detection pixel is set to be "front defocusing" (refer to PTL1). Here, the "front defocusing" refers to a state where the focus is shifted in front of a subject.

CITATION LIST

Patent Literature

[PTL 1]
JP-A-2009-109965

SUMMARY OF INVENTION

Technical Problem

In the related art disclosed in PTL1, the radius of curvature of the microlens corresponding to the phase difference detection pixel is relatively small or the refractive index thereof is relatively high to achieve the front defocusing, and light flux passing through the right and left of an exit pupil of an imaging lens is divided, to thereby enhance the AF function.

Accordingly, it is desirable to provide a solid-state imaging device, a method of forming a microlens in the solid-state imaging device and an electronic apparatus including the solid-state imaging device that are capable of enhancing detection sensitivity (AF detection accuracy) of a phase difference detection pixel.

One example of an embodiment described herein is a solid-state imaging device comprising: an imaging pixel located in a light receiving region, the imaging pixel being a component of a unit pixel, the unit pixel being one of a plurality of unit pixels arranged in an array direction; a phase difference detection pixel located in the light receiving region and being a component of the unit pixel; a photodiode corresponding to at least the phase difference detection pixel and having an upper surface; a first microlens corresponding to the imaging pixel; and a second microlens corresponding to the phase difference detection pixel, the second microlens having a first bottom surface in the array direction and a second bottom surface in a direction diagonal to the array direction, the second bottom surface being closer to the upper surface of the photodiode than the first bottom surface.

A solid-state imaging device consistent with this example may also be configured such that a first focal distance corresponding to the array direction coincides with a second focal distance corresponding to the diagonal direction.

A solid-state imaging device consistent with this example may also be configured such that the phase difference detection pixel includes a light blocking film, with the second microlens being configured such that a focal distance thereof coincides with a position of the light blocking film.

A solid-state imaging device consistent with this example may also have the second microlens configured such that a focal length difference defined as the difference between a first focal distance corresponding to the array direction and a second focal distance corresponding to the diagonal direction is smaller than the focal length difference of a microlens adjacent to the second microlens.

A solid-state imaging device consistent with this example may also have an other imaging pixel that is a component of the pixel unit, with a third microlens corresponding to the other imaging pixel, and a gap between the first microlens and the third microlens in a planar view being substantially similar to the gap between the first microlens and the second microlens in the planar view.

A solid-state imaging device consistent with this example may also comprise a first auxiliary lens corresponding to the first microlens and located between the first microlens and the upper surface of the photodiode, the first auxiliary lens being concave in a light incident direction of the solid-state imaging device.

A solid-state imaging device consistent with this example may also comprise a second auxiliary lens corresponding to the second microlens and located between the second microlens and the upper surface of the photodiode, the second auxiliary lens being convex in a light incident direction of the solid-state imaging device. The second microlens may also have a width in the array direction that is greater than a width of the second auxiliary lens in the array direction.

A solid-state imaging device consistent with this example may also have a cross section along a light incident direction for a central pixel having a corresponding peripheral pixel, wherein a vertical center line of a microlens of the peripheral pixel is offset from a vertical center line of the peripheral pixel.

A solid-state imaging device consistent with this example may also have a cross section along a light incident direction for a central pixel having a corresponding peripheral pixel, wherein a vertical center line of a microlens of the peripheral pixel is offset from a vertical center line of an auxiliary lens corresponding to the microlens of the peripheral pixel.

Another example embodiment is a solid-state imaging device comprising: an imaging pixel located in a light receiving region, the imaging pixel being a component of a unit pixel, the unit pixel being one of a plurality of unit pixels arranged in an array direction; a phase difference detection pixel located in the light receiving region and being a component of the unit pixel; a first microlens corresponding to the imaging pixel; and a second microlens corresponding to the phase difference detection pixel, wherein the second microlens is configured such that a focal length difference defined as a difference between a first focal distance corresponding to a cross section of the array direction and a second focal distance corresponding to a cross section of the diagonal direction is smaller than a corresponding focal length difference of a microlens adjacent to the second microlens.

Another example embodiment is an electronic apparatus comprising: a solid-state imaging device comprising: an imaging pixel located in a light receiving region, the imaging pixel being a component of a unit pixel, the unit pixel being one of a plurality of unit pixels arranged in an array direction; a phase difference detection pixel located in the light receiving region and being a component of the unit pixel; a photodiode corresponding to at least the phase difference detection pixel and having an upper surface; a first microlens corresponding to the imaging pixel; and a second microlens corresponding to the phase difference detection pixel, the second microlens having a first bottom surface in the array direction and a second bottom surface in a direction diagonal to the array direction, the second bottom surface being closer to the upper surface of the photodiode than the first bottom surface.

Another example embodimentre is directed to a solid-state imaging device including: an imaging pixel that obtains an imaging signal; a phase difference detection pixel that is arranged in the same light receiving region as the imaging pixel is and pupil-divides light flux of received light to obtain a phase difference detection signal; a first microlens that is formed corresponding to the imaging pixel; and a second microlens that is formed corresponding to the phase difference detection pixel and is smaller than a microlens having substantially the same area in a planar view in difference between a focal distance of an opposite side boundary region including an opposite side central portion of a pixel boundary and a focal distance of a diagonal boundary region including a diagonal boundary.

The solid-state imaging device may be suitably used as an imaging section (image capturing section) in an electronic apparatus that employs the auto focus technique, particularly, the pupil-division phase difference detection method, such as a digital still camera, a video camera, or a personal digital assistant having an imaging function such as a mobile phone.

Another embodiment is directed to a method of forming a microlens in a solid-state imaging device including an imaging pixel that obtains an imaging signal, a phase difference detection pixel that is arranged in the same light receiving region as the imaging pixel is and pupil-divides light flux of received light to obtain a phase difference detection signal, a first microlens that is formed corresponding to the imaging pixel, and a second microlens that is formed corresponding to the phase difference detection pixel. The method includes: forming the second microlens that is smaller than a microlens having substantially the same area in a planar view in difference between a focal distance of an opposite side boundary region including an opposite side central portion of a pixel boundary and a focal distance of a diagonal boundary region including a diagonal boundary.

In the microlens (second microlens) corresponding to the phase difference detection pixel, the small difference between the focal distance of the opposite side boundary region including the opposite side central portion of the pixel boundary and the focal distance of the diagonal boundary region including the diagonal boundary means that the focal position in the array direction and the focal position in the diagonal direction are close to each other. Accordingly, it is possible to set all the focal positions in both the directions in the vicinity of the position of a light blocking film for pupil division, to thereby enhance division ability of right and left light from an exit pupil in both of the array direction and the diagonal direction.

According to at least one aspect of one or more of the above embodiments, it is possible to enhance division ability of right and left light in the array direction and the diagonal direction in the microlens corresponding to the phase difference detection pixel, thereby making it possible to enhance the detection sensitivity (AF detection accuracy) of the phase difference detection pixel.

Figure 4A:
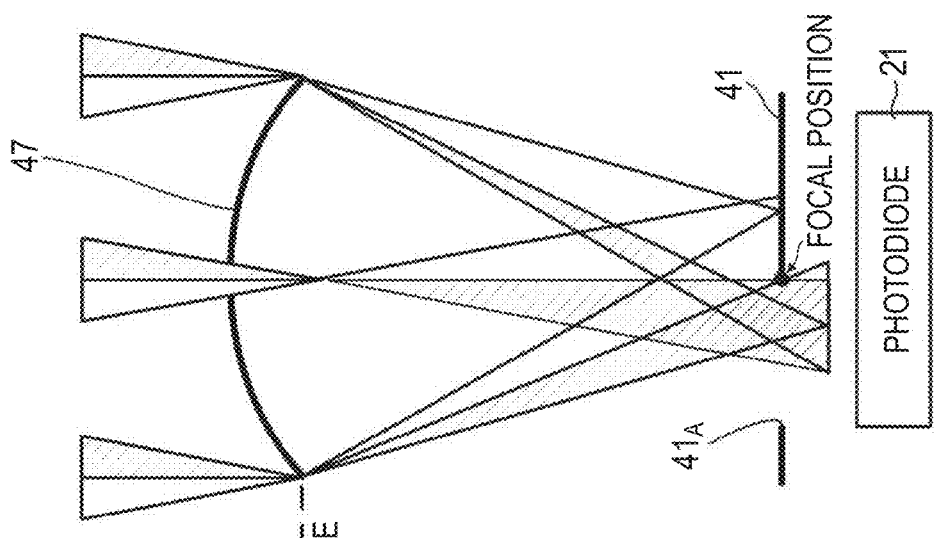
Figure 4B:
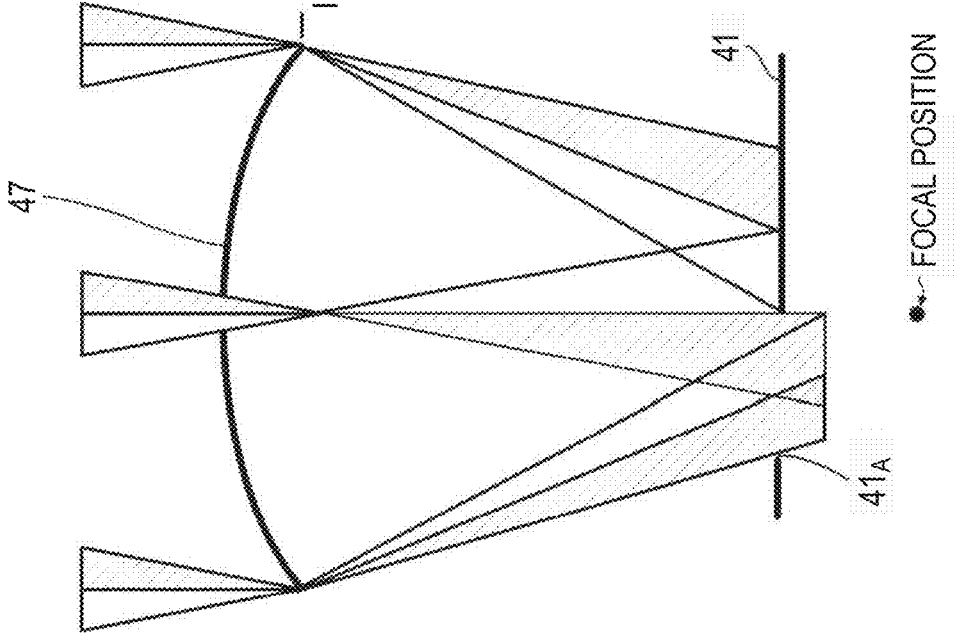

Part A in FIG. 4 is a diagram schematically illustrating a cross section, in the array direction, of a microlens that is generally formed corresponding to a phase difference detection pixel, and part B in FIG. 4 is a diagram schematically illustrating a cross section of the microlens in the diagonal direction.

Part A in FIG. 5 is a diagram schematically illustrating a cross section, in the array direction, of a microlens according to a first embodiment, and part B in FIG. 5 is a diagram schematically illustrating a cross section of the microlens in the diagonal direction.

Figure 6:
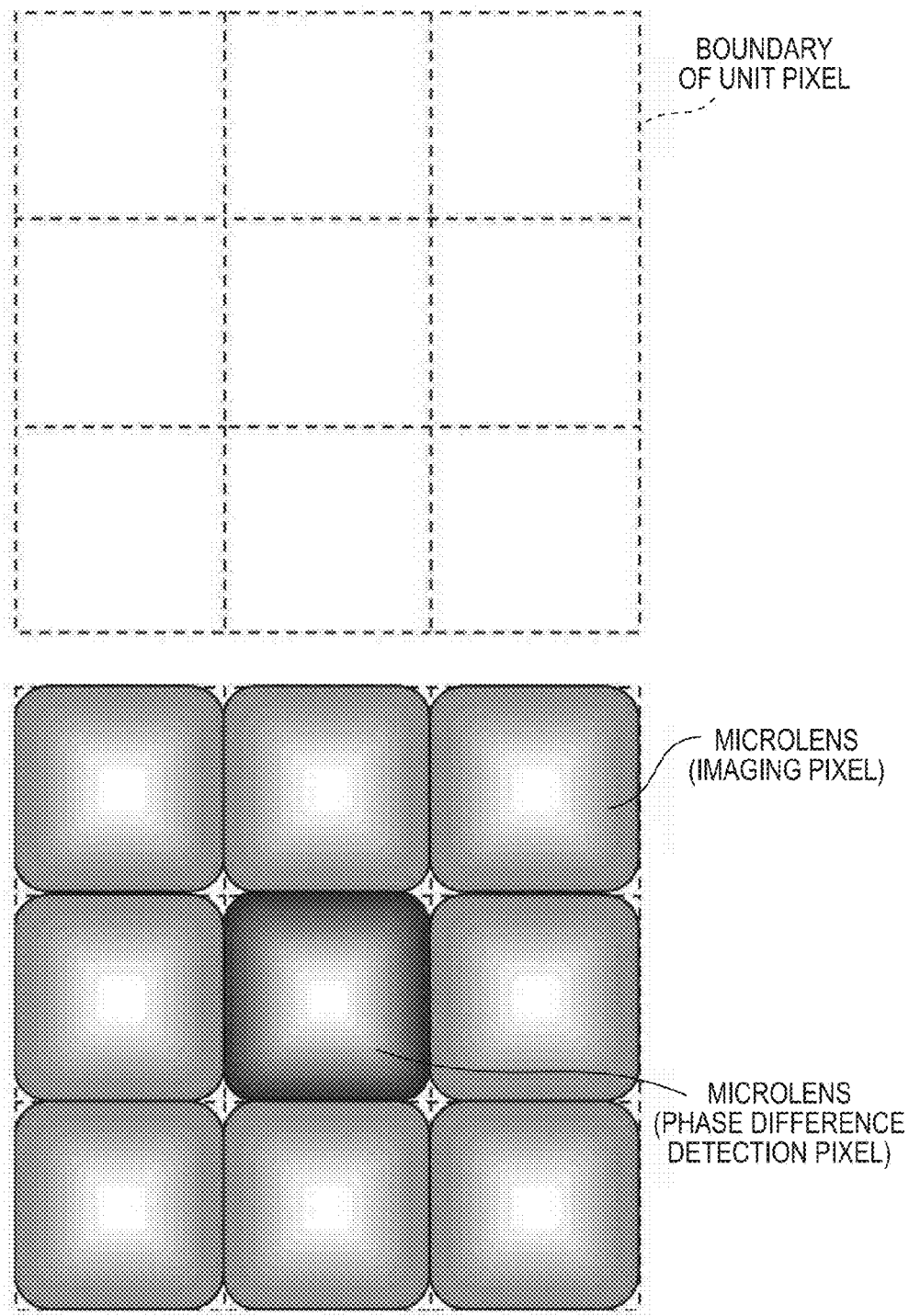

FIG. 6 is a diagram illustrating the definition of a "microlens formed in the same plane".

Figure 7:
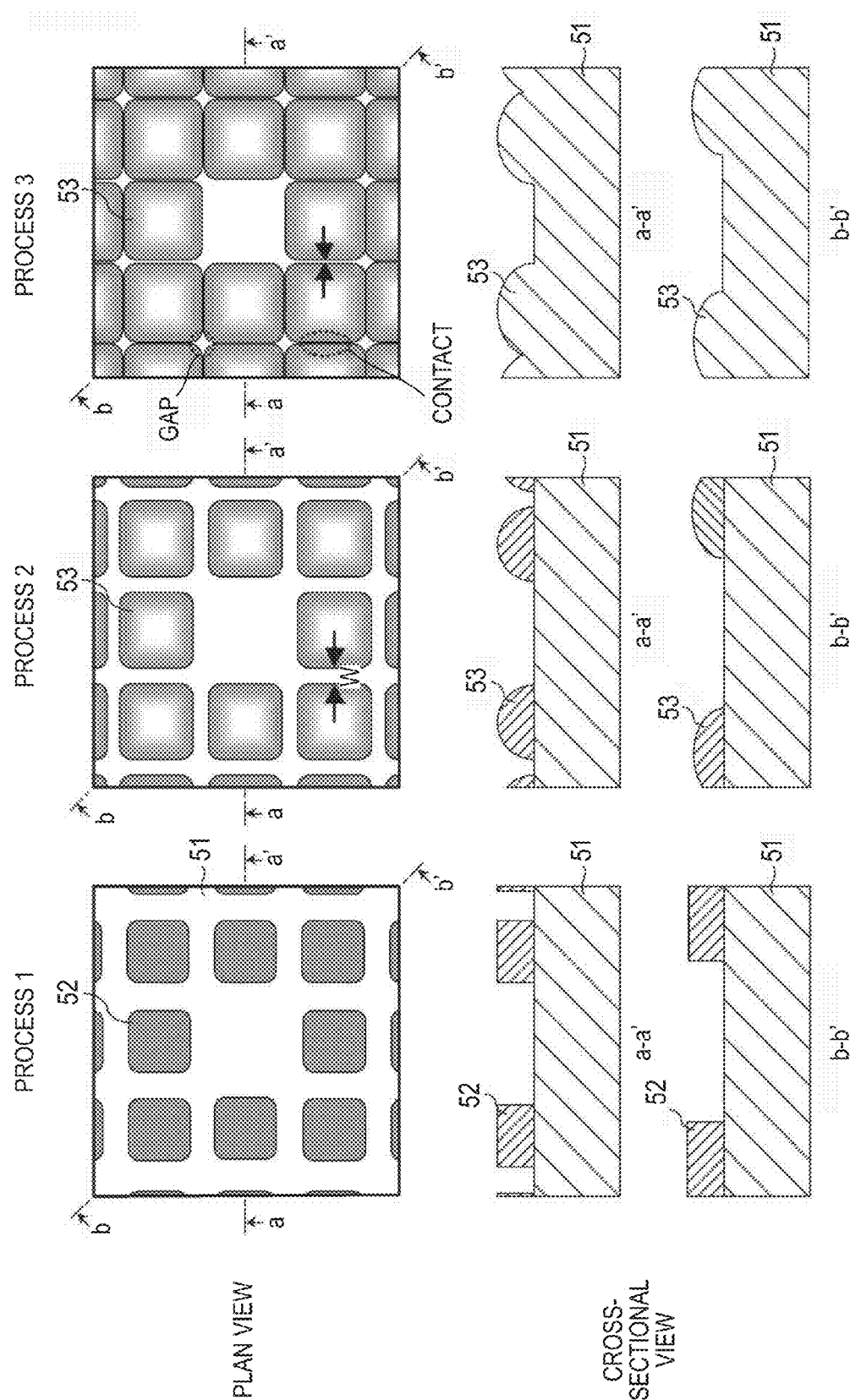

FIG. 7 is a process diagram (diagram 1) illustrating the flow of processes of a forming method of a microlens according to a first example.

Figure 8:
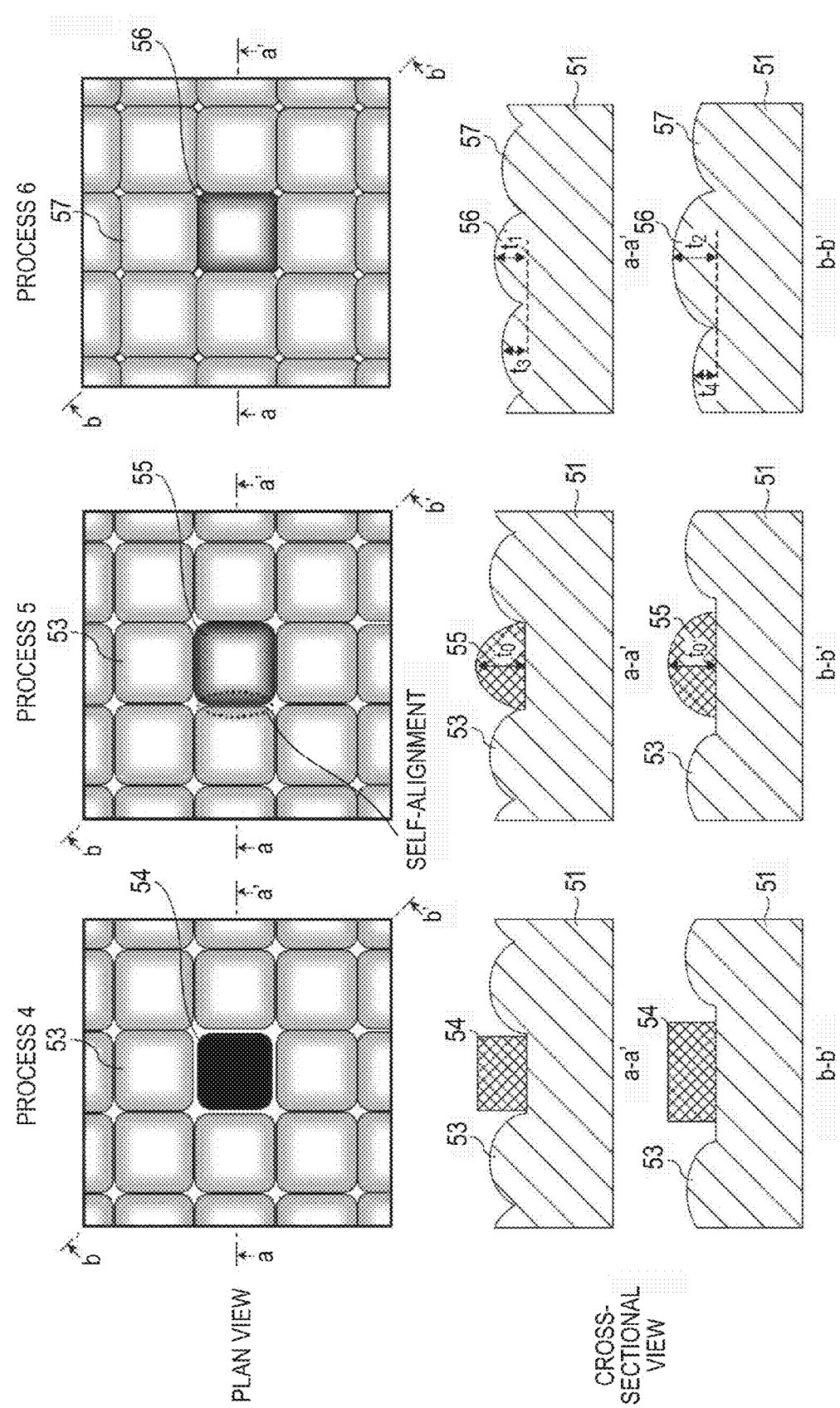

FIG. 8 is a process diagram (diagram 2) illustrating the flow of the processes of the forming method of the microlens according to the first example.

Figure 9:
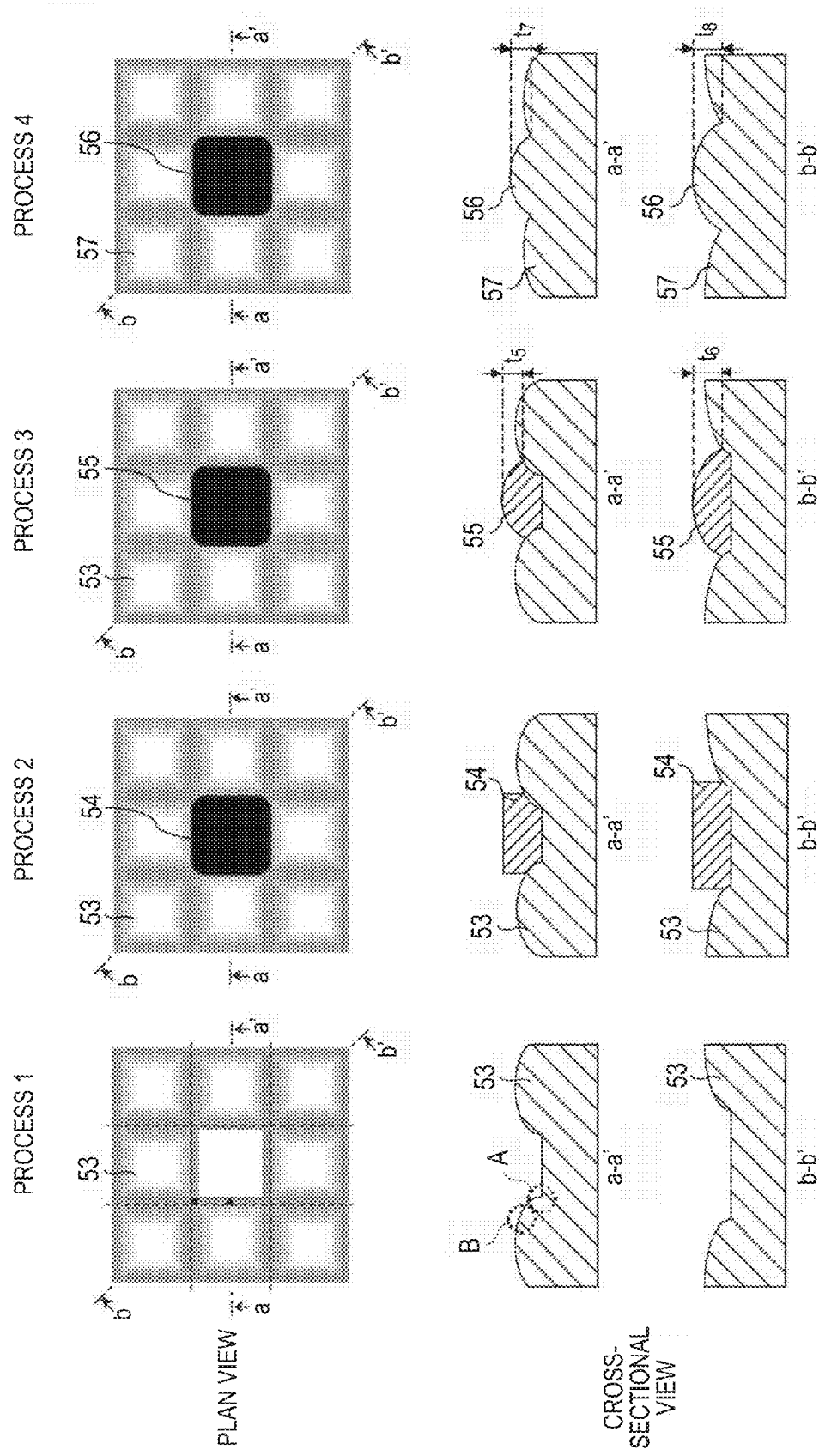

FIG. 9 is a process diagram illustrating the flow of processes of a forming method of a microlens according to a second example.

Figure 10:
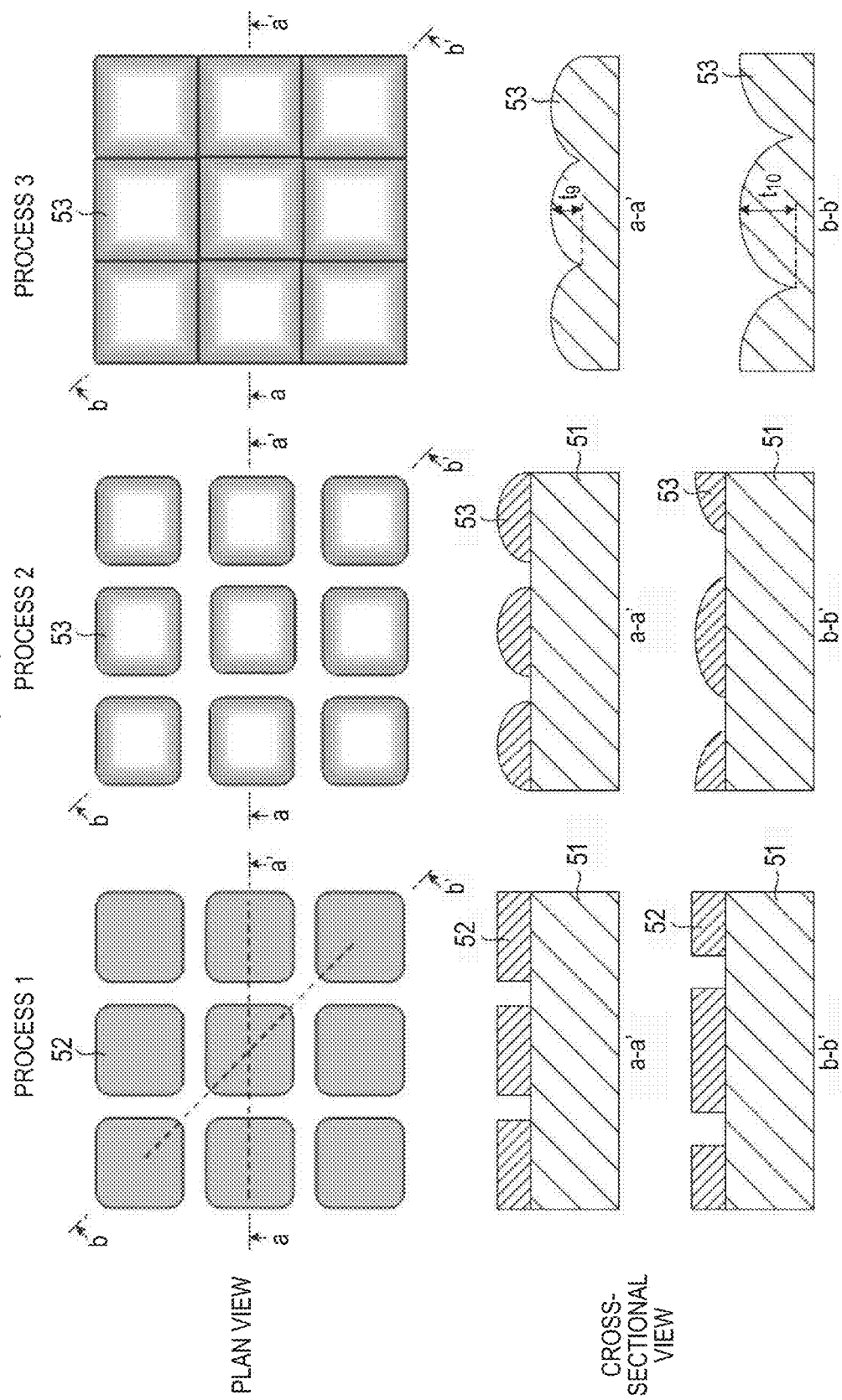

FIG. 10 is a process diagram (diagram 1) illustrating the flow of processes of a forming method of a microlens according to a third example.

Figure 11:
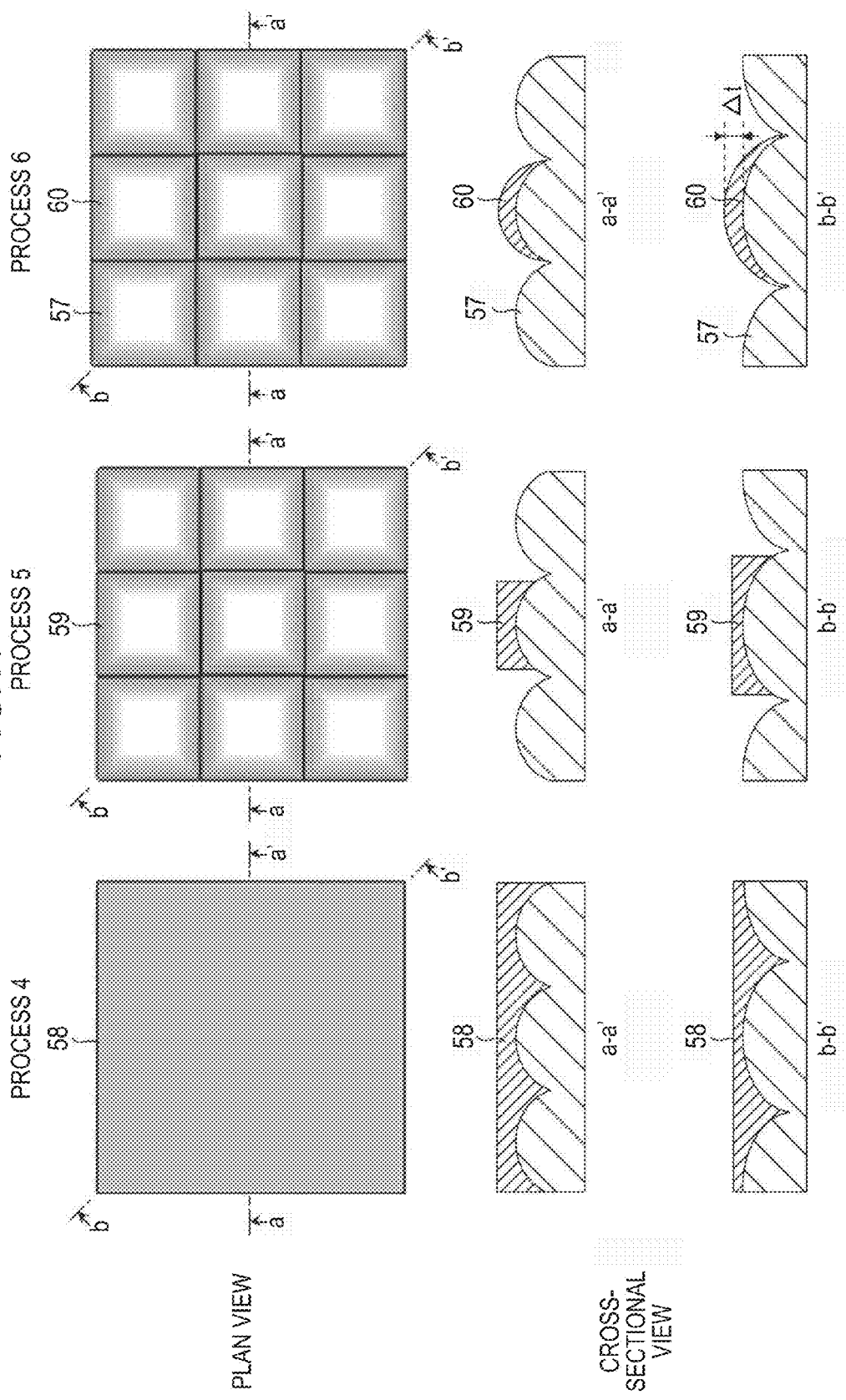

FIG. 11 is a process diagram (diagram 2) illustrating the flow of processes of a forming method of a microlens according to a fourth example.

Figure 12:
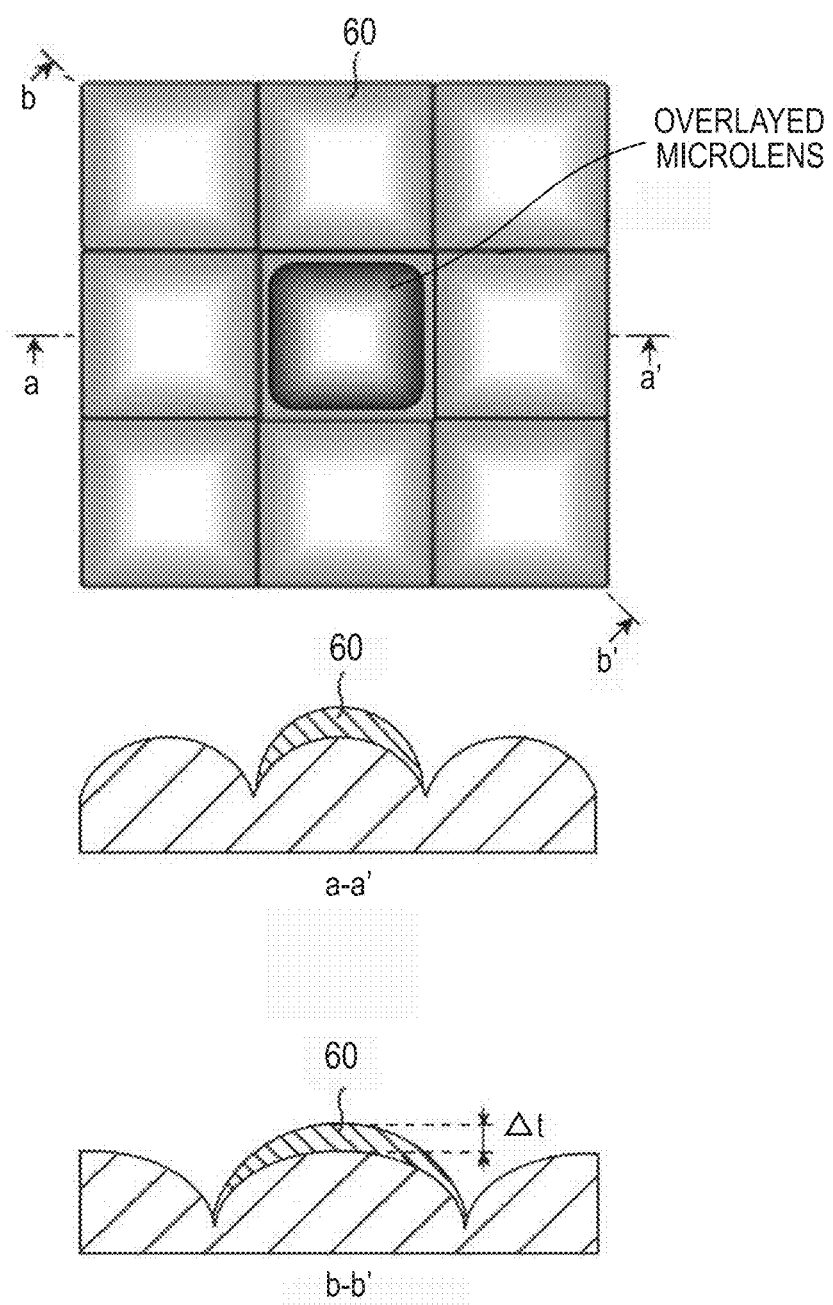

FIG. 12 is a diagram illustrating the size of a microlens formed to overlap with a positive photosensitive microlens resin.

Figure 13:
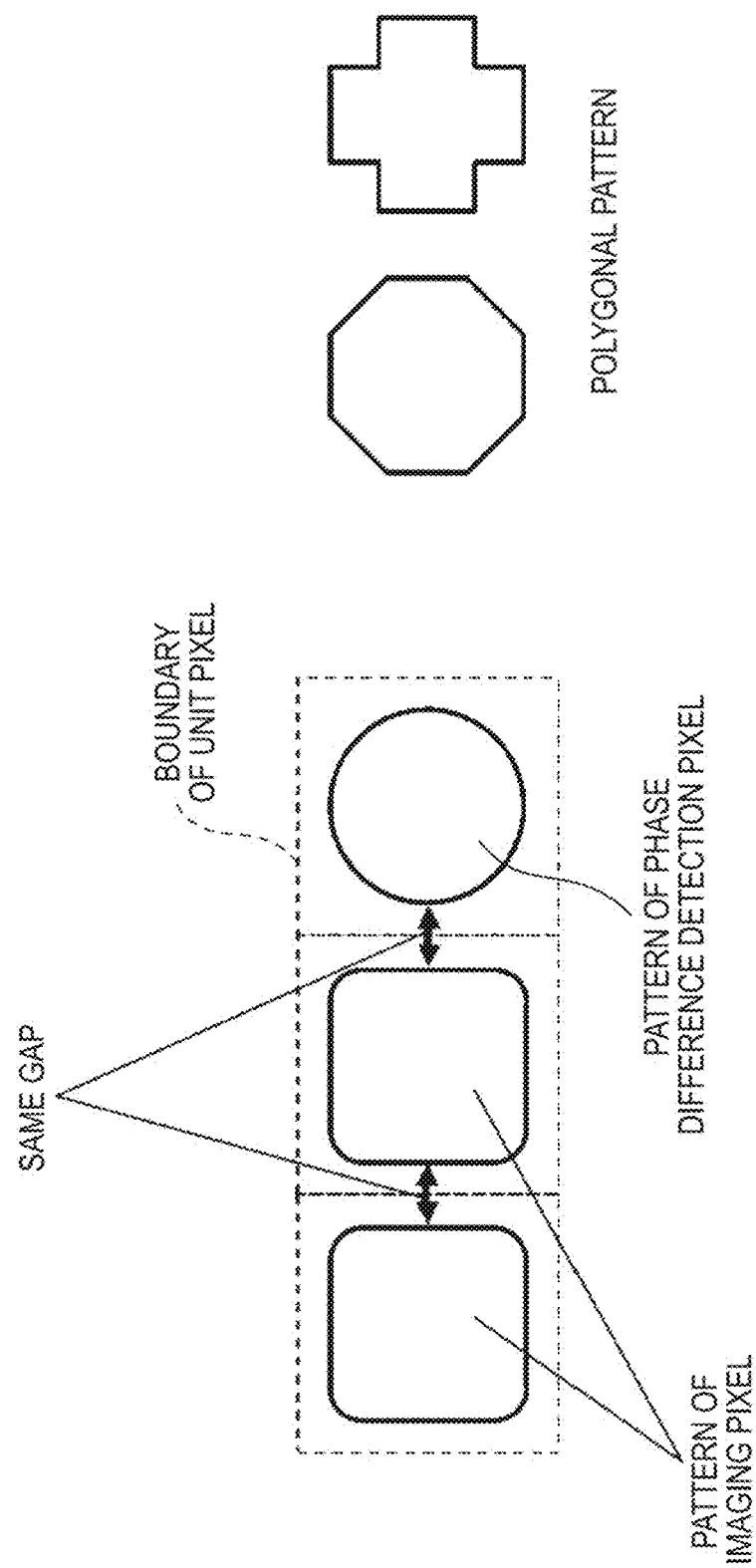

FIG. 13 is a diagram illustrating the shape of a microlens.

Figure 14:
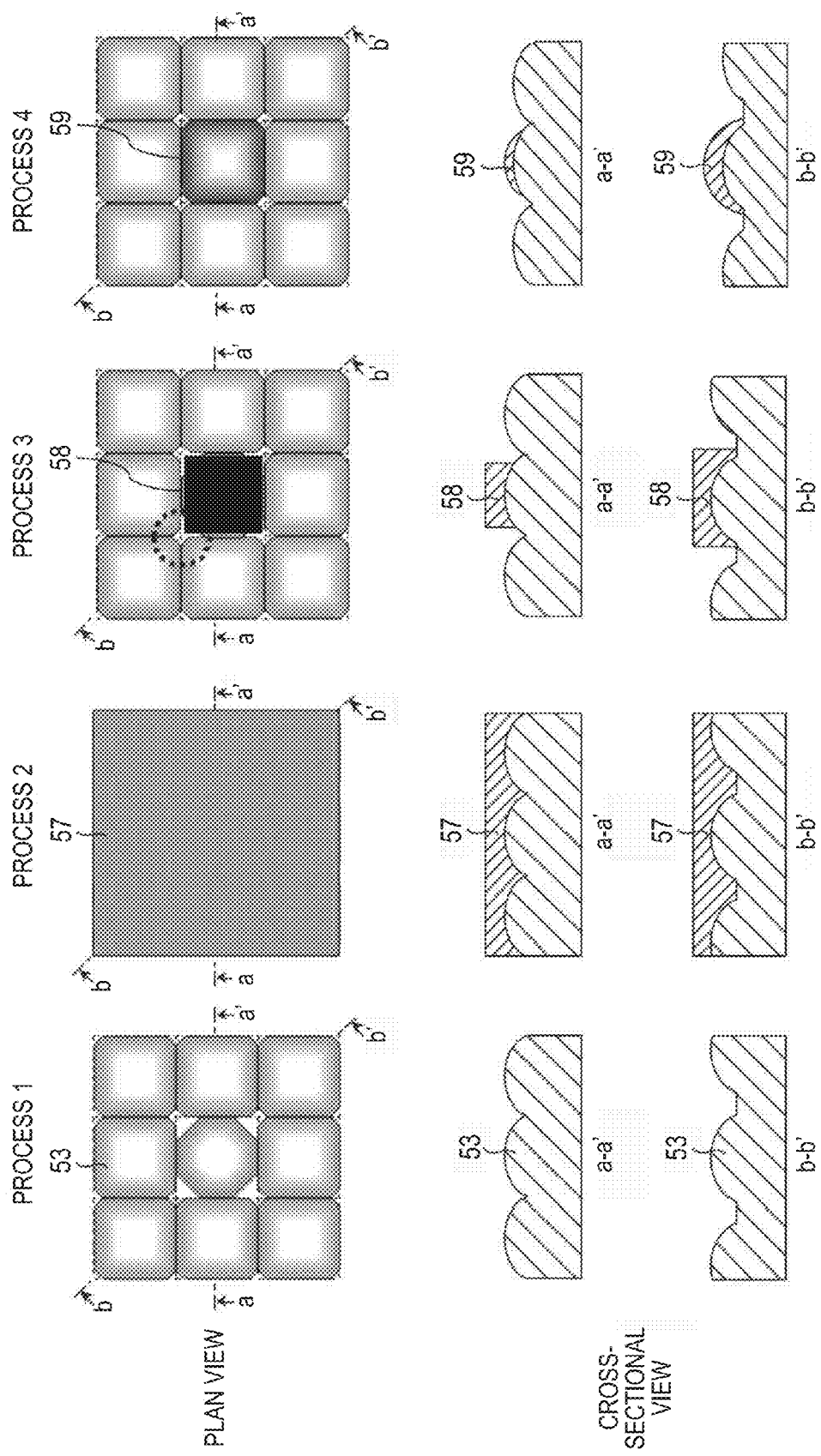

FIG. 14 is a process diagram illustrating the flow of the processes of the forming method of the microlens according to the fourth example.

Figure 15:
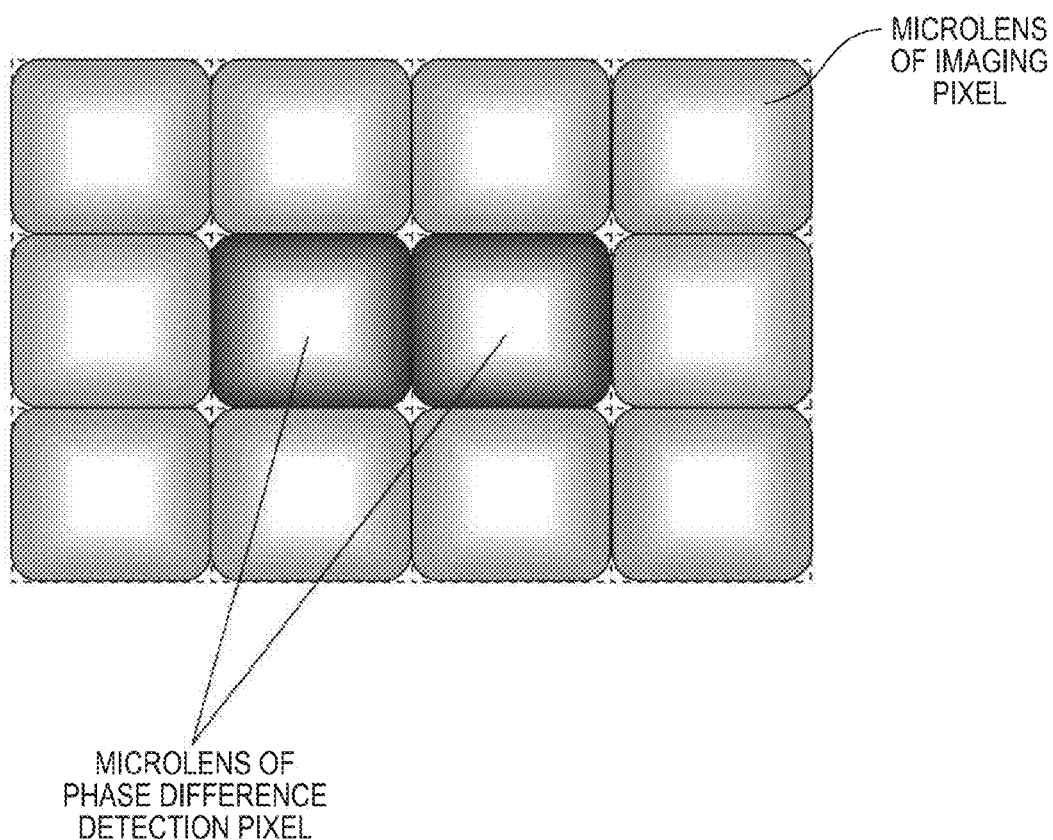

FIG. 15 is a plan view illustrating a case where plural microlenses corresponding to a phase difference detection pixel are formed side by side in the transverse direction.

Figure 16:
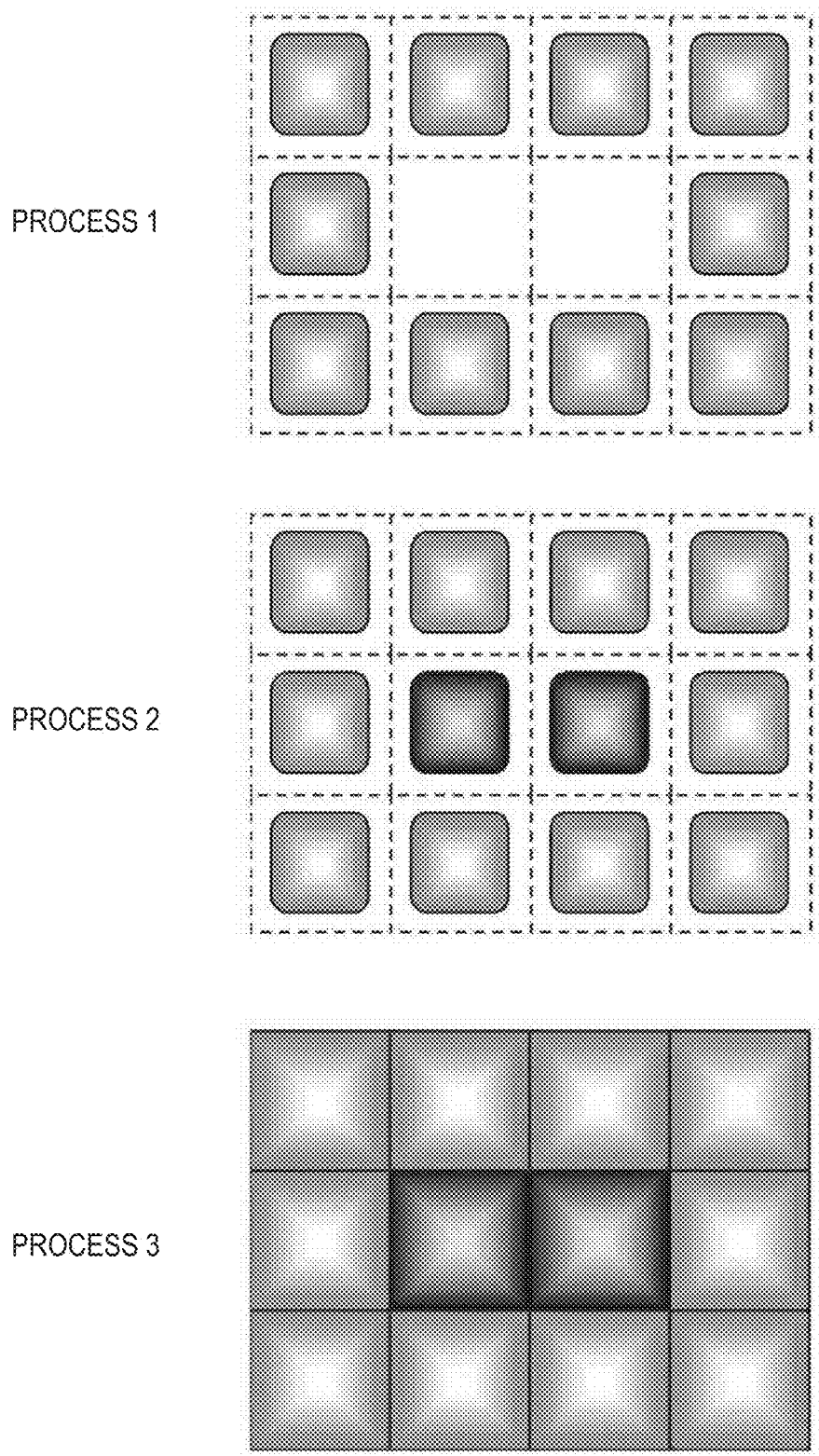

FIG. 16 is a process diagram illustrating the flow of processes of a forming method of a microlens according to a fifth example.

Figure 17:
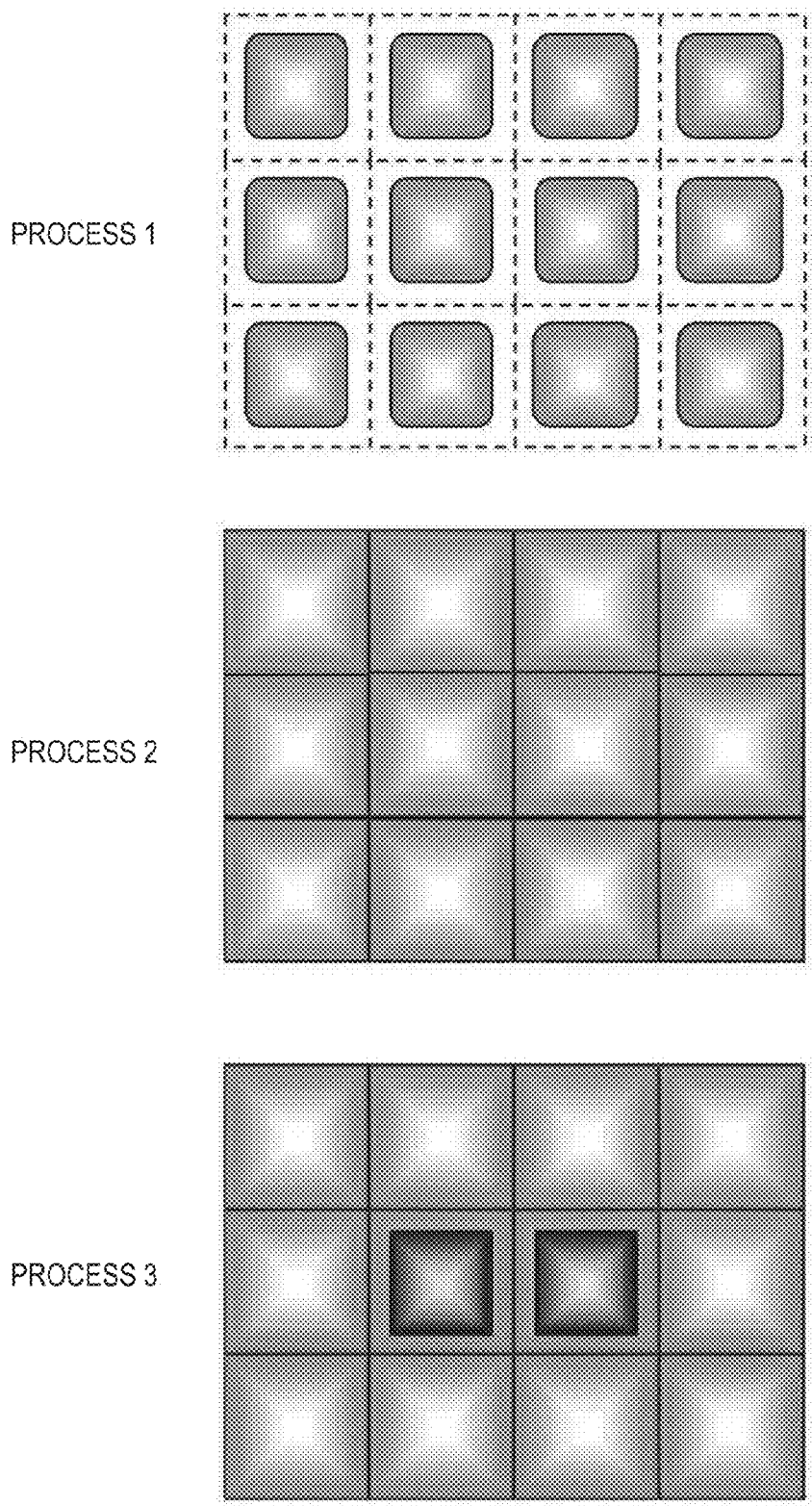

FIG. 17 is a process diagram illustrating the flow of processes of a forming method of a microlens according to a sixth example.

Figure 18:
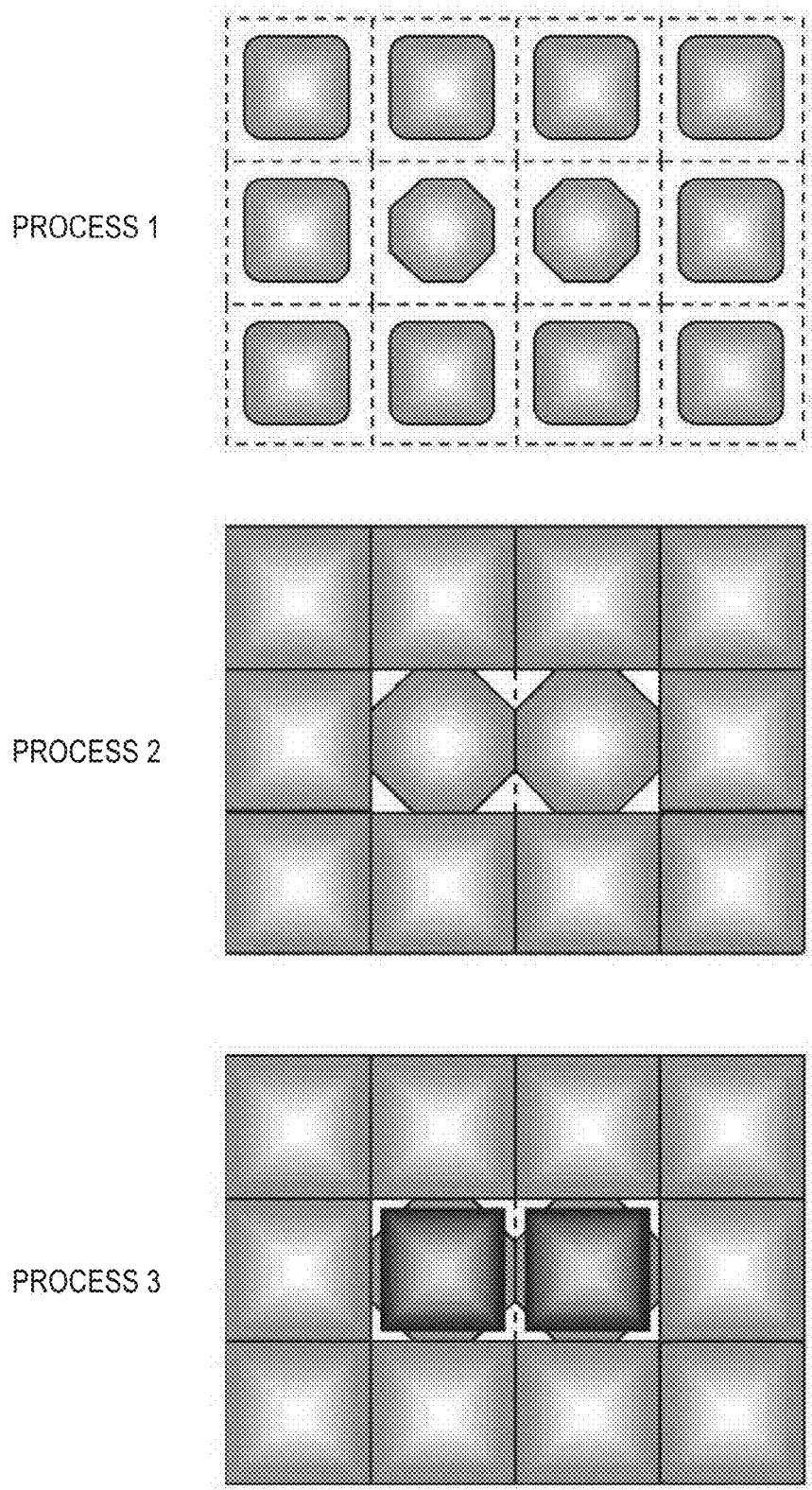

FIG. 18 is a process diagram illustrating the flow of processes of a forming method of a microlens according to a seventh example.

Figure 19:
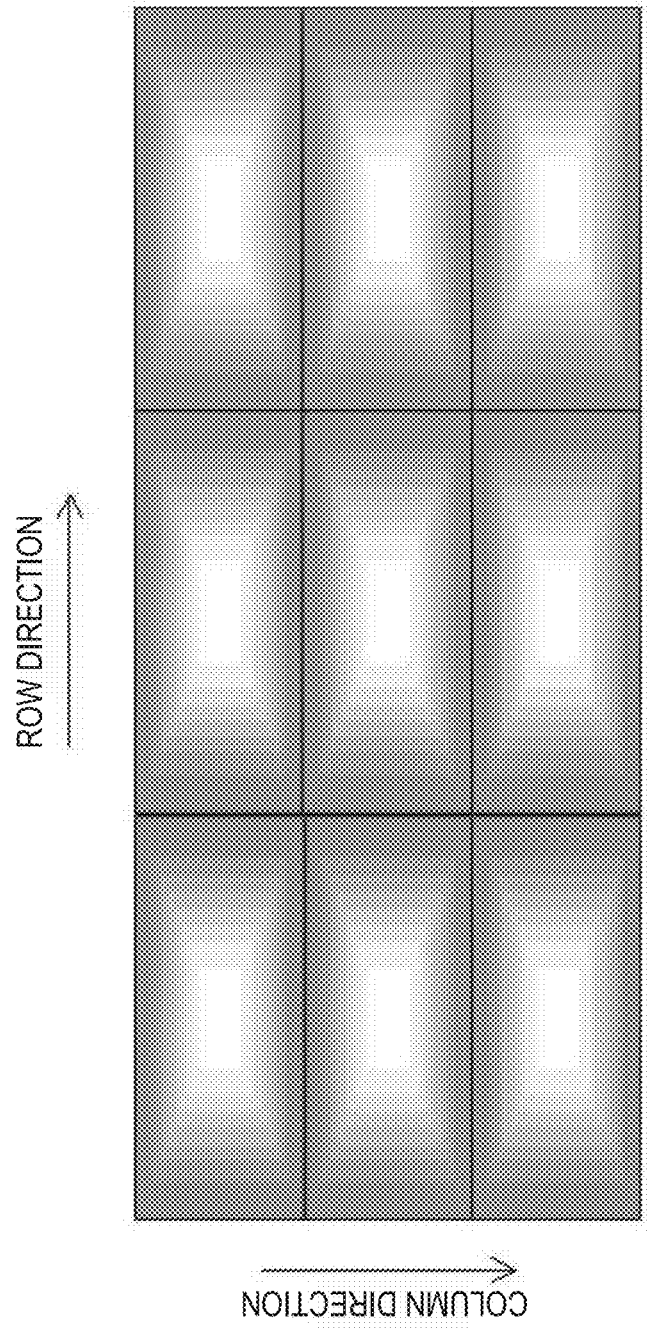

FIG. 19 is a plan view illustrating a pixel array in a case where each pixel in a pixel array section is formed of a rectangular pixel in a planer view.

Figure 20:
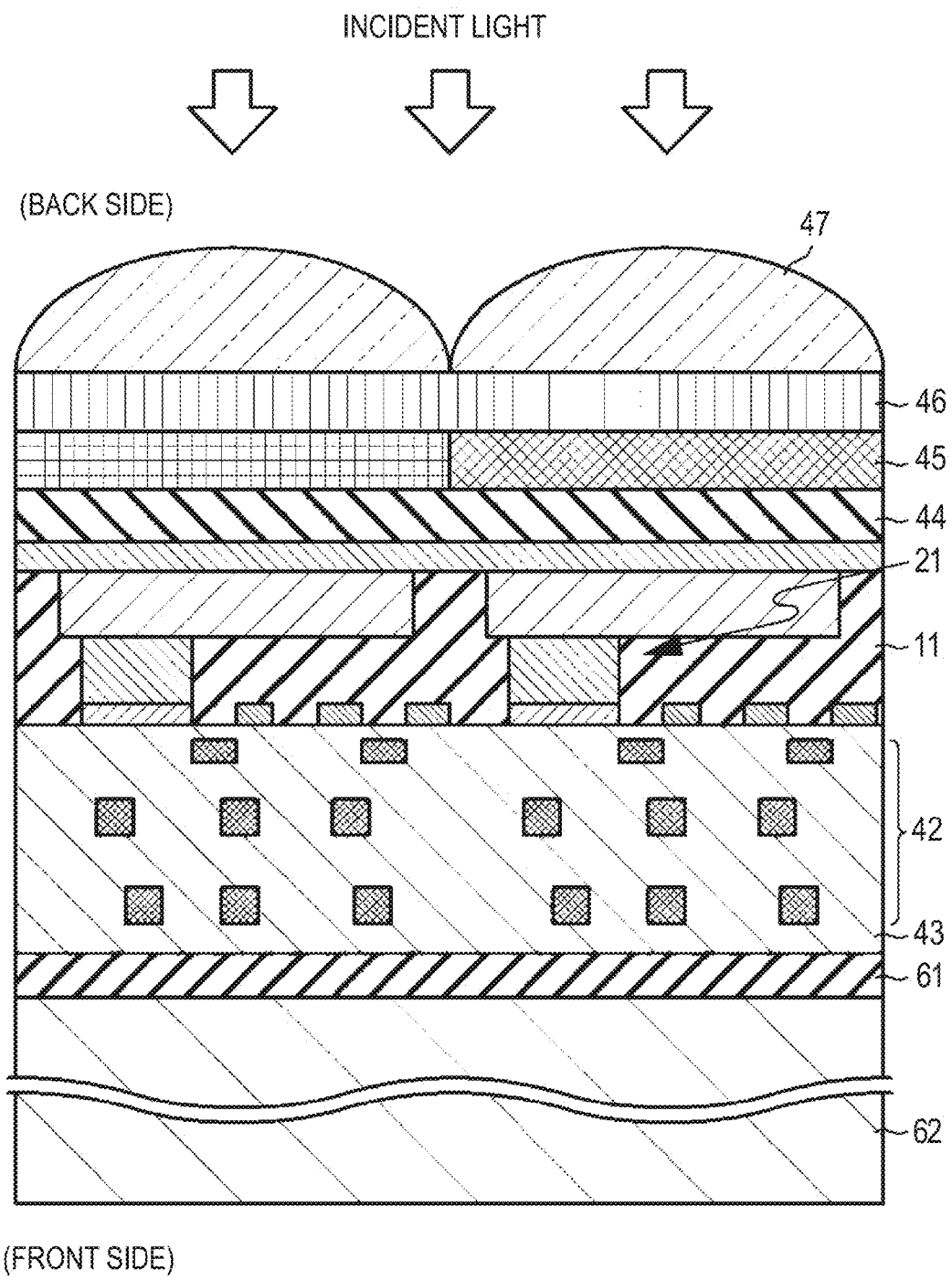

FIG. 20 is a cross-sectional view illustrating an example of a pixel structure of a back side irradiation type.

Figure 21:
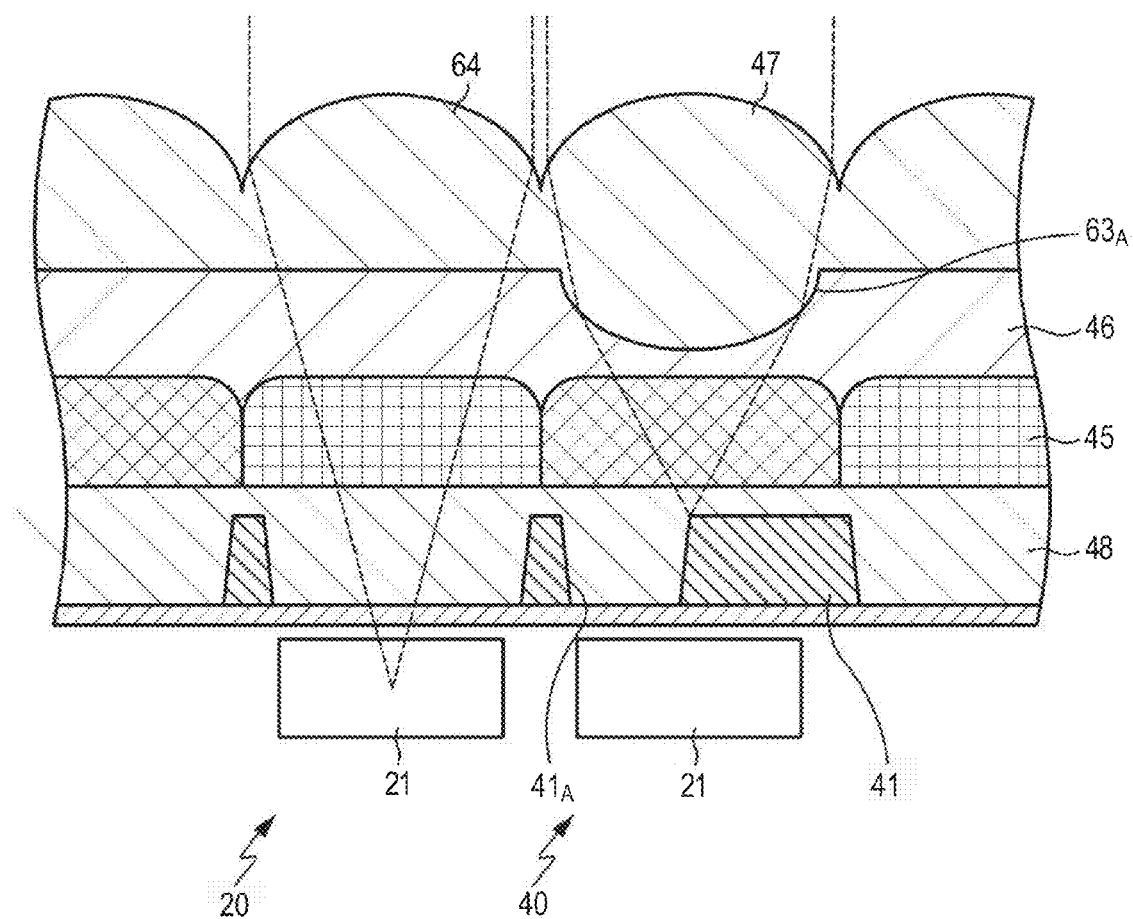

FIG. 21 is a cross-sectional view illustrating a pixel structure having a downward convex in-layer lens formed above a color filter.

FIG. 22 is a diagram schematically illustrating the relationship between a curvature radius r of a circumferential cross section and a circumferential position in a downward convex in-layer lens.

Figure 23:
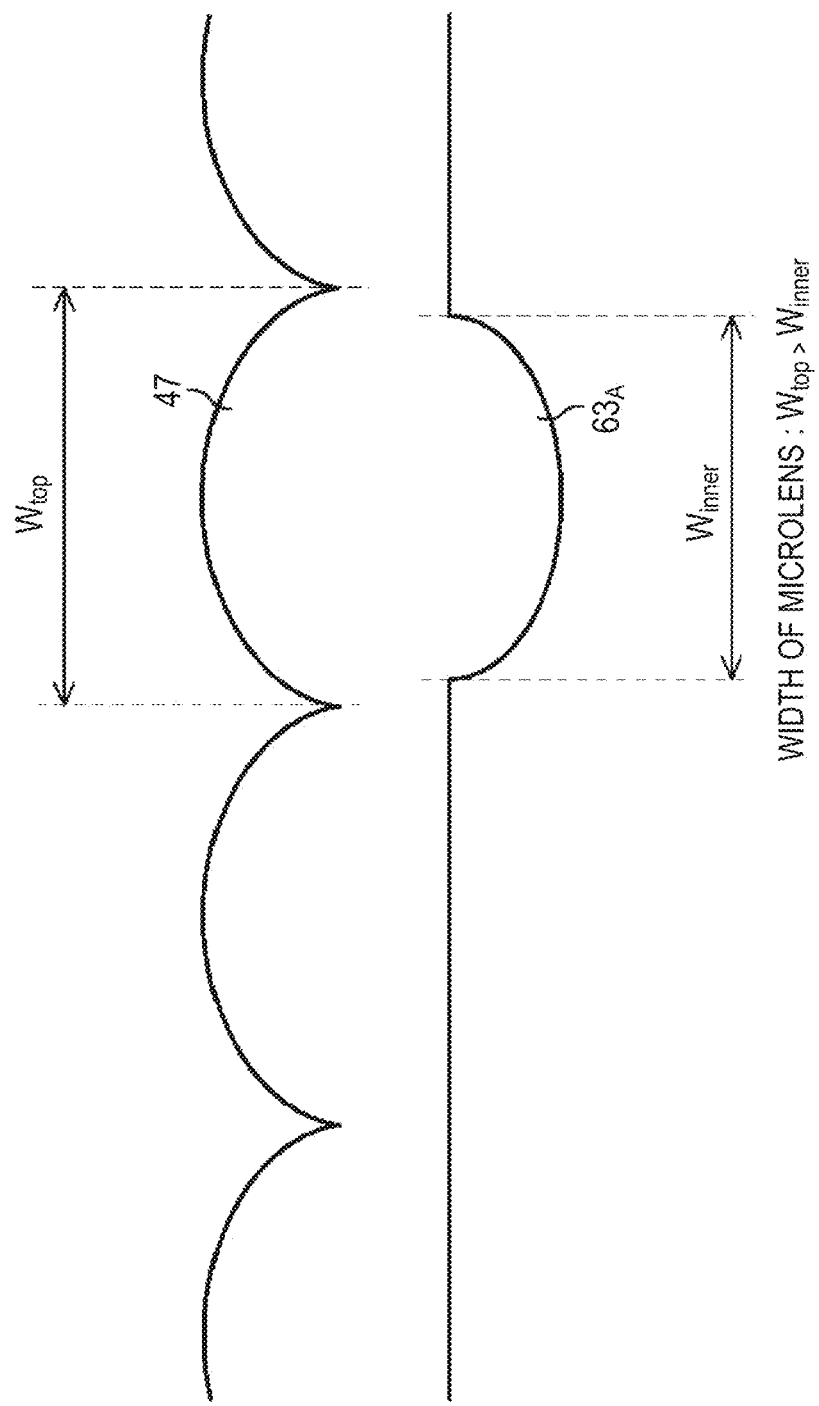

FIG. 23 is a diagram illustrating the width relationship of a microlens and a downward convex in-layer lens when seen in a cross section.

Figure 24:
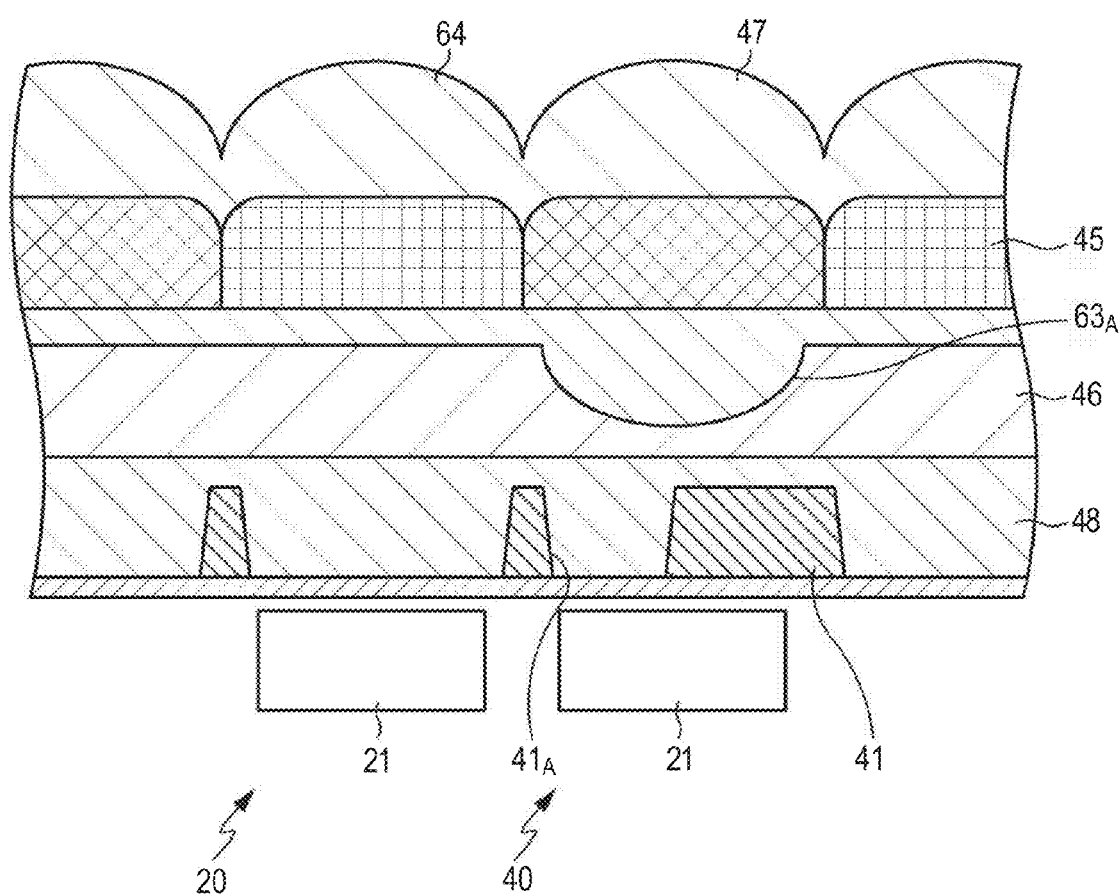

FIG. 24 is a cross-sectional view illustrating a pixel structure having a downward convex in-layer lens formed under a color filter.

Figure 25:
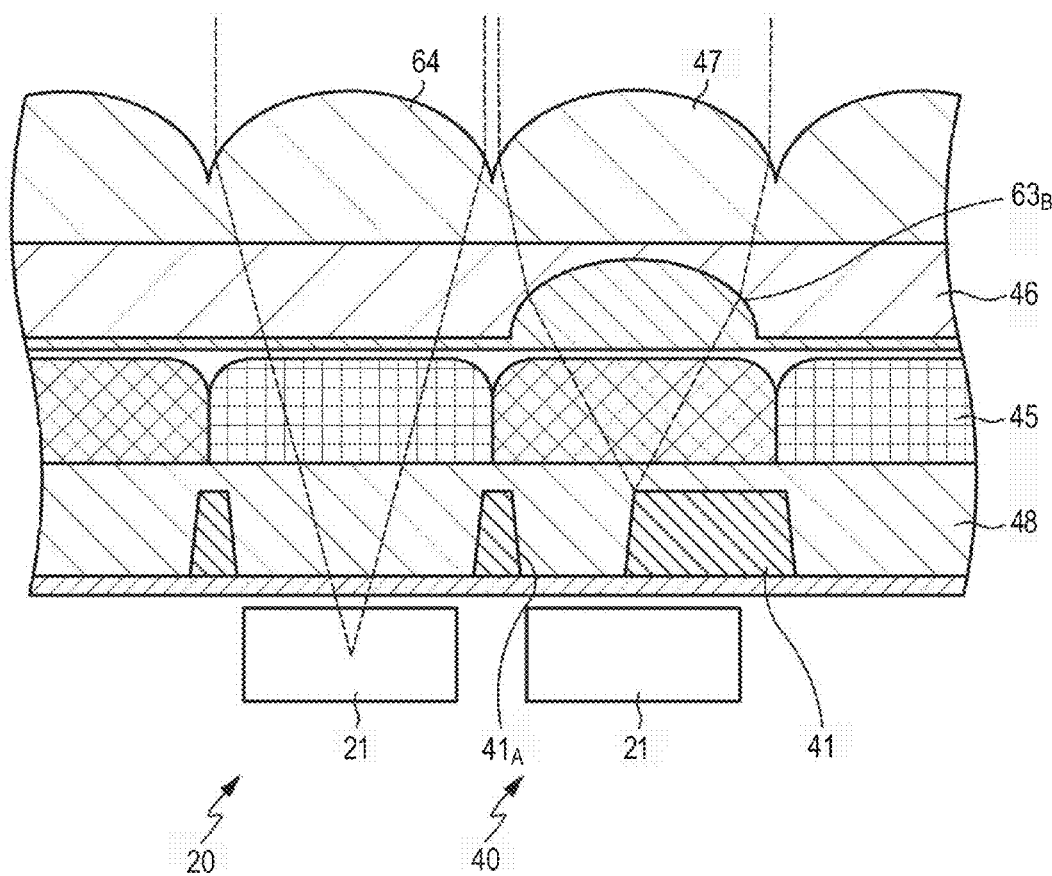

FIG. 25 is a cross-sectional view illustrating a pixel structure having an upward convex in-layer lens formed above a color filter.

FIG. 26 is a diagram schematically illustrating the relationship between a curvature radius r of a circumferential cross section and a circumferential position in an upward convex in-layer lens.

Figure 27:
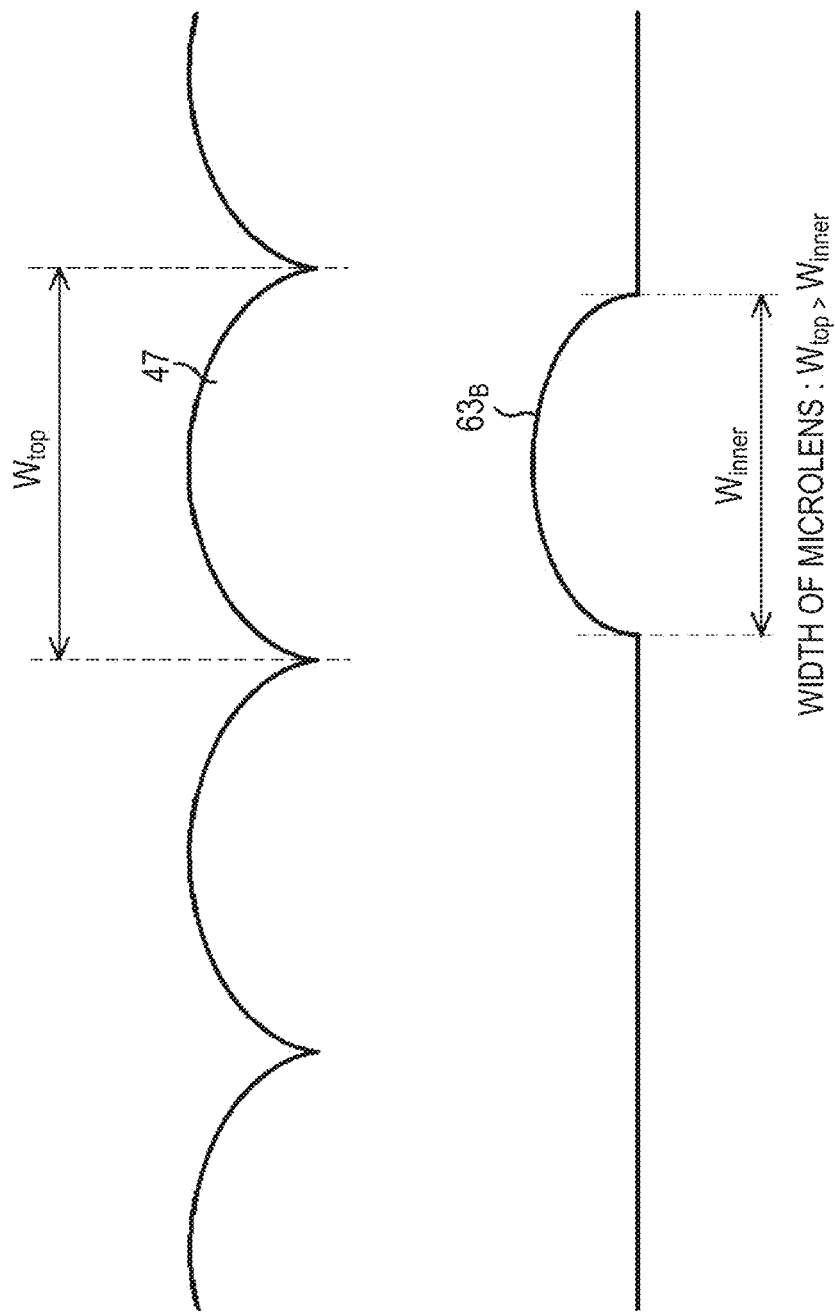

FIG. 27 is a diagram illustrating the width relationship of a microlens and an upward convex in-layer lens when seen in a cross section.

Figure 28:
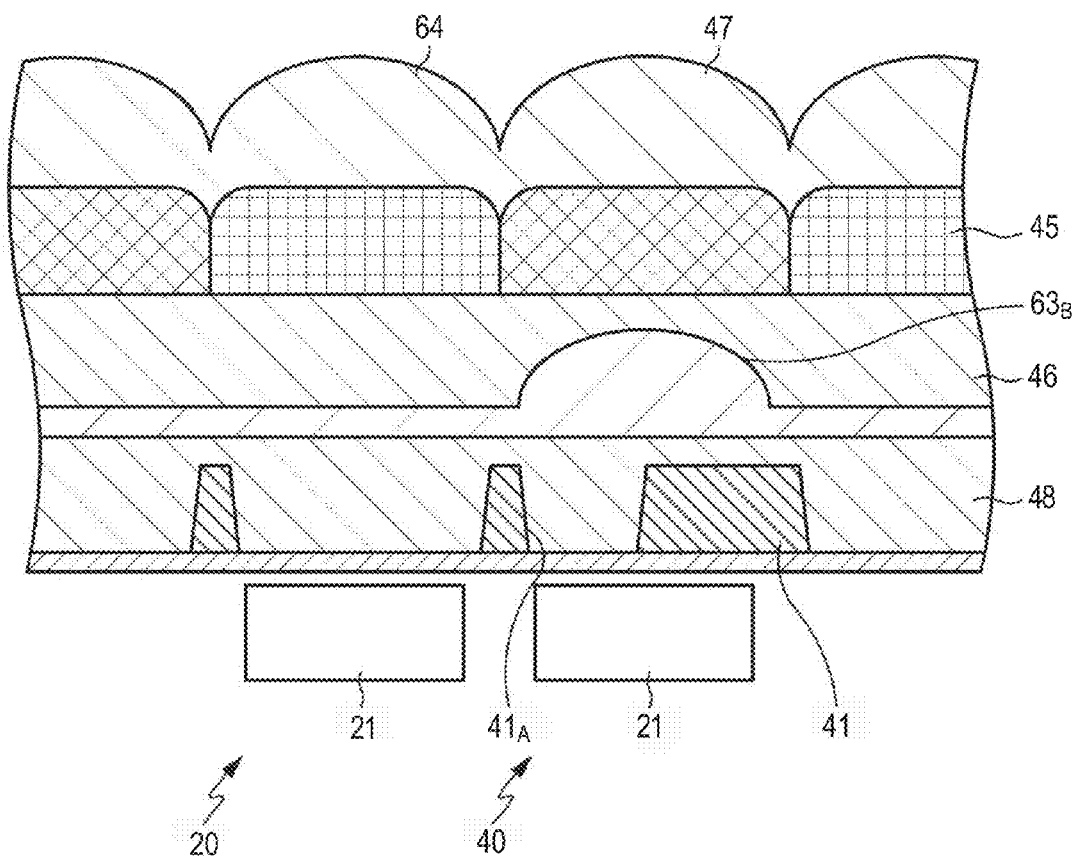

FIG. 28 is a cross-sectional view illustrating a pixel structure having an upward convex in-layer lens formed under a color filter.

FIG. 29 is a process diagram (diagram 1) illustrating the flow of processes of a forming method of a downward convex in-layer lens according to the seventh example.

FIG. 30 is a process diagram (diagram 2) illustrating the flow of the processes of the forming method of the downward convex in-layer lens according to the seventh embodiment.

FIG. 31 is a process diagram (diagram 3) illustrating the flow of the processes of the forming method of the downward convex in-layer lens according to the seventh embodiment.

FIG. 32 is a process diagram (diagram 1) illustrating the flow of processes of a forming method of a downward convex in-layer lens according to an eighth example.

FIG. 33 is a process diagram (diagram 2) illustrating the flow of the processes of the forming method of the downward convex in-layer lens according to the eighth example.

FIG. 34 is a process diagram (diagram 3) illustrating the flow of the processes of the forming method of the downward convex in-layer lens according to the eighth example.

FIG. 35 is a process diagram illustrating a part of the flow of processes of a forming method of a downward convex in-layer lens according to a ninth example.

FIG. 36 is a plan view illustrating a shape example of a photomask used when a downward convex in-layer lens is formed.

FIG. 37 is a process diagram (diagram 1) illustrating the flow of processes of a forming method of an upward convex in-layer lens according to a tenth example.

FIG. 38 is a process diagram (diagram 2) illustrating the flow of the processes of the forming method of the upward convex in-layer lens according to the tenth example.

FIG. 39 is a process diagram (diagram 3) illustrating the flow of the processes of the forming method of the upward convex in-layer lens according to the tenth example.

FIG. 40 is a process diagram (diagram 1) illustrating the flow of processes of a forming method of an upward convex in-layer lens according to an eleventh example.

FIG. 41 is a process diagram (diagram 2) illustrating the flow of the processes of the forming method of the upward convex in-layer lens according to the eleventh example.

FIG. 42 is a process diagram (diagram 3) illustrating the flow of the processes of the forming method of the upward convex in-layer lens according to the eleventh example.

FIG. 43 is a plan view illustrating a shape example of a photomask used when an upward convex in-layer lens is formed.

Figure 44:
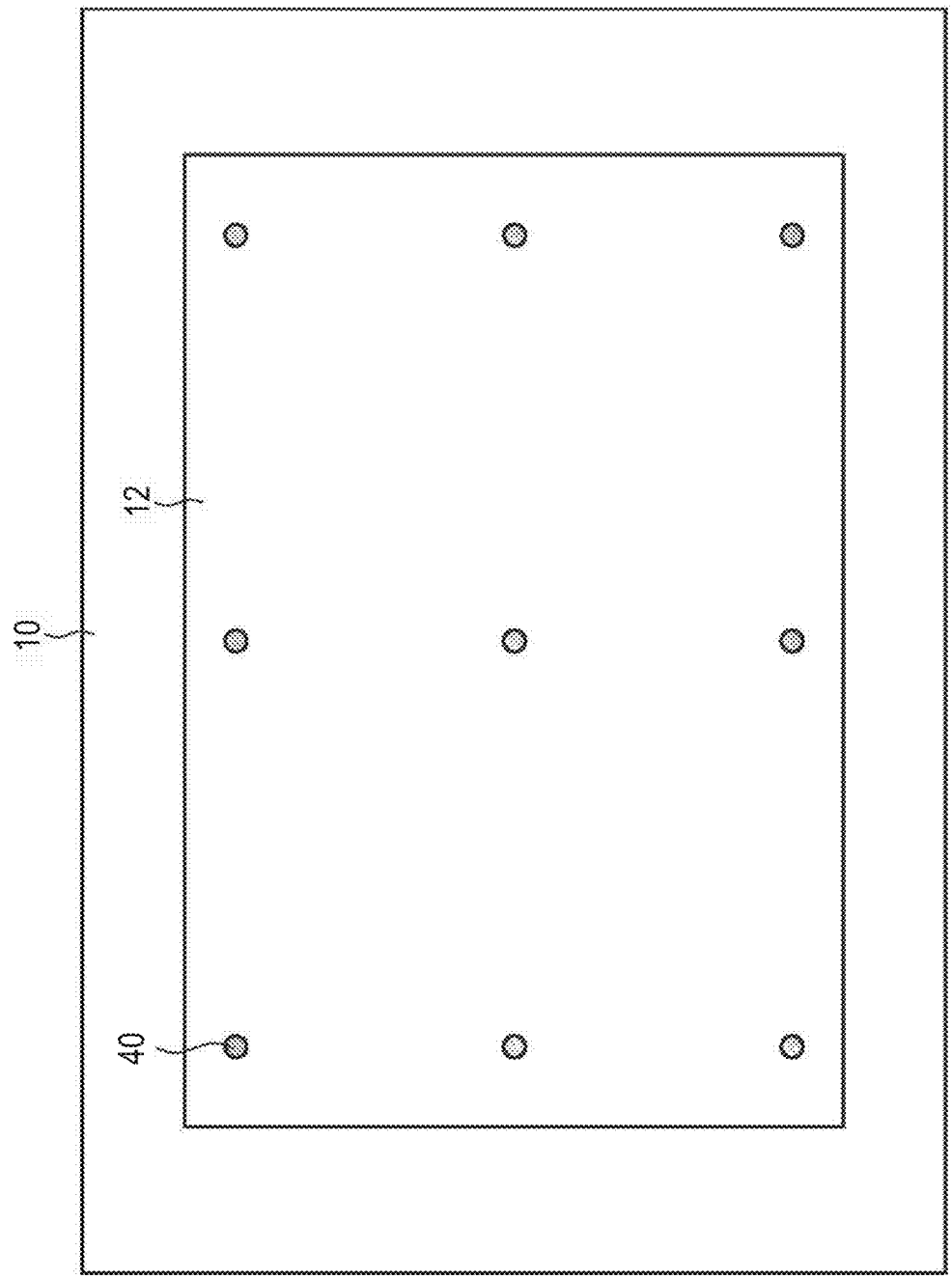

FIG. 44 is a plan view illustrating a state where phase difference detection pixels are formed to be scattered in a pixel array section (light receiving region).

Figure 45:
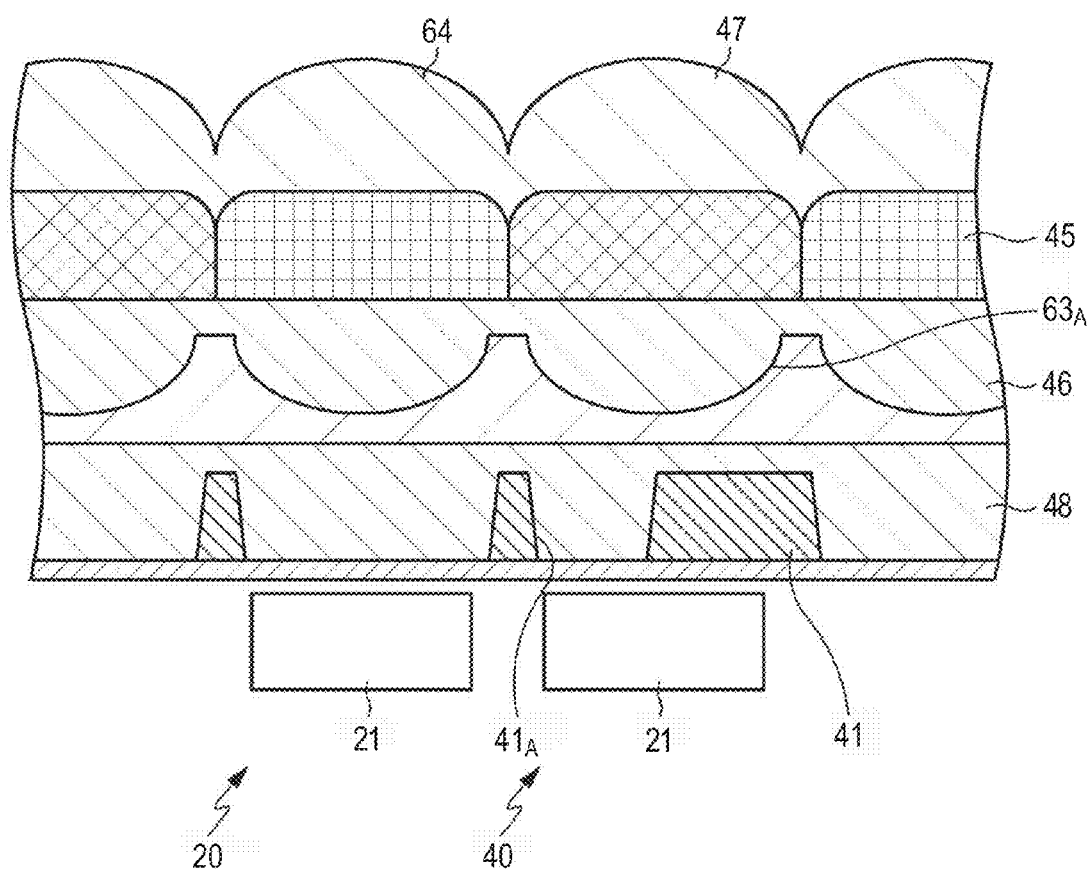

FIG. 45 is a cross-sectional view illustrating a pixel structure according to a modification example of a second embodiment in a case where a downward convex in-layer lens is used.

Figure 46:
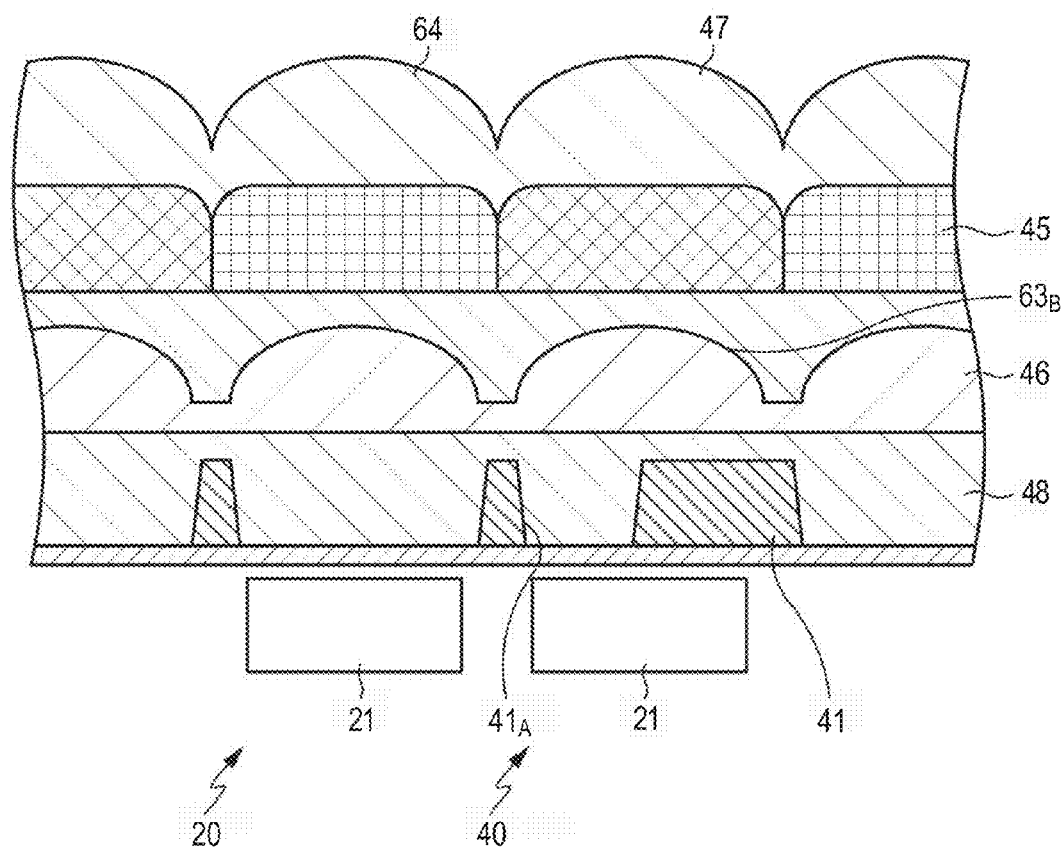

FIG. 46 is a cross-sectional view illustrating a pixel structure according to a modification example of the second embodiment in a case where an upward convex in-layer lens is used.

Figure 47:
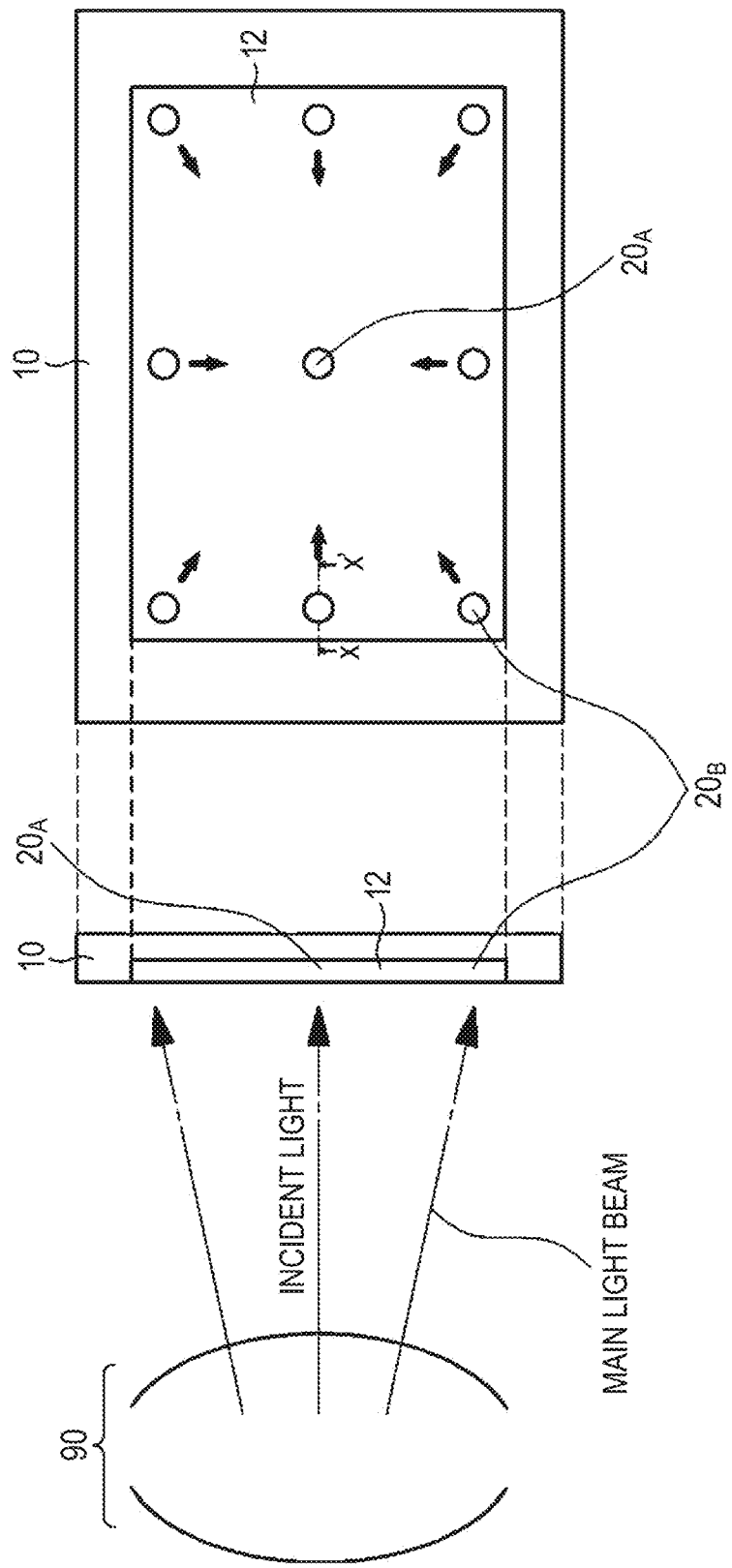

FIG. 47 is a diagram schematically illustrating the relationship between light (incident light) that is incident on an image sensor and a central pixel and peripheral pixels in a pixel array section.

Figure 48:
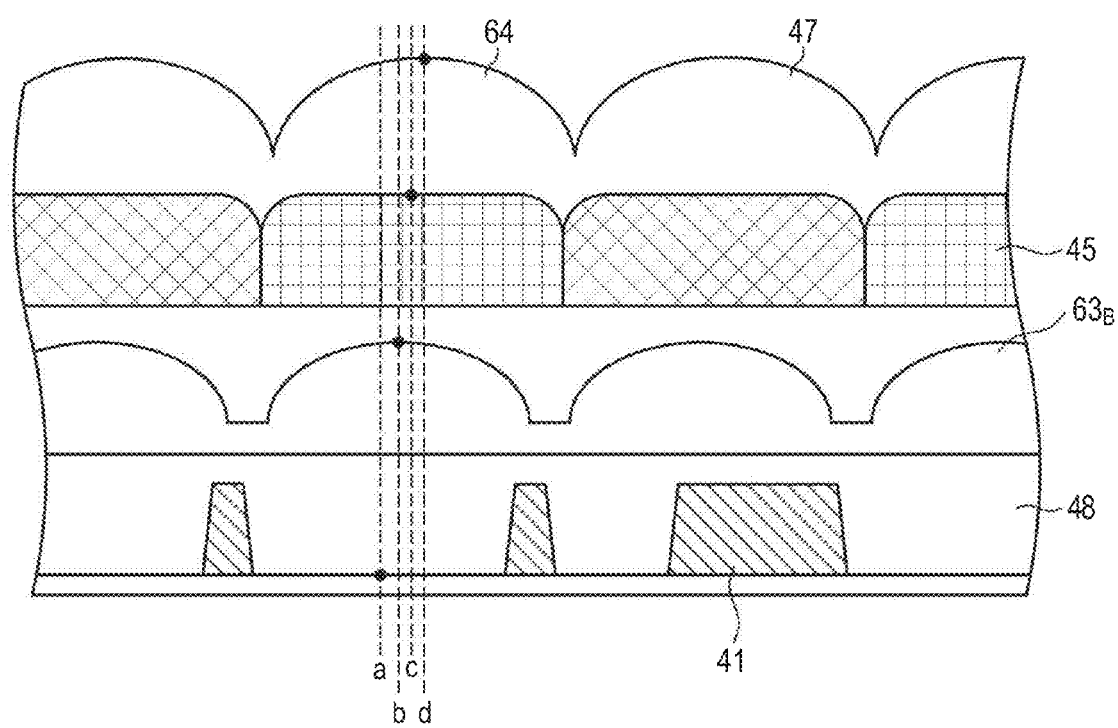

FIG. 48 is a cross-sectional view taken along line X-X' of a peripheral pixel in FIG. 47.

Figure 49:
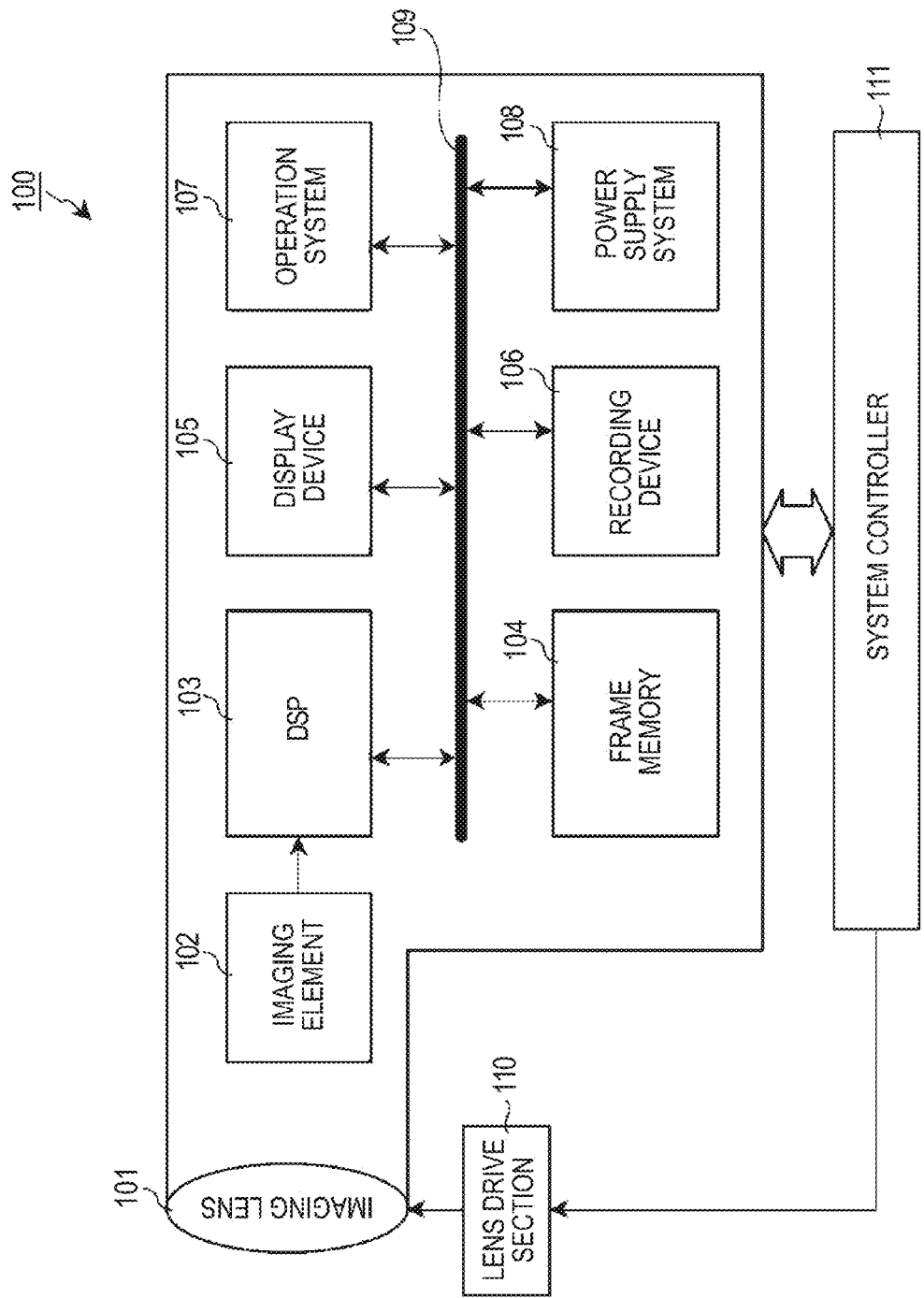

FIG. 49 is a block diagram illustrating a configuration example of an imaging device that is an example of an electronic apparatus according to an embodiment of the present disclosure.

DESCRIPTION OF EMBODIMENTS

Hereinafter, embodiments for the technique of the present disclosure (hereinafter, referred to as "embodiments") will be described in detail with reference to the accompanying drawings. The present disclosure is not limited to the embodiments, and various numerical values, materials or the like in the embodiments are only examples. In the following description, the same reference numerals are given to the same elements or elements having the same functions, and repetitive description thereof will be omitted. Description will be made in the following order.

1. Overall description about solid-state imaging device, method of forming microlens in solid-state imaging device, and electronic apparatus according to embodiment of the present disclosure 2. Solid-state imaging device to which technique of the present disclosure is applied 2-1. System configuration
2-2. Circuit configuration of unit pixel
2-3. Structure example of phase difference detection pixel
3. First embodiment
3-1. Method of forming microlens
3-2. Pixel structure of back side irradiation type
4. Second embodiment
4-1. Downward convex in-layer lens
4-2. Upward convex in-layer lens
4-3. Method of forming auxiliary lens
4-4. Modification example
5. Electronic apparatus (example of imaging device)
6. Configuration of the present disclosure <1. Overall description about solid-state imaging device, method of forming microlens in solid-state imaging device, and electronic apparatus according to embodiment of the present disclosure>

A solid-state imaging device according to an embodiment of the present disclosure may be used as an imaging section (image capturing section) in an electronic apparatus such as an imaging device that employs an auto focus (AF) method, particularly, a pupil-division phase detection method. As the imaging device that employs the pupil-division phase difference detection method, a digital still camera, a video camera or the like may be used, for example.

Further, as the electronic apparatus according to the embodiment of the present disclosure, a mobile terminal or the like that has an imaging function, such as a mobile phone, may be used, in addition to the imaging device such as a digital still camera or a video camera. Further, the technique of the present disclosure may be applied to all electronic apparatuses that use a solid-state imaging device in an imaging section (image capturing section) and employ the pupil-division phase detection method, in addition to the imaging device such as a digital still camera or a video camera, or the mobile terminal having the imaging function such as a mobile phone.

In order to realize the pupil-division phase detection, the solid-state imaging device according to the embodiment of the present disclosure may have a configuration in which received light flux is pupil-divided and photoelectrically converted, and phase difference detection pixels are provided to obtain a phase difference detection signal. Here, the phase difference detection signal is a signal indicating a shift direction (defocus direction) and a shift amount (defocus amount) of a focus, that is, a focus detection signal.

The phase difference detection pixels are separately formed from imaging pixels configured to obtain an imaging signal. It is preferable that the phase difference detection pixels are arranged in the form of being mixed with the imaging pixels in a pixel array section (imaging region or light receiving region) where the imaging pixels are two-dimensionally arranged in a matrix form.

In the solid-state imaging device according to the embodiment of the present disclosure, the phase difference detection pixels include a light blocking film having an opening through which some of the pupil-divided light passes, on the side of a light receiving surface of a photoelectric conversion section. As the light blocking film is disposed on the side of the light receiving surface of the photoelectric conversion section, it is possible to reliably perform light blocking of light flux incident on the photoelectric conversion section, and thus, it is possible to maintain the accuracy of phase difference detection at a high level.

In the imaging pixels and the phase difference detection pixels, microlenses (a first microlens and a second microlens) for condensing light in the photoelectric conversion section are formed for each pixel. In the solid-state imaging device in which the microlenses are formed for each pixel in this way, the technique of the present disclosure relates to the microlens (second microlens) formed corresponding to the phase difference detection pixel.

Accordingly, in the solid-state imaging device according to the embodiment of the present disclosure, a transmission method of electric charges that are photoelectrically converted in the photoelectric conversion section is not particularly limited. That is, the solid-state imaging device according to the embodiment of the present disclosure may be a solid-state imaging device of an electric charge transmission type represented by a CCD (Charge Coupled Device) image sensor or a solid-state imaging device of an amplification type represented by a CMOS (Complementary Metal Oxide Semiconductor) image sensor.

In the solid-state imaging device, the method of forming the microlens in the solid-state imaging device and the electronic apparatus having the solid-state imaging device according to the embodiment of the present disclosure (hereinafter, referred to as a solid-state imaging device, a method of forming a microlens and an electronic apparatus according to embodiment of the present disclosure), the following characteristics are given. That is, the second microlens corresponding to the phase difference detection pixel is formed so that the difference between a focal distance of an opposite side boundary region including an opposite side central portion of a pixel boundary and a focal distance of a diagonal boundary region including a diagonal boundary is small, compared with a microlens that has substantially the same area in a planar view.

Here, the second microlens is to be formed in a rectangular shape in a planar view. At this time, a case where a corner portion is formed by a point in a planar view as the corner portion forms a right angle (for example, see FIG. 11), and a case where the corner portion is formed by a line in a planar view as the corner portion becomes round (for example see FIG. 6) may be considered. In the former case, the opposite side central portion and its vicinity of the microlens are formed at the highest position, and the diagonal boundary is formed at the lowest position. In the latter case, the opposite side central portion and its vicinity of the microlens are formed at the highest position, and the diagonal boundary region is formed at the lowest position.

That is, the second microlens is formed so that a forming position, in the height direction, of the diagonal boundary region including the diagonal boundary is formed to be lower than a forming position, in the height direction, of the opposite side boundary region including the opposite side central portion of the pixel boundary, compared with the microlens that has substantially the same area in a planar view. Here, the expression "formed to be lower" may also be described with reference to the upper surface of the photoelectric conversion section. That is, the "lower" location is closer to the upper surface of the photoelectric conversion section.

Further, in the solid-state imaging device, the method of forming the microlens and the electronic apparatus according to the embodiment of the present disclosure, having the above-mentioned preferable configuration, a configuration may be used in which the second microlens is formed so that the focal distance is short compared with the first microlens. Further, a configuration may be used in which a bottom surface of the opposite side boundary region including the opposite side central portion of the pixel boundary is formed to be higher than a bottom surface of the diagonal boundary region including the diagonal boundary, in the second microlens.

Further, in the solid-state imaging device, the method of forming the microlens and the electronic apparatus according to the embodiment of the present disclosure, having the above-mentioned preferable configuration, a configuration may be used in which a light blocking film that is formed with an opening through which some of the pupil-divided light passes is provided on the side of the light receiving surface of the photoelectric conversion section of the phase difference detection pixel. At this time, with respect to the second microlens, a configuration may be used in which the focal distance coincides with the position of the light blocking film. Here, the term "coincide with" includes the case of strict coincidence and the case of substantial coincidence. The presence of various variations occurring in design or manufacturing is allowed.

Further, in the solid-state imaging device, the method of forming the microlens and the electronic apparatus according to the embodiment of the present disclosure, having the above-mentioned preferable configuration, when the microlens is formed so that the difference between the focal distances is small, a configuration may be used in which microlenses, having an effective area of 80% or more, that are formed in the same plane and are in contact with each other at least in the array direction between the adjacent microlenses, are used as a reference. Here, "80%" includes the case of strict 80% and the case of substantial 80%. The presence of various variations occurring in design or manufacturing is allowed.

Further, in the solid-state imaging device, the method of forming the microlens and the electronic apparatus according to the embodiment of the present disclosure, having the above-mentioned preferable configuration, the pattern shapes of the first microlens formed corresponding to the imaging pixel and the second microlens formed corresponding to the phase difference detection pixel are not particularly limitative.

It is preferable that the pattern shape of the first microlens is a square shape in a planar view and the pattern of the second microlens is a circular or polygonal shape in a planar view. At this time, it is preferable to set the same pattern gap as the pattern gap between the first microlenses, between the first microlens and the second microlens. Here, the term "same" includes strictly the same case and substantially the same case. The presence of various variations occurring in design or manufacturing is allowed.

Further, in the solid-state imaging device, the method of forming the microlens and the electronic apparatus according to the embodiment of the present disclosure, having the above-mentioned preferable configuration, a configuration may be used in which plural second microlenses are arranged side by side in the array of the first microlenses, in the transverse direction, in the longitudinal direction or in the oblique direction.

Further, in the solid-state imaging device, the method of forming the microlens and the electronic apparatus according to the embodiment of the present disclosure, having the above-mentioned preferable configuration, a configuration may be used in which an auxiliary lens is provided between the second microlens and the light blocking film. The auxiliary lens adjusts the focal distance of the second microlens, specifically, in a direction where the focal distance is short. It is preferable that the auxiliary lens have a configuration in which the radius of curvature of a circumferential cross section around a central point in a planar view is uniform regardless of a circumferential position, and it is more preferable that the auxiliary lens have a circular shape in a planar view. Here, the term "uniform" includes the strictly uniform case and the substantially uniform case. The presence of various variations occurring in design or manufacturing is allowed.

Further, the auxiliary lens may be formed as an in-layer lens formed in a layer under the second microlens. Here, the auxiliary lens may be formed of the same material as that of the second microlens, and a configuration having a convex shape on the side of the light blocking film or a configuration having a convex shape on the side of the second microlens may be used.

Further, in the solid-state imaging device, the method of forming the microlens and the electronic apparatus according to the embodiment of the present disclosure, having the above-mentioned preferable configuration, a so-called back side irradiation type pixel structure may be used in which incident light is introduced from a side opposite to a side on which a wiring layer is formed, with respect to the imaging pixel and the phase difference detection pixel.

Further, in the solid-state imaging device, the method of forming the microlens and the electronic apparatus according to the embodiment of the present disclosure, having the above-mentioned preferable configuration, a configuration may be used in which an auxiliary lens is provided between the second microlens and the light blocking film, and also is provided between the first microlens and the light blocking film.

<2. Solid-state imaging device to which technique of the present disclosure is applied>

Firstly, a configuration of the solid-state imaging device to which the technique of the present disclosure is applied, for example, a configuration of a CMOS image sensor that is a type of amplification type solid-state imaging device will be described. As described above, the technique of the present disclosure is not limited to the application to the CMOS image sensor, and may be applied to a different amplification type solid-state imaging device or an electric charge transmission type solid-state imaging device such as a CCD image sensor.

<2-1. System configuration>

Figure 1:
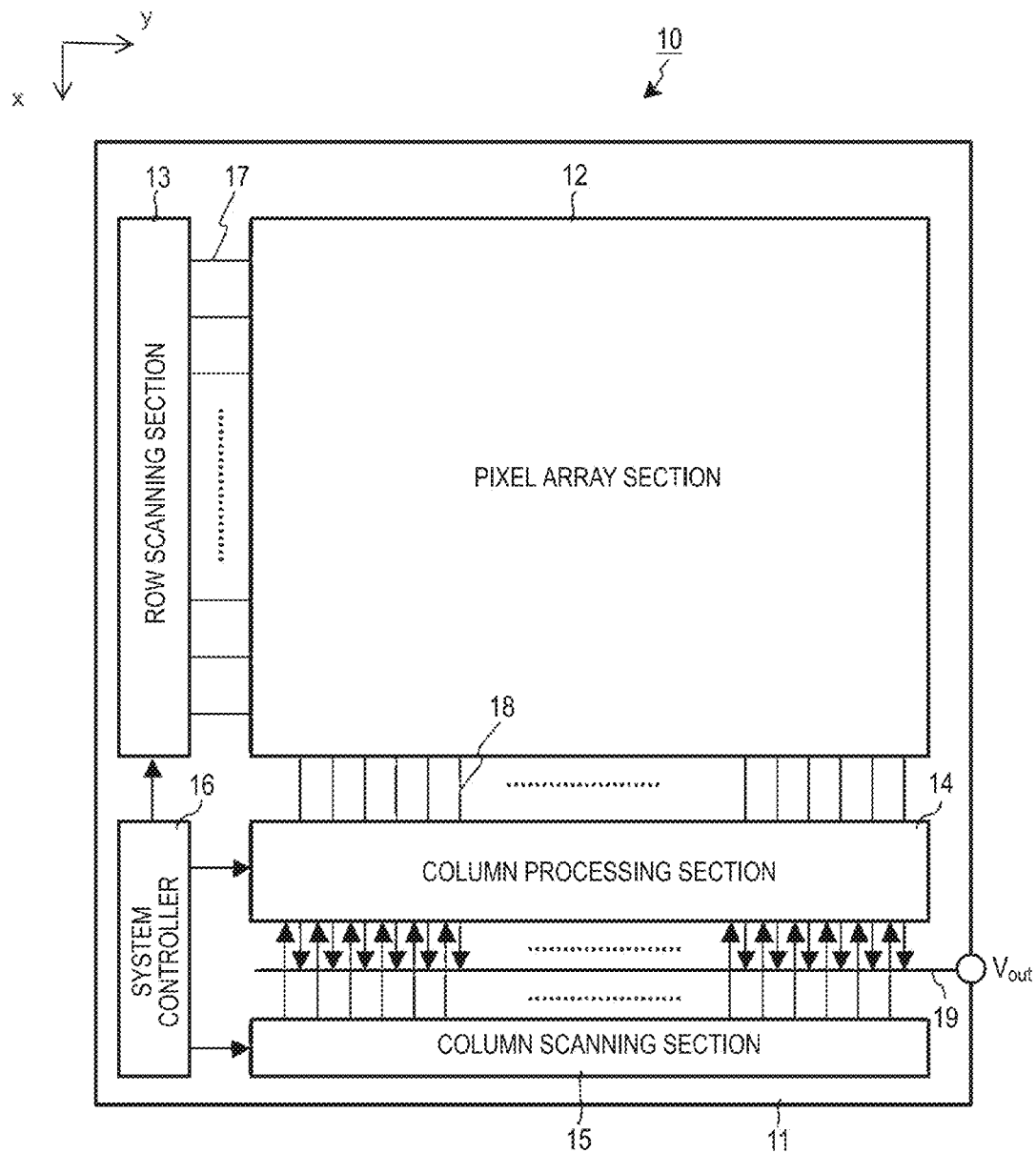
FIG. 1 is a system configuration diagram schematically illustrating a system configuration of a CMOS image sensor to which a technique according to the present disclosure is applied.

FIG. 1 is a system configuration diagram schematically illustrating a system configuration of a CMOS image sensor. Here, the CMOS image sensor is a solid-state imaging device manufactured by applying a CMOS process or partially using the CMOS process.

A CMOS image sensor 10 according to the present embodiment includes a pixel array section 12 formed on a semiconductor substrate (hereinafter, referred to as a "chip") 11, and a peripheral circuit integrated on the same chip 11 as in the pixel array section 12. In the present example, as the peripheral circuit, for example, a row scanning section 13, a column processing section 14, and a column scanning section 15 and a system controller 16 are provided.

In the pixel array section 12, unit pixels (hereinafter, simply referred to as "pixels") having a photoelectric conversion section that generates optical charges having the amount of electric charges according to the amount of incident light and accumulates the optical charges therein are two-dimensionally arranged in a matrix form. Here, the "unit pixels" are imaging pixels for obtaining an imaging signal. A specific circuit configuration of the unit pixel (imaging pixel) will be described later.

Further, in the pixel array section 12, a pixel drive line 17 is wired along the row direction (array direction of pixels in a pixel row) for each pixel row, and a vertical signal line 18 is wired along the column direction (array direction of pixels in a pixel column) for each pixel column, with respect to the pixel array of the matrix form. The pixel drive line 17 transmits a drive signal for driving pixels which are output from the row scanning section 13 in the unit of rows. In FIG. 1, the pixel drive line 17 is shown as one wiring, but the number thereof is not limited to one. One end of the pixel drive line 17 is connected to an output terminal of the row scanning section 13 corresponding to each row.

The row scanning section 13 includes a shift register, an address decoder or the like, and serves as a pixel drive section that drives each pixel of the pixel array section 12 in the unit of rows, for example. Although a specific configuration of the row scanning section 13 is not shown, but generally, the row scanning section 13 has a configuration having two scanning systems of a reading scanning system and a sweeping scanning system.

The reading scanning system sequentially and selectively scans the unit pixels of the pixel array section 12 in the unit of rows in order to read signals from the unit pixels. The signal read from the unit pixel is an analogue signal. The sweeping scanning system performs sweeping scanning prior to reading scanning by a shutter speed time, with respect to a reading row where the reading scanning is performed by the reading scanning system.

Due to the sweeping scanning in the sweeping scanning system, unnecessary electric charges are swept from the photoelectric conversion section of the unit pixels of the reading row, and thus, the photoelectric conversion section is reset. Further, due to the sweeping (resetting) of the unnecessary electric charges in the sweeping scanning system, a so-called electronic shutter operation is performed. Here, the electronic shutter operation refers to an operation of discarding optical electric charges of the photoelectric conversion section and starting new exposure (starting accumulation of optical electric charges).

The signal read by the reading operation in the reading scanning system corresponds to the amount of incident light after the immediately previous reading operation or the electronic shutter operation. Further, a period from a reading timing in the immediately previous reading operation or a sweeping timing in the electronic shutter operation to a reading timing in the current reading operation becomes an accumulation period (exposure period) of the optical electric charges in the unit pixel.

The signal output from each unit pixel of the pixel row that is selectively scanned by the row scanning section 13 is supplied to the column processing section 14 through each vertical signal line 18. The column processing section 14 performs predetermined signal processing with respect to the signal output from each pixel of the selected row through the vertical signal line 18, and temporarily holds the pixel signal after the signal processing for each pixel column in the pixel array section 12.

Specifically, the column processing section 14 receives the signal of the unit pixel and performs signal processing such as noise removal using CDS (Correlated Double Sampling), signal amplification, and AD (analog-digital) conversion, with respect to the received signal. Due to the noise removal process, reset noise or fixed pattern noise peculiar to pixels such as threshold value variation of an amplification transistor is removed. Here, the exemplified signal process is only an example, and is not limitative.

The column scanning section 15 includes a shift register, an address decoder or the like, and performs scanning of sequentially selecting unit circuits of the column processing section 14 corresponding to pixel columns. Due to the selective scanning in the column scanning section 15, the pixel signals that are signal-processed by the respective unit circuits of the column processing section 14 are sequentially output to a horizontal bus 19, and is transmitted to the outside of the chip 11 through the horizontal bus 19.

The system controller 16 receives a clock given from the outside of the chip 11, data for commanding an operation mode, or the like, and outputs data such as internal information of the present CMOS image sensor 10. The system controller 16 includes a timing generator that generates various timing signals, and performs drive control of the peripheral circuit such as the row scanning section 13, the column processing section 14 and the column scanning section 15 on the basis of the various timing signals generated by the timing generator.

<2-2. Circuit configuration of unit pixel>

Figure 2:
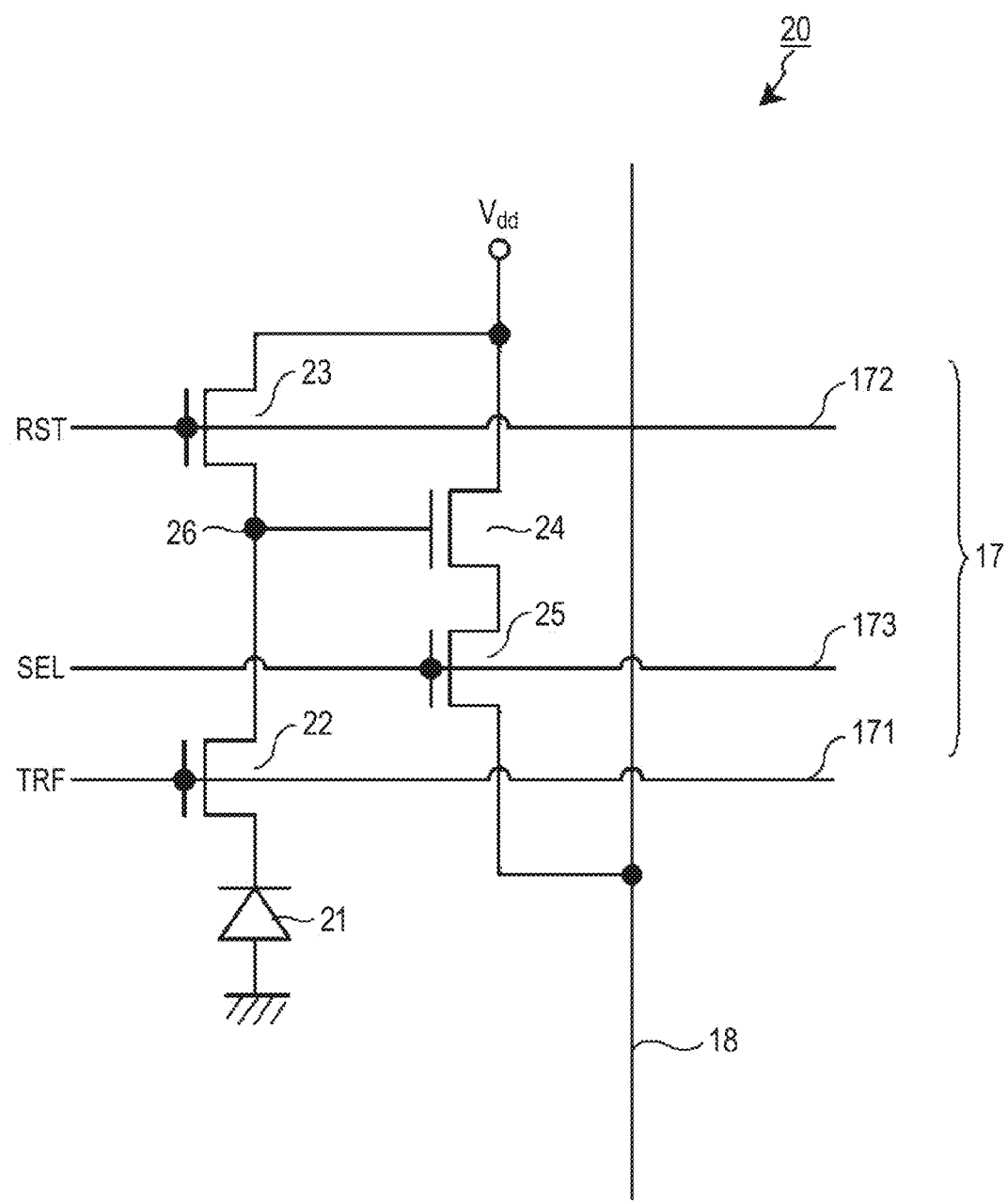
FIG. 2 is a circuit diagram illustrating an example of a circuit configuration of a unit pixel.

FIG. 2 is a circuit diagram illustrating an example of a circuit configuration of a unit pixel. As shown in FIG. 2, the unit pixel 20 according to the present circuit example uses a photodiode 21, for example, as a photoelectric conversion section. The unit pixel 20 includes four transistors of a transmission transistor (reading gate section) 22, a reset transistor 23, an amplification transistor 24 and a selection transistor 25, for example, in addition to the photodiode 21.

Here, as the four transistors 22 to 25, for example, N-channel MOS transistors are used. However, a conductive type combination of the transmission transistor 22, the reset transistor 23, the amplification transistor 24 and the selection transistor 25 illustrated herein is an only example, and the present disclosure is not limited to the combination.

With respect to the unit pixel 20, as the pixel drive line 17, for example, three drive lines of a transmission line 171, a reset line 172 and a selection line 173 are formed in common to the respective pixels in the same pixel row. Respective one ends of the transmission line 171, the reset line 172 and the selection line 173 are connected to corresponding output terminals in each pixel row of the row scanning section 13 in the unit of pixel rows, and transmits a transmission pulse TRF, a reset pulse RST and a selection pulse SEL that are drive signals for driving the pixel 20.

The photodiode 21 has an anode electrode that is connected to a negative power source (for example, ground), photoelectrically converts received light (incident light) into optical electric charges (here, photoelectrons) having the amount of electric charges according to the amount of light, and accumulates the optical electric charges. A cathode electrode of the photodiode 21 is electrically connected to a gate electrode of the amplification transistor 24 through the transmission transistor 22. Anode 26 that is electrically connected to the gate electrode of the amplification transistor 24 is referred to as an FD (floating diffusion or floating diffusion region) section.

The transmission transistor 22 is connected between the cathode electrode of the photodiode 21 and the FD section 26. The transmission pulse TRF of which a high level (for example, $V_{dd}$ level) is active (hereinafter, referred to as "high-active") is applied to a gate electrode of the transmission transistor 22 through the transmission line 171. Thus, the transmission transistor 22 enters a conductive state, and transmits the optical electric charges that are photoelectrically converted by the photodiode 21 to the FD section 26.

The reset transistor 23 has a drain electrode that is connected to a pixel power source $V_{dd}$ and a source electrode that is connected to the FD section 26. The high-active reset pulse RST is applied to a gate electrode of the reset transistor 23 through the reset line 172. Thus, the reset transistor 23 enters a conductive state, and resets the FD section 26 by discarding the electric charges of the FD section 26 to the pixel power source $V_{dd}$.

The amplification transistor 24 has a gate electrode that is connected to the FD section 26 and a drain electrode that is connected to the pixel power source $V_{dd}$. Further, the amplification transistor 24 outputs an electric potential of the FD section 26 after being reset by the reset transistor as a reset signal (reset level) $V_{reset}$. Further, the amplification transistor 24 outputs the electric potential of the FD section 26 after signal electric charges are transmitted by the transmission transistor 22 as a light-accumulated signal (signal level) $V_{sig}$.

The selection transistor 25 has a drain electrode that is connected to a source electrode of the amplification transistor 24 and a source electrode that is connected to the vertical signal line 18, for example. The high-active selection pulse SEL is applied to a gate electrode of the selection transistor 25 through the selection line 173. Thus, the selection transistor 25 enters a conductive state, and outputs a signal supplied from the amplification transistor 24 to the vertical signal line 18 using the unit pixel 20 as a selection state.

Here, a circuit configuration in which the selection transistor 25 is connected between the source electrode of the amplification transistor 24 and the vertical signal line 18 is used, but a circuit configuration in which the selection transistor 25 is connected between the pixel power source $V_{dd}$ and the drain electrode of the amplification transistor 24 may be used.

Further, the unit pixel 20 is not limited to the pixel configuration that includes the above-mentioned four transistors. For example, the unit pixel 20 may have a pixel configuration that includes three transistors in which one transistor serves as both the amplification transistor 24 and the selection transistor 25, which does not cause any problem in the pixel circuit configuration.

<2-3. Structure example of phase difference detection pixel>

The above-mentioned CMOS image sensor 10 includes a phase difference detection pixel for obtaining a phase difference detection signal in order to realize the pupil-division type phase difference detection. The phase difference detection signal is a focus detection signal indicating a shift direction (defocus direction) and a shift amount (defocus amount) of a focus. The phase difference detection pixel may be referred to as a focus detection pixel.

The phase difference detection pixels are disposed in the pixel array section 12 shown in FIG. 1, that is, an effective pixel region, in which the imaging pixels (unit pixels 20) are two-dimensionally arranged in a matrix form. That is, the imaging pixels and the phase difference detection pixels are mixed in the pixel array section 12. More specifically, the phase difference detection pixels are disposed to intersect with each other in the vertical and horizontal directions, for example, in the effective pixel region.

Figure 3A:
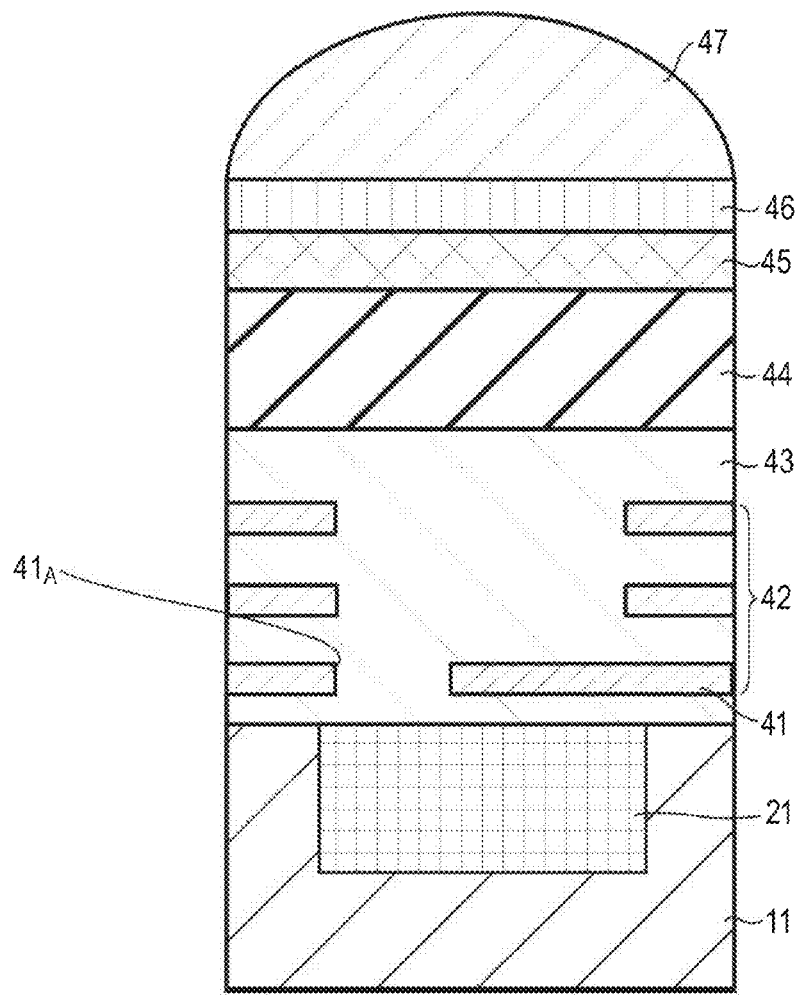
FIG. 3A is a cross-sectional view illustrating an example of a phase difference detection pixel.
Figure 3B:
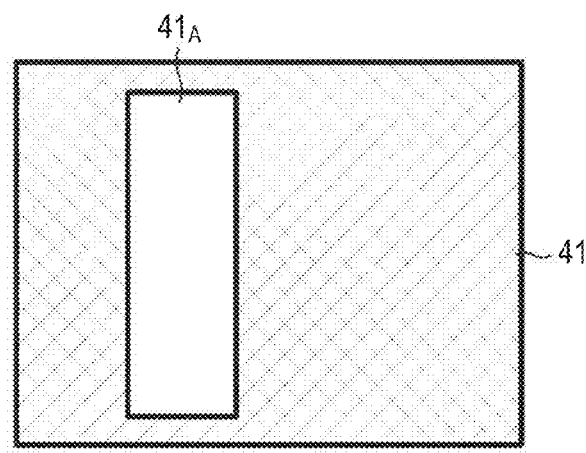
FIG. 3B is a plan view illustrating an example of a light blocking film.

The pixel circuit shown in FIG. 2 is a pixel circuit common to the imaging pixels and the phase difference detection pixels. In view of structure, the phase difference detection pixels are slightly different from the imaging pixels. Here, an example of the structure of the phase difference detection pixel will be described with reference to FIGS. 3A and 3B. FIG. 3A is a cross-sectional view illustrating a phase difference detection pixel, and FIG. 3B is a plan view illustrating a light blocking film.

A phase difference detection pixel 40 has a configuration in which the photodiode 21 that is a photoelectric conversion section is formed on a front layer of the semiconductor substrate 11 and the light blocking film 41 for detection of phase difference is disposed on the side of the light receiving surface of the photodiode 21. The phase difference detection pixel 40 is different from the imaging pixel 20 in the structure from the viewpoint of whether the light blocking film 41 for phase difference detection having an opening 41$_A$ through which some of the pupil-divided light passes is present or not. The opening 41$_A$ has a size about half the size of the unit pixel in a planar view.

In the pixel structure of the present example, as shown in FIG. 3A, the light blocking film 41 for phase difference detection is formed as a part of the wiring layer 42, and specifically, is formed such a manner that the lowermost wiring layer of the wiring layer 42 is used also as the light blocking film. Further, an insulator film 44 is layered on an interlayer insulator film 43 that includes the light blocking film 41 and the wiring layer 42, a color filter 45 is layered on the insulator film 44, a planarizing film 46 is layered on the color filter 45, and a microlens (so-called on-chip lens) 47 is layered on the planarizing film 46, sequentially.

Here, the light blocking film 41 may be exclusively formed, in addition to the wiring layer 42, instead of being formed to be used also as the lowermost wiring layer of the wiring layer 42. The light blocking film 41 may be formed of a material having a light blocking effect such as tungsten (W) or titanium (Ti). Here, the exemplified pixel structure corresponds to a case where the phase difference detection pixels are arranged in the horizontal direction in the effective pixel region to divide right and left light flux from an exit pupil. In a case where the phase difference detection pixels 40 are arranged in the vertical direction in the effective pixel region, a pixel structure in which the opening 41$_A$ is rotated by 90 degrees is used in FIG. 3B.

<3. First embodiment>

As described above, the phase difference detection pixel 40 and the imaging pixel (unit pixel) 20 are different from each other in that whether the light blocking film 41 having the opening 41$_A$ is present or not in view of the structure, and are also different from each other in view of the focal distance of the microlens 47.

In order to maintain a high sensitivity characteristic of the imaging pixel 20, it is preferable that the microlens (first microlens) formed corresponding to the imaging pixel 20 be formed so that its focal position is disposed on the light receiving surface of the photodiode 21. On the other hand, in order to maintain a high sensitivity characteristic of the phase difference detection pixel 40, it is preferable that the microlens (second microlens) formed corresponding to the phase difference detection pixel 40 is formed so that its focal position is disposed on the light blocking film 41.

Thus, it is preferable that the microlens formed corresponding to the phase difference detection pixel 40 is formed so that its focal distance is short compared with the microlens formed corresponding to the imaging pixel 20. The short focal distance means that the focal position of the microlens formed corresponding to the phase difference detection pixel 40 is present at a position spaced from the light receiving surface of the photodiode 21.

Here, generally, the relationship between the microlens 47 formed corresponding to the phase difference detection pixel 40 and the light blocking film 41 will be described with reference to FIG. 4. Part A in FIG. 4 is a diagram schematically illustrating a cross section of the microlens 47 in the array direction, and part B is a diagram schematically illustrating a cross section of the microlens 47 in the diagonal direction.

The opposite side direction may also be referred to as an array direction. For example, as illustrated by the legend in FIG. 1, an example of the array direction is the row direction "x". Alternatively, an example of the array direction may be the column direction "y". The opposite side direction or array direction may still further be referred to as the transverse direction, consistent with the view of the pixel array section 12 shown in FIG. 1. Further, the "diagonal direction" means a direction inclined with respect to the array direction, that is, an oblique direction, which is similarly applied in the following description.

Light (light flux) is incident on the microlens 47 from an exit pupil region of an imaging lens (not shown). Further, the light passed through the microlens 47 is guided to the light blocking film 41 having the opening $41_A$ of the size about half the size of the pixel unit in a planar view. In the example of FIG. 4, since the left half of the light blocking film 41 is formed with the opening $41_A$, it is preferable that only the right light incident from the exit pupil region passes through the opening $41_A$ and is guided to the photodiode 21 disposed under the light blocking film 41. At this time, the left light incident from the exit pupil region is blocked by the light blocking film 41.

With respect to a lens portion of the microlens 47 in the array direction (transverse direction) where the width size is short, as shown in part A in FIG. 4, light incident from the right and left of the exit pupil favorably passes through the opening $41_A$ of the light blocking film 41, or is blocked by the light blocking film 41, respectively. However, with respect to a lens portion in the diagonal direction (oblique direction) formed in the same plane where the width size is longer than that of the lens portion in the transverse direction, since its focal distance is long, as shown in part B in FIG. 4, the right and left light is not favorably divided from each other by the light blocking film 41. If the right and left light is not favorably divided from each other, detection accuracy of the phase difference detection pixel 40 (hereinafter, may be referred to as "AF detection accuracy") is reduced.

In this way, considering that the AF detection accuracy is reduced due to the microlens 47 formed corresponding to the phase difference detection pixel 40, the AF detection accuracy should be enhanced. To this end, there is provided the microlens (second microlens) according to the first embodiment of the present disclosure.

In the case of the general microlens 47 described with reference to FIG. 4, the focal position in the opposite side direction (opposite side boundary region including the opposite side central portion of the pixel boundary) corresponds to the position of the light blocking film 41, and the focal position in the diagonal direction (diagonal boundary region including the diagonal boundary) corresponds to the position on the side of the photodiode 21 from the light blocking film 41. That is, there is a big difference between both of the focal distances, which results in reduction in the AF detection accuracy.

On the other hand, the microlens 47 according to the first embodiment of the present disclosure is formed so that the difference between the focal distance of the opposite side boundary region (in the array direction) including the opposite side central portion of the pixel boundary and the focal distance of the diagonal boundary region (in the diagonal direction or the oblique direction) including the diagonal boundary is small, compared with a microlens that has substantially the same area in a planar view.

The microlens 47 according to the first embodiment of the present disclosure will be described with reference to FIG. 5. Part A in FIG. 5 is a diagram schematically illustrating a cross section of the microlens 47 in the array direction, and part B in FIG. 5 is a diagram schematically illustrating a cross section of the microlens 47 in the diagonal direction.

As is obvious from comparison of parts A and B in FIG. 5, the microlens 47 according to the first embodiment is formed so that a bottom surface in the transverse direction (array direction), that is, in the opposite side boundary region including the opposite side central portion of the pixel boundary is higher in position than a bottom surface in the diagonal direction, that is, in the diagonal boundary region including the diagonal boundary.

There is no problem in transverse division ability of the microlens 47, in a similar way to the case described with reference to part A in FIG. 4. On the other hand, with respect to the diagonal direction of the microlens 47, as the above-mentioned focal distance relationship is satisfied, the bottom surface of the lens portion in the diagonal direction is lower in position than the bottom surface of the lens portion in the transverse direction. In this way, by forming the microlens 47 so that the positions of the bottom surfaces of the lens portions in the transverse and diagonal directions are different from each other, it is possible to enhance division ability in the diagonal direction while maintaining favorable division ability in the transverse direction, and thus, the AF detection accuracy becomes favorable. The relationship between the bottom surface of the lens portion in the diagonal direction and the bottom surface of the lens portion in the array direction may also be described in terms of their relation to an upper surface 502 of the photodiode 21. That is, the microlens has a bottom surface in the diagonal direction that is closer to the upper surface of the photodiode 21 than is the bottom surface in the array direction (i.e., the distance Dist Diag is less than the distance Dist Array as shown in FIG. 5).

As described above, it is preferable that the microlens formed corresponding to the imaging pixel 20 is formed so that the focal position of the microlens coincides with the position of the light receiving surface of the photodiode 21. Thus, it is possible to enhance sensitivity of the imaging pixel 20 and thus sensitivity of the solid-state imaging device.

Here, the term "coincide with" includes the case of strict coincidence and the case of substantial coincidence. The presence of various variations occurring in design or manufacturing is allowed.

On the other hand, it is preferable that the microlens 47 formed corresponding to the phase difference detection pixel 40 is formed so that its focal position coincides with the position of the light blocking film 41. At this time, it is ideal that both of the focal positions in the transverse direction and the diagonal direction together collide with the position of the light blocking film 41.

Here, both of the focal positions in the transverse direction and the diagonal direction should not necessarily coincide with the position of the light blocking film 41. That is, it is sufficient if the difference between the focal distances of the microlenses in the transverse direction and the diagonal direction is formed to be smaller than that in a "microlens formed in the same plane", and thus, it is possible to enhance the AF detection accuracy.

Here, the definition of "microlens formed in the same plane" will be described. Even in the microlens formed in the same plane, when the microlens is formed by photolithography, for example, by cutting corners of a square pattern or using a photomask of a circular pattern, it is possible to shorten the length in the diagonal direction with respect to the length in the transverse direction to thereby adjust the focal distance.

In the microlens in the solid-state imaging device, by enlarging the area as much as possible, the sensitivity characteristic of the solid-state imaging device is enhanced. Thus, the "microlens formed in the same plane" refers to a microlens, having an effective area of 80% or more, that is formed so that the adjacent microlenses are in contact with each other at least in the array direction, as shown in FIG. 6. Here, "80%" includes the case of strict 80% and the case of substantial 80%. The presence of various variations occurring in design or manufacturing is allowed.

As described above, by forming the microlens 47 of the phase difference detection pixel 40 so that the difference between the focal distance in the array direction and the focal distance in the diagonal direction is small, compared with the microlens that has substantially the same area in a planar view, it is possible to enhance the AF detection accuracy. That is, by reducing the difference between the focal distance in the array direction and the focal distance in the diagonal direction, it is possible to set the focal positions in both the directions in the vicinity of the position of the light blocking film 41 for pupil division. Thus, it is possible to enhance division ability of right and left light in the array direction and the diagonal direction, and it is thus possible to enhance the AF detection accuracy of the phase difference detection pixel 40.

<3-1. Method of forming microlens>

The microlens 47 of the phase difference detection pixel 40 is formed so that the difference between the focal distance of the opposite side boundary region including the opposite side central portion of the pixel boundary and the focal distance of the diagonal boundary region including the diagonal boundary is small, compared with the microlens that has substantially the same area in a planar view. Hereinafter, a method of forming the microlens 47 of the phase difference detection pixel 40 (method of forming the microlens according to the embodiment of the present disclosure) will be described with reference to specific examples.

(First Example)

FIGS. 7 and 8 are process diagrams (first diagram and second diagram) illustrating the flow of processes of a forming method of a microlens according to a first example.

Firstly, in process 1 in FIG. 7, a positive photosensitive resin is patterned on a microlens base material 51 using photolithography, to form a microlens pattern 52. Here, the microlens base material 51 is formed by an acrylic resin, a styrene-based resin, a copolymer-based resin thereof, or the like. Further, the positive photosensitive resin is a resin in which an acrylic resin, a novolac resin, a styrene-based resin, a copolymer resin thereof, or the like is used as a main component.

In process 1 to process 3 in FIG. 7, a diagram on the upper side is a plan view of a partial region of a pixel array section. Further, an upper diagram on the lower side is a cross-sectional view of the microlens pattern 52 taken along line a-a' in the planar view on the upper side, that is, in the array direction (transverse direction). Further, a lower diagram on the lower side is a cross-sectional view of the microlens pattern 52 taken along line b-b' in the planar view on the upper side, that is, in the diagonal direction (oblique direction). Further, process 4 to process 6 in FIG. 8 are the same as in process 1 to process 3 in FIG. 7.

Next, in process 2 in FIG. 7, the microlens pattern 52 is melted and flowed by a heating process at a temperature of a thermal softening point or higher, to form a microlens mask pattern 53. The heating process is performed on a hot plate at a temperature of about 140 degrees C. to about 200 degrees C., for example.

Next, in process 3 in FIG. 7, the microlens mask pattern 53 is dry-etched by dry etching. Here, as shown in the figure, the microlens mask patterns 53 that are adjacently formed corresponding to the imaging pixels are formed to be in contact with each other in the array direction and to have a gap in the diagonal direction.

The dry etching used herein is performed by the following method, for example. That is, by performing the process so that a gap W (see process 2 in FIG. 7) between the layers of the microlens mask patterns 53 is narrowed, an effective area of the microlens is enlarged. With such a configuration, it is possible to enhance the sensitivity characteristic in the solid-state imaging device.

The etching process is performed under the following conditions, as an example. For example, using a microwave plasma etching device, etching conditions that magnetron power is 1100 W, bias power is 40 W, etching gas A is $SF_6$ (flow rate: SCCM), etching gas B is $C_4F_8$ (flow rate: 100 SCCM), etching gas C is Ar (flow rate: 25 SCCM), electrode temperature is −30 degrees C. and etching chamber pressure is 2 Pa are set.

The etching device is not limited to the microwave plasma etching device. Other high density plasma etching devices such as a parallel-plate RIE device, a high-pressure narrow gap plasma etching device, an ECR etching device, a transformer coupling plasma etching device, an inductive coupling plasuma etching device or a helicon wave plasma etching device may be used.

The type of the etching gas is not limited to $SF_6$, $C_4F_8$, and Ar. Single fluorocarbon-based gas such as CF4, $C_2F_6$, $C_3F_8$, $C_4F_8$, $CH_2F_2$ or $CHF_3$ or gas obtained by adding He or $N_2$ gas or the like to the fluorocarbon-based gas may be used.

Next, in process 4 in FIG. 8, in order to form the microlens corresponding to the phase difference detection pixel between the microlenses formed in the imaging pixels by dry etching, a positive photosensitive resin is patterned using photolithography, to form a microlens pattern 54.

Here, the positive photosensitive resin is a resin in which a novolac resin, a styrene-based resin, a copolymer resin thereof, or the like is used as a main component. The microlens pattern 54 corresponding to the phase difference detection pixel is formed so that the microlens pattern 54 is not in contact with the microlens mask patterns 53 corresponding to the imaging pixels.

Next, in process 5 in FIG. 8, the microlens pattern 54 corresponding to the phase difference detection pixel is melt and flowed by a heating process, to form a microlens mask pattern 55. The heating process is performed on a hot plate at a temperature of about 140 degrees C. to about 200 degrees C., for example.

The microlens mask pattern 55 that is melt and flowed in the present heating process is formed so that at least a part thereof in the array direction is in contact with the microlens mask pattern 53 corresponding to the imaging pixel. Here, a gap is present between the microlens mask pattern 55 and the microlens mask pattern 53 corresponding to the imaging pixel adjacent in the diagonal direction.

Here, the height $t_0$ of the microlens in the transverse direction and the height $t_0'$ in the diagonal direction are almost the same since they are formed in the plane. Here, the "same" includes the strictly same case and the substantially same case. The presence of various variations occurring in design or manufacturing is allowed.

As an operation, a bottom surface of the microlens mask pattern 55 moves close to the microlens pattern 53 formed corresponding to the adjacent imaging pixel by the heating process, and its movement speed is reduced at the moment when the bottom surface of the microlens mask pattern 55 is in contact with a bottom surface of the microlens pattern 53. By appropriately adjusting heating conditions such as temperature, time or processing number of times, it is possible to form the microlens mask pattern 55 with substantial self-alignment.

In this way, since it is possible to form the microlens mask pattern 55 corresponding to the phase difference detection pixel with substantial self-alignment, it is possible to reduce relative overlay shift of the microlens corresponding to the imaging lens and the microlens corresponding to the phase difference detection pixel. Further, since the effective areas of the respective microlenses in the planar view are substantially the same, it is possible to form the microlens mask pattern 55 corresponding to the phase difference detection pixel without deteriorating the sensitivity characteristic of the imaging pixel.

Next, in process 6 in FIG. 8, a microlens pattern 56 corresponding to the phase difference detection pixel is formed and then is dry-etched by the dry etching described in process 3 in FIG. 7. As shown in the figure, the microlens pattern 56 corresponding to the phase difference detection pixel is formed to be in contact with a microlens pattern 57 corresponding to the imaging pixel in the transverse direction and the diagonal direction.

Further, as shown in process 5 in FIG. 8, since the gap is present between the microlens patterns in the diagonal direction and thereby deeply etching the portion, the bottom surface of the microlens in the diagonal direction is deeply formed with respect to the transverse direction. In this way, as the effective area is large and the focal distances in the transverse direction and the diagonal direction are shortened and close to each other, the detection sensitivity of the phase difference detection pixel is enhanced.

Although detailed description thereof is not shown, according to the present first example, with respect to the microlenses formed corresponding to the imaging pixels, the gap of the microlenses in the transverse direction and the diagonal direction is not present in a similar way to the microlenses formed corresponding to the phase difference detection pixels, and the focal distances in the transverse direction and the diagonal direction are shortened and close to each other. Thus, it is possible to enhance the sensitivity characteristic of the solid-state imaging device. Further, it is possible to provide a technique for effectively enhancing a smear characteristic in the CCD solid-state imaging device (CCD image sensor).

(Second Example)

FIG. 9 is a process diagram illustrating the flow of processes of a forming method of a microlens according to a second example.

The forming method according to the second example uses the same processes as the processes 1 to 3 in FIG. 7 in the forming method according to the first example. As shown in process 3 in FIG. 7, when the microlens mask pattern 53 is dry-etched by dry etching, the microlens mask patterns 53 that are adjacently formed corresponding to the imaging pixels are formed to be in contact with each other in the array direction and to have a gap in the diagonal direction.

In the forming method according to the second example, in process 1 in FIG. 9, by further adding a dry etching process to the microlens mask patterns 53, formed corresponding to the imaging pixels, that are in contact with each other in the array direction and have a gap in the diagonal direction, the microlens mask pattern 53 that are also in contact with each other in the diagonal direction are formed.

A broken line in the figure represents a pixel boundary (pixel boundary line). By adding the dry etching process, as shown in the figure, an edge portion of the microlens mask pattern 53 formed corresponding to the imaging pixel is formed to exceed the pixel boundary with respect to an edge portion of a region where the imaging pixel is not formed (region where the microlens of the phase difference detection pixel is to be formed).

Further, a cross section of the microlens mask pattern 53 of the imaging pixel formed to exceed the pixel boundary has an asymmetrical shape. Specifically, for example, the microlens mask patterns 53 of the imaging pixels disposed at the right and left positions of the region where the imaging pixel is formed have an asymmetrical cross section shape with respect to a vertical line passing through the center.

Particularly, in process 1 in FIG. 9, the vicinity of a bottom surface of the microlens mask pattern 53 surrounded by a broken line A has a large asymmetry. Further, in a region ranging from the vicinity of the bottom surface of the lens in which the asymmetry is large to below the top of the lens, surrounded by a broken line B, the asymmetry is smaller than that of the bottom portion of the microlens.

Next, in process 2 in FIG. 9, a positive photosensitive resin is patterned by photolithography, in order to form the microlens corresponding to the phase difference detection pixel between the microlens mask patterns 53 formed corresponding to the imaging pixels by dry etching. Here, the positive photosensitive resin is a resin in which a novolac resin, a styrene-based resin, a copolymer resin thereof, or the like is used as a main component. Here, the microlens pattern 54 formed corresponding to the phase difference detection pixel is formed to be in contact with the microlens mask pattern 53 of the imaging pixel.

Next, in process 3 in FIG. 9, a microlens mask pattern 55 is formed by causing the microlens pattern 54 to be melted and flowed by the heating process. The heating process is performed on a hot plate at a temperature of about 140 degrees C. to about 200 degrees C., for example. Here, the microlens mask pattern 55 formed corresponding to the phase difference detection pixel is in contact (overlaps) with the bottom portion of the microlens mask pattern 53 for the imaging pixel in which the above-mentioned asymmetry is large while covering the bottom portion, and the thickness $t_6$ in the diagonal direction is formed to be greater than the thickness $t_5$ in the transverse direction.

Next, in process 4 in FIG. 9, the microlens mask pattern 55 is dry-etched by dry etching. A microlens mask pattern 56 formed corresponding to the phase difference detection pixel is formed to be in contact (overlap) with the bottom portion of a microlens mask pattern 57 of an imaging pixel in which the above-mentioned asymmetry is large while covering the bottom portion, and thus, the asymmetry is small and the thickness $t_8$ in the diagonal direction is formed to be greater than the thickness $t_7$ in the transverse direction.

In this way, as the bottom surface of the microlens in the diagonal direction is deeply formed with respect to the transverse direction, the effective areas of the microlenses formed corresponding to the imaging pixels and the phase difference detection pixel are large. Further, their focal distances in the transverse direction and the diagonal direction are shortened and close to each other, and thus, the AF detection sensitivity is enhanced.

(Third Example)

FIGS. 10 and 11 are process diagrams (diagram 1 and diagram 2) illustrating the flow of processes of a forming method of a microlens according to a third example.

Firstly, in process 1 in FIG. 10, a positive photosensitive resin is patterned on a microlens base material 51 using photolithography, to form a microlens pattern 52. Here, the microlens base material 51 is formed by an acrylic resin, a styrene-based resin, a copolymer-based resin thereof, or the like. Further, the positive photosensitive resin is a resin in which an acrylic resin, a novolac resin, a styrene-based resin, a copolymer resin thereof, or the like is used as a main component.

Next, in process 2 in FIG. 10, the microlens pattern 52 is melted and flowed by a heating process at a temperature of a thermal softening point or higher to form a microlens mask pattern 53. The heating process is performed on a hot plate at a temperature of about 140 degrees C. to about 200 degrees C., for example.

Next, in process 3 in FIG. 10, the microlens mask pattern 53 is dry-etched by dry etching. Here, as shown in the figure, with respect to the microlens mask patterns 53 that are adjacently formed corresponding to the imaging pixels, a gap is not present in the array direction and the diagonal direction.

In the dry etching process, in process 2 in FIG. 10, since a gap in the diagonal direction is wide compared with the array direction of the microlens mask pattern 53, even when the microlens mask patterns 53 are in contact with each other in the array direction, the gap remains in the diagonal direction. The relationship between the thickness $t_9$ of the microlens mask pattern 53 in the array direction and the thickness $t_{10}$ thereof in the diagonal direction is $t_9 < t_{10}$.

Next, in process 4 in FIG. 11, a positive photosensitive microlens resin 58 formed by an acrylic resin, a styrene-based resin, a novolac resin, a copolymer resin thereof, or the like is applied on the microlens mask pattern 53.

Next, in process 5 in FIG. 11, the positive photosensitive microlens resin 58 is patterned by photolithography. Here, in a case where naphthoquinone diazido is included as a photosensitizer in the positive photosensitive microlens resin, ultraviolet irradiation is performed for maintaining adsorption in visible light, and thus, the photosensitizer is decomposed to enhance transmittance (bleaching exposure).

Next, in process 6 in FIG. 11, a positive photosensitive microlens resin pattern 59 is melted and flowed by a heating process at a temperature of a thermal softening point or higher, to form a microlens mask pattern 60. The heating process is performed on a hot plate at a temperature of about 140 degrees C. to about 200 degrees C., for example.

In this way, as shown in the figure, the microlens formed corresponding to the phase difference detection pixel is formed to allow the microlens mask pattern 59 formed by the positive photosensitive microlens resin 57 to overlap with the microlens mask pattern 53 formed by the dry etching. Thus, the thickness of the top of the microlens of the phase difference detection pixel becomes large.

As a result, the focal distance of the microlens of the phase difference detection pixel is shorter than that of the microlens of the imaging pixel, and the difference between a focal distance of an opposite side boundary region including an opposite side central portion and a focal distance of a diagonal boundary region including a diagonal boundary becomes small. Further, since a gap is not present in the array direction and the diagonal direction with respect to the microlens of the imaging pixel, it is possible to enhance the sensitivity characteristic of the imaging pixel and the AF detection accuracy.

Here, the size of the microlens formed to overlap with the positive photosensitive microlens resin will be described with reference to FIG. 12.

The microlens is formed in the region surrounded by the pixel boundary indicated by the broken line in process 1 in FIG. 9, and the size of the microlens is set to 80% or more of the area of the unit pixel. In this regard, in a case where the microlens is formed outside the unit pixel region, the microlens overlaps with the microlens formed corresponding to the adjacent imaging pixel, and thus, the sensitivity characteristic of the imaging pixel is deteriorated. If the size (area) is set to 80% or more of the area of the unit pixel, there is no problem in the AF detection accuracy.

Next, the shape of the microlens will be described. In process 1 in FIG. 10, the microlenses having the same shape corresponding to the imaging pixel and the phase difference detection pixel, specifically, the square pattern shape in a planar view is formed, but the shape is not limited thereto. For example, as shown in FIG. 13, at least a part of the microlenses of the phase difference detection pixels may have the same gap as that between the patterns of the imaging pixels in the array direction, using a circular pattern shape or a polygonal pattern shape in a planar view.

This depends on the following reason. That is, as the same gap is present in the array direction, the gap disappears in the array direction in the dry etching process and, as the etching process is added, the area of the microlens in a planar view is enlarged so that the gap in the diagonal direction is reduced. At this time, the pattern asymmetry due to proceeding of the microlens of the imaging pixel into the boundary of the phase difference detection pixel can be reduced compared with a case where there is no microlens mask pattern in the phase difference detection pixel (see process 1 in FIG. 9).

Even in a case where the pattern asymmetry is slightly deteriorated in this way, the microlens corresponding to the phase difference detection pixel may be formed using a positive photosensitive microlens resin while overlapping with the imaging pixel proceeding into the region of the phase difference detection pixel in a similar way to the second example.

(Fourth Example)

FIG. 14 is a process diagram illustrating the flow of the processes of the forming method of the microlens according to the fourth example.

The forming method of the microlens according to the fourth example is a forming method using a polygonal pattern as the pattern shape of the microlens corresponding to the phase difference detection pixel. Process 1 in FIG. 14 corresponds to process 3 in FIG. 10. Processes before process 1 are the same as process 1 and process 2 in FIG. 10. Further, in process 1 in FIG. 14, a polygonal mask is used for formation of the microlens corresponding to the phase difference detection pixel.

Next, in process 2 in FIG. 14, a positive photosensitive microlens resin 57 that is formed by an acrylic resin, a styrene-based resin, a novolac resin, a copolymer-based resin thereof, or the like, is applied on a microlens mask pattern 53.

Next, in process 3 in FIG. 14, the positive photosensitive microlens resin 57 is patterned by photolithography. Here, in the figure, as surrounded by a circle of a broken line, by using a polygonal pattern in which corner portions are cut, the film thickness of the positive photosensitive microlens resin 58 patterned in the corner portions is formed to be greater compared with the case in process 5 in FIG. 11.

Next, process 4 in FIG. 14, the positive photosensitive microlens resin pattern 58 is melt and flowed by a heating process at a temperature of a thermal softening point or higher to form a microlens mask pattern 59. The heating process is performed on a hot plate at a temperature of about 140 degrees C. to about 200 degrees C., for example.

Here, as described above, since the film thickness of the positive photosensitive microlens resin 58 patterned in the corner portions is large, a microlens in which a focal distance is shortened is formed. At this time, the microlens is formed to be smaller than the pixel boundary in the transverse direction and the oblique direction while including the diagonal boundary. Further, the microlens formed by the overlapped positive photosensitive microlens resin 59 is formed to cover the microlens formed by the dry etching in the diagonal direction. The area thereof is set to 80% or more of the unit pixel area while being formed in the region surrounded by the pixel boundary (see FIG. 12).

In the above-described first to fourth examples, the microlens corresponding to one phase difference detection pixel is formed in the array of the microlenses corresponding to the imaging pixels, but the present disclosure is not limited thereto. For example, as shown in FIG. 15, plural (here, two) microlenses corresponding to the phase difference detection pixels may be formed in the transverse direction. Further, the direction is not limited to the transverse direction, and the plural microlenses may be formed in the longitudinal direction or the diagonal direction.

A method of forming the plural microlenses corresponding to the phase difference detection pixels arranged in the array of the microlenses corresponding to the imaging pixels in this way will be described below as a fifth example. A sixth example and a seventh example are the same as the fifth example in that the plural microlenses corresponding to the phase difference detection pixels are arranged in the array of the microlenses corresponding to the imaging pixels.

(Fifth Example)

FIG. 16 is a process diagram illustrating the flow of processes of a forming method of a microlens according to a fifth example.

Firstly, in process 1 in FIG. 16, a positive photosensitive resin in which an acrylic resin, a novolac resin, a styrene-based resin, a copolymer resin thereof, or the like is used as a main component is patterned on a microlens base material formed by an acrylic resin, a styrene-based resin, a copolymer resin thereof, or the like by photolithography. Then, the pattern is melt and flowed by a heating process at a temperature of a thermal softening point or higher, to form a microlens mask pattern corresponding to an imaging pixel. The heating process is performed on a hot plate at a temperature of about 140 degrees C. to about 200 degrees C., for example.

Next, in process 2 in FIG. 16, a positive photosensitive resin in which an acrylic resin, a novolac resin, a styrene-based resin, a copolymer resin thereof, or the like is used as a main component is patterned on the microlens mask pattern of the imaging pixel that is thermally cured by photolithography. Then, the positive photosensitive resin pattern is melt and flowed by a heating process at a temperature of a thermal softening point or higher, to form a microlens mask pattern corresponding to the phase difference detection pixel. The coated film thickness of the positive photosensitive resin is set to be greater than the coated film thickness when the microlens mask pattern of the imaging pixel is formed. The heating process is performed on a hot plate at a temperature of about 140 degrees C. to about 200 degrees C., for example.

Next, in process 3 in FIG. 16, the microlens pattern of the imaging pixel and the microlens mask pattern of the phase difference detection pixel are dry-etched by dry etching. Here, as shown in the figure, the microlenses that are adjacently formed corresponding to the imaging pixels are formed to be in contact with each other in the array direction and the diagonal direction.

In this way, since the microlenses of the imaging pixels and the microlenses of the phase difference detection pixels are formed to be in contact with each other in the transverse direction and the diagonal direction, the sensitivity of the solid-state imaging device is high and the AF detection sensitivity is enhanced. Further, with respect to the shape of the microlens, as described in the first example, the bottom surface of the microlens in the diagonal direction is deeply formed with respect to the transverse direction, and the coated film thickness is set to be greater than the coated film thickness when the microlens mask pattern for image pixel is formed.

Thus, the microlens corresponding to the phase difference detection pixel is formed to be distant from the photoelectric conversion section formed on the semiconductor substrate, in other words, so that its focal distance is shortened, compared with the focal position of the microlens corresponding to the imaging pixel. Further, the microlens corresponding to the phase difference detection pixel is formed so that the difference between a focal distance of an opposite side boundary region including an opposite side central portion of a pixel boundary and a focal distance of a diagonal boundary region including a diagonal boundary is small, compared with a microlens that has substantially the same area in a planar view.

The forming method of the microlens according to the fifth example is not limited to a case where the plural microlenses corresponding to the phase difference detection pixels are formed in the array of the microlenses corresponding to the imaging pixels, but may be applied to a case where one microlens is formed.

(Sixth Example)

FIG. 17 is a process diagram illustrating the flow of processes of a forming method of a microlens according to a sixth example. The sixth example corresponds to the third example shown in FIGS. 10 and 11. Specifically, process 1 and process 2 in FIG. 17 correspond to process 2 and process 3 in FIG. 10, respectively. Further, in process 3 in FIG. 17 corresponding to processes 4 to 6 in FIG. 11, microlenses corresponding to adjacent phase difference detection pixels are formed. Here, in order to prevent pattern collapsing due to fusion, it is necessary to have a gap between positive photosensitive microlens resins.

(Seventh Example)

FIG. 18 is a process diagram illustrating the flow of processes of a forming method of a microlens according to a seventh example. The seventh example corresponds to the fourth example shown in FIG. 14, that is, a case where the pattern shape of the microlens corresponding to the phase difference detection pixel is the polygonal pattern. Specifically, process 2 in FIG. 18 corresponds to process 1 in FIG. 14. Further, in process 3 in FIG. 18 corresponding to processes 2 to 4 in FIG. 14, microlenses corresponding to adjacent phase difference detection pixels are formed. Here, in order to prevent pattern collapsing due to fusion, it is necessary to have a gap between positive photosensitive microlens resins.

According to the forming methods of the above-described examples, the microlens 47 of the phase difference detection pixel 40 may be formed so that the difference between a focal distance in the array direction and a focal distance in the diagonal direction is small, compared with a microlens that has substantially the same area in a planar view, and the following effects may be achieved.

That is, with respect to the microlens formed corresponding to the imaging pixel 20 as well as the microlens 47 of the phase difference detection pixel 40, it is possible to enlarge its effective area. Thus, it is possible to optimize the sensitivity of the solid-state imaging device and the AF detection accuracy (sensitivity). Further, when the microlens is formed by the dry etching method, it is possible to form the microlens in consideration of asymmetry of a cross section.

However, with respect to the forming method of the microlens, in order to suppress occurrence of a non-forming portion due to fusion when a microlens material is formed by heating, a technique of dividing the pattern of the microlens into a checkered pattern two times is known (for example, JP-A-2006-6631, JP-A-2009-265535 and JP-A-2011-129638). According to these techniques, since it is possible to remove a gap between adjacent microlenses, it is possible to increase condensing efficiency of the microlens and to enhance the sensitivity characteristic of the solid-state imaging device.

However, the above-mentioned techniques in the related art can remove the gap between the adjacent microlenses in the array direction, but does not consider the relationship between the adjacent microlenses in the diagonal direction. Here, there is microlenses that are adjacent in the diagonal direction in the microlenses formed by the checkered pattern.

As described above, in order to prevent fusion between the microlenses adjacent in the diagonal direction and to suppress occurrence of the non-formation portion of the microlens, it is necessary to form the microlenses that are heated and formed, in a state where a gap between the microlenses is present. Due to the existence of the gap, the sensitivity characteristic of the solid-state imaging device is deteriorated. Further, in these techniques in the related art, with respect to the shape of the microlens, control of the shapes of cross sections in an opposite side boundary region including an opposite side central portion of the pixel boundary of the microlens and in a diagonal boundary region including a diagonal boundary is not considered.

Hereinbefore, a case where each pixel of the pixel array section 12 formed by two-dimensionally arranging the imaging pixels 20 and the phase difference detection pixels 40 in a matrix form is a square pixel in a planar view has been described, but as shown in FIG. 19, even in a case where the pixel is a rectangular pixel in a planar view, the same operation and effect as in the square pixel can be achieved. In FIG. 19, a pixel shape that is long in the row direction is used as an example, but a pixel shape that is long in the column direction may be used.

Further, hereinbefore, as the solid-state imaging device to which the present embodiment is applied, the CMOS image sensor of a surface irradiation pixel structure is used as an example, but the present embodiment is not limited to the surface irradiation pixel structure, but may be applied to a CMOS image sensor of a back side irradiation pixel structure. Here, the "front side irradiation pixel structure" means a pixel structure in which incident light is introduced (light is irradiated) from the side on which a wiring layer is formed (see FIGS. 3A and 3B). Further, the "the back side irradiation pixel structure" means a pixel structure in which incident light is introduced (light is irradiated) from a side opposite to the side on which the wiring layer is formed.

<3-2. Back side irradiation pixel structure>

Here, the outline of the back side irradiation pixel structure will be described with reference to FIG. 20. FIG. 20 is a cross-sectional view illustrating an example of the back side irradiation pixel structure. Here, a cross section structure corresponding to two pixels is shown.

In FIG. 20, the photodiode 21 that is the photoelectric conversion section and pixel transistors (transistors 22 to 25 in FIG. 2) are formed on the semiconductor substrate 11. Further, the color filter 45 is formed on one surface of the semiconductor substrate 11 with the insulator film 44 being interposed therebetween, the planarizing film 46 is layered on the color filter 45, and the microlens (on-chip lens) 47 is layered on the planarizing film 46.

On the other hand, on the other surface of the semiconductor substrate 11, the wiring layer 42 is formed in which a gate electrode of a pixel transistor and a metal wiring are wired in a multilayer form in the interlayer insulator film 43. Further, a support substrate 62 is attached to a surface of the interlayer insulator film 43, which is opposite to the semiconductor substrate 11, by an adhesive 61.

In the above pixel structure, the side of the wiring layer 42 is referred to as a front side, and a side opposite to the side of the wiring layer 42 is referred to as a back side, with reference to the semiconductor substrate 11 on which the photodiode 21 is formed. Under such a definition, the present pixel structure is referred to as a back side irradiation (back side incident type) pixel structure since light is irradiated (incident light is introduced) from the back side to the photodiode 21.

According to the back side irradiation pixel structure, in order to introduce incident light from the side of the surface on which the wiring layer 42 is not formed, it is not necessary to layout each wiring of the wiring layer 42 in consideration of the light receiving surface of the photodiode 21. Accordingly, the degree of freedom of layout of the wiring is high, and thus, it is possible to achieve pixel refinement compared with the front side irradiation pixel structure. Further, as is obvious from comparison with FIGS. 3A and 3B, compared with the front side irradiation pixel structure, the distance between the photodiode 21 and the microlens 47 can be set to be short as much as the absence of the wiring layer 42.

<4. Second embodiment>

In the above-described first embodiment, the microlens 47 of the phase difference detection pixel 40 is formed so that the difference between the focal distance in the array direction and the focal distance in the diagonal direction is small, compared with a microlens that has substantially the same area in a planar view. In the pixel structure in which the microlens 47 according to the first embodiment having this characteristic is provided, in the second embodiment, an auxiliary lens that adjusts the focal distance of the microlens 47 is provided between the microlens 47 and the light blocking film 41.

The auxiliary lens adjusts the focal distance of the microlens 47 in a direction where the focal distance of the microlens 47 of the phase difference detection pixel 40 is short. The second embodiment using the auxiliary lens, in a similar way to the case of the first embodiment, may be applied to the front side irradiation pixel structure shown in FIGS. 3A and 3B, and may be applied to the back side irradiation pixel structure shown in FIG. 20.

The auxiliary lens can have a configuration in which the radius of curvature of a circumferential cross section around a central point in a planar view is uniform regardless of a circumferential position. Here, the term "uniform" includes the strictly uniform case and the substantially uniform case. The presence of various variations occurring in design or manufacturing is allowed.

Further, the auxiliary lens may be set to a so-called in-layer lens (inner lens) formed in a layer under the microlens 47. The in-layer lens may be set to a so-called downward convex (or concave) in-layer lens having a convex shape on the side of the light blocking film 41, or may be set to a so-called upward convex in-layer lens having a convex shape on the side of the microlens 47.

In this way, with respect to the phase difference detection pixel 40, by providing the auxiliary lens between the microlens 47 and the light blocking film 41 and by adjusting the focal distance in the direction where the focal distance of the microlens 47 is short, it is possible to achieve the following operations and effects. That is, in a state where the imaging pixel 20 is focused on the photodiode 21, it is possible to focus the phase difference detection pixel 40 on the light blocking film 41. Hereinafter, the microlens 47 of the phase difference detection pixel 40 and the microlens (microlens 64 to be described later) of the imaging pixel 20 may be referred to as "top lenses".

Further, since it is possible to shorten the focal distance of the microlens 47, it is possible to make small the film thickness between the light receiving surface of the photodiode 21 and the bottom portion of the top lenses, that is, to achieve a low height of cross section in the solid-state imaging device. Here, in the case of the front side irradiation pixel structure, since the wiring layer is present on the side on which incident light is introduced, there is a limit in the low height. On the other hand, in the case of the back side irradiation pixel structure, since the wiring layer is not present on the side on which incident light is introduced, the technique according to the second embodiment where the auxiliary lens is provided is more effective than the front side irradiation pixel structure type in view of the low height.

Here, structure examples of the downward convex in-layer lens and the upward convex in-layer lens will be specifically described with reference to the accompanying drawings. Here, a case where the in-layer lenses are applied to the back side irradiation pixel structure shown in FIG. 20 will be described as an example.

<4-1. Downward convex in-layer lens>

FIG. 21 is a cross-sectional view illustrating a pixel structure having a downward convex in-layer lens formed above a color filter. Here, a cross section structure of two pixels of the imaging pixel 20 and the phase difference detection pixel 40 that are adjacent to each other is shown.

As shown in FIG. 21, only with respect to the phase difference detection pixel 40, the light blocking film 41 having an opening 41$_A$ through which some of pupil-divided light passes is formed, and further, a downward convex in-layer lens 63$_A$ is formed in a planarizing film 46 on a color filter 45. The light blocking film 41 is formed corresponding to a unit pixel, and also serves as a light blocking film that blocks light between the pixels. It may also be stated that the "downward convex" in-layer lens 63$_A$ is concave in the light incident direction of the solid-state imaging device. Concaves and convexes of the light blocking film 41 are planarized by a planarizing film 48.

The downward convex in-layer lens 63$_A$, preferably, has a circular shape in a planar view, as shown in FIG. 22, and the radius of curvature r of a circumferential cross section around a central point in a planar view is formed to be uniform regardless of a circumferential position. Here, it is preferable that the downward convex in-layer lens 63$_A$ is integrally formed with the microlens 47 by the same material as in the microlens 47. The downward convex in-layer lens 63$_A$ adjusts the focal distance of the microlens 47 in a direction where the focal distance of the microlens 47 of the phase difference detection pixel 40 is short.

Here, the downward convex in-layer lens 63$_A$ is formed so that the width is narrower than that of the microlens 47 in a planar view. More specifically, as shown in FIG. 23, when the width of the microlens 47 is W$_{top}$ and the width of the downward convex in-layer lens 63$_A$ is W$_{inner}$ in a cross-sectional view, the width of the lens is set to be W$_{top}$>W$_{inner}$. The reason why the width of the downward convex in-layer lens 63$_A$ is set to be W$_{top}$>W$_{inner}$ is because the downward convex in-layer lens 63$_A$ is formed at a position where light flux is narrowed down by the microlens 47.

As described above, by providing the downward convex in-layer lens 63$_A$ that adjusts the focal distance of the microlens 47 to be short with respect to the phase difference detection pixel 40, it is possible to achieve a low height in a cross section of the solid-state imaging device, with respect to the film thickness between the light receiving surface of the photodiode 21 and the bottom portion of the top lenses (47 and 64). Further, by integrally forming the downward convex in-layer lens 63$_A$ with the microlens 47 by the same material as in the microlens 47, it is possible to reduce the number of working processes compared with the case of being separately formed, and to further achieve the low height.

In the pixel structure having the downward convex in-layer lens 63$_A$, light passed through the microlens 47 is converged on the light blocking film 41 by passing through the downward convex in-layer lens 63$_A$ as indicated by a broken line in FIG. 21. In this regard, light passing through the microlens 64 of the imaging pixel 20 is converged on the photodiode 21, as indicated by a broken line in FIG. 21.

In the present example, when the downward convex in-layer lens 63$_A$ is formed in the planarizing film 46 under the microlens 47, a configuration in which the downward convex in-layer lens 63$_A$ is formed in the planarizing film 46 on the color filter 45 has been described, but a configuration in which the downward convex in-layer lens 63$_A$ is formed in the planarizing film 46 under the color filter 45 may be used, as shown in FIG. 24.

<4-2. Upward convex in-layer lens>

FIG. 25 is a cross-sectional view illustrating a pixel structure having an upward convex in-layer lens formed above a color filter. Here, a cross section structure of two pixels of the imaging pixel 20 and the phase difference detection pixel 40 that are adjacent to each other is shown.

As shown in FIG. 25, only with respect to the phase difference detection pixel 40, the light blocking film 41 having an opening 41$_A$ through which some of pupil-divided light passes is formed, and further, an upward convex in-layer lens 63$_B$ is formed in the planarizing film 46 on the color filter 45. The light blocking film 41 is formed corresponding to the unit pixel, and also serves as the light blocking film that blocks light between the pixels. Concaves and convexes of the light blocking film 41 are planarized by the planarizing film 48.

The upward convex in-layer lens 63$_B$, preferably, has a circular shape in a planar view, as shown in FIG. 26, and the radius of curvature r of a circumferential cross section around a central point in a planar view is formed to be uniform regardless of a circumferential position. Here, it is preferable that the upward convex in-layer lens 63$_B$ is integrally formed with the microlens 47 by the same material as in the microlens 47. The upward convex in-layer lens $63_B$ adjusts the focal distance of the microlens 47 in a direction where the focal distance of the microlens 47 of the phase difference detection pixel 40 is short.

Here, the upward convex in-layer lens $63_B$ is formed so that the width is narrower than that of the microlens 47 in a planar view. More specifically, as shown in FIG. 27, when the width of the microlens 47 is $W_{top}$ and the width of the upward convex in-layer lens $63_B$ is $W_{inner}$ in a planar view, the width of the lens is set to be $W_{top} > W_{inner}$. The reason why the width of the upward convex in-layer lens $63_B$ is set to be $W_{top} > W_{inner}$ is because the upward convex in-layer lens $63_B$ is formed at a position where light flux is narrowed down by the microlens 47, in a similar way to the case of the downward convex in-layer lens $63_A$.

As described above, by providing the upward convex in-layer lens $63_B$ that adjusts the focal distance of the microlens 47 to be short with respect to the phase difference detection pixel 40, it is possible to achieve a low height in a cross section of the image sensor, with respect to the film thickness between the light receiving surface of the photodiode 21 and the bottom portion of the top lenses (47 and 64).

In the pixel structure having the upward convex in-layer lens $63_B$, light passed through the microlens 47 is converged on the light blocking film 41 by passing through the upward convex in-layer lens $63_B$ as indicated by a broken line in FIG. 25. In this regard, light passing through the microlens 64 of the imaging pixel 20 is converged on the photodiode 21, as indicated by a broken line in FIG. 25.

In the present example, a configuration in which the upward convex in-layer lens $63_B$ is formed in the planarizing film 46 on the color filter 45 has been described, but a configuration in which the upward convex in-layer lens $63_B$ is formed in the planarizing film 46 under the color filter 45 may be used, as shown in FIG. 28, in a similar way to the case of the downward convex in-layer lens $63_A$.

<4-3. Forming method of auxiliary lens>

When the downward convex in-layer lens $63_A$ or the upward convex in-layer lens $63_B$ are formed, preferably, the downward convex in-layer lens $63_A$ or the upward convex in-layer lens $63_B$ has a circular shape in a planar view, and is formed so that the radius of curvature r of the circumferential cross section around the central point in a planar view is formed to be uniform regardless of the circumferential position. Hereinafter, with respect to the forming method of the downward convex in-layer lens $63_A$ and the upward convex in-layer lens $63_B$, specific examples will be described.

(Seventh Example)

FIGS. 29, 30 and 31 are process diagrams (diagram 1, diagram 2 and diagram 3) illustrating the flow of processes of a forming method of a downward convex in-layer lens according to a seventh example. The seventh example is an example of a forming method in a case where the downward convex in-layer lens $63_A$ is formed on the color filter 45.

Firstly, in process 1 in FIG. 29, concaves and convexes of the light blocking film 41 formed corresponding to the unit pixel are planarized using an acrylic resin, and then, the color filter 45 is formed on the planarizing film 48. Here, only red and green color filters $45_R$ and $45_G$ are shown. The color filter 45 may not be formed on the phase difference detection pixel 40.

Next, in process 2 in FIG. 29, an acrylic resin (n=1.5), a siloxane-based resin (n=1.42 to 1.45), a resin obtained by introducing a fluorine containing group in a resin side-chain (n=1.40 to 1.44) for low refractive indexes of these resins, or a resin obtained by adding hollow silica particles (n=1.30 to 1.39) thereto is formed on the color filter 45 by spin-coating.

Next, in process 3 in FIG. 29, a positive photoresist 72 in which a novolac resin is used as a main component is formed on the spin-coated resin 71 as a pattern having a circular hole shape, in a planar view, corresponding to the phase difference detection pixel 40, using the known photolithography method. Here, the term "circular" includes the strictly circular case and the substantially circular case. The presence of various variations occurring in design or manufacturing is allowed.

Next, in process 4 in FIG. 29, isotropic dry etching is performed using a gas in which oxygen is used as a main component, using the photoresist 72 as a mask. By performing the isotropic dry etching, a mold 73 of the downward convex in-layer lens $63_A$ in which the radius of curvature of the circumferential cross section around the central point in a planar view is uniform regardless of the circumferential position, including the array direction and the diagonal direction of the pixel, is formed. Here, the term "uniform" includes the strictly uniform case and the substantially uniform case. The presence of various variations occurring in design or manufacturing is allowed.

After the dry etching ends, the unnecessary photoresist 72 is removed. The present downward convex in-layer lens $63_A$ does not cover the overall pixel in a planar view. However, since the microlens 47 is present above the downward convex in-layer lens $63_A$ and light is incident in a state of being narrowed down, the downward convex in-layer lens $63_A$ should not cover the overall pixel. This is the same as in the description with reference to FIG. 23.

Next, in process 5 in FIG. 30, on the planarizing film 71 on which the mold 73 of the downward convex in-layer lens $63_A$ is formed, a resin 74 having a higher refractive index than that of the mold material of the downward convex in-layer lens $63_A$ is formed by spin-coating. Thus, the downward convex in-layer lens $63_A$ is formed. The spin-coated resin 74 is formed to be substantially flat in its front surface. With the flat formation, a photoresist pattern for a microlens formation to be subsequently performed is formed with high accuracy.

As the resin 74, a material obtained by adding metallic oxide particles is used for the high refractive index. As the metallic oxide particles used herein, for example, zinc oxide, zirconium oxide, niobium oxide, titanium oxide, stannous oxide, or the like may be used. A material at least adjusted to have a refractive index larger than that of the mold material of the downward convex in-layer lens $63_A$ is used.

Next, in process 6 in FIG. 30, positive photoresist patterns in which a novolac resin is used as a main component are formed corresponding to the imaging pixel 20 and the phase difference detection pixel 40 on the high refractive index resin 74, and then, a heating process is performed at a temperature of a thermal softening point or higher to obtain a photoresist 75 of a lens shape. At this time, the patterns formed corresponding to the pixels 20 and 40 are the same. Here, the term "same" includes the strictly same case and the substantially same case. The presence of various variations occurring in design or manufacturing is allowed.

Next, in process 7 in FIG. 31, an overall etch back is performed using the photoresist 75 of the lens shape as a mask. In this etching process, as a plasma generation device, a device such as an ICP (Inductively Coupled Plasma) device, a CCP (Capacitively Coupled Plasma) device, a TCP (Transformer Coupled Plasma) device, a magnetron RIE (Reactive Ion Etching) device, or an ECR (Electron Cyclotron Resonance) device is used. Further, by appropriately adjusting temperature, pressure or the like using a fluorocarbon gas-based gas such as $CF_4$ or $C_4F_8$ as a main component, a microlens is formed.

In a case where there is a gap between the microlenses 47 and 64 after dry etching, in process 8 in FIG. 31, in order to fill in the gap, for example, film formation of an auxiliary film 76 is performed by CVD (Chemical Vapor Deposition). As the type of the film of the auxiliary film 76, a silicon nitride film, a silicon oxynitride film, a silicon oxide film, or the like may be used as an example. These films may have a function as a reflection prevention film, in addition to the effect of filling in the gap between the microlenses 47 and 64 formed by the high refractive index resin 74.

(Eighth Example)

FIGS. 32, 33 and 34 are process diagrams (diagram 1, diagram 2 and diagram 3) illustrating the flow of processes of a forming method of a downward convex in-layer lens according to an eighth example. The present eighth example is an example of a forming method in a case where the downward convex in-layer lens $63_A$ is formed under the color filter 45.

Firstly, in process 1 in FIG. 32, concaves and convexes of the light blocking film 41 formed corresponding to the unit pixel are planarized by forming the planarizing film 48 using an acrylic resin.

Next, in process 2 in FIG. 32, an acrylic resin (n=1.5), a siloxane-based resin (n=1.42 to 1.45), a resin obtained by introducing a fluorine containing group in a resin side-chain (n=1.40 to 1.44) for low refractive indexes of these resins, or a resin obtained by adding hollow silica particles (n=1.30 to 1.39) thereto is formed on the planarizing film 48 by spin-coating. A material of the planarizing film 46 on the color filter (which will be described later) may be used also as the material of the present resin 71.

Next, in process 3 in FIG. 32, the positive photoresist 72 in which a novolac resin is used as a main component is formed on the spin-coated resin 71 as a pattern having a circular hole shape, in a planar view, corresponding to the phase difference detection pixel 40, using the known photolithography method. Here, the term "circular" includes the strictly circular case and the substantially circular case. The presence of various variations occurring in design or manufacturing is allowed.

Next, in process 4 in FIG. 32, isotropic dry etching is performed using a gas in which oxygen is used as a main component, using the photoresist 72 as a mask. By performing the isotropic dry etching, a mold 73 of the downward convex in-layer lens $63_A$ in which the radius of curvature of the circumferential cross section around the central point in a planar view is uniform regardless of the circumferential position, including the array direction and the diagonal direction of the pixel, is formed. Here, the term "uniform" includes the strictly uniform case and the substantially uniform case. The presence of various variations occurring in design or manufacturing is allowed. After the dry etching ends, the unnecessary photoresist 72 is removed.

Next, in process 5 in FIG. 33, on the planarizing film 71 on which the mold 73 of the downward convex in-layer lens $63_A$ is formed, a resin 74 having a refractive index higher than that of the mold material of the downward convex in-layer lens $63_A$ is formed by spin-coating. As the resin 74, a material obtained by adding metallic oxide particles is used for the high refractive index. As the metallic oxide particles used herein, for example, zinc oxide, zirconium oxide, niobium oxide, titanium oxide, stannous oxide, or the like may be used. A material at least adjusted to have a refractive index larger than that of the mold material of the downward convex in-layer lens $63_A$ is used. Here, the refractive index of the metallic oxide particles is adjusted to be about 1.85 to about 1.95.

Next, in process 6 in FIG. 33, the color filter 45 is formed on the high refractive index resin 74. Here, only red and green color filters $45_R$ and $45_G$ are shown. The color filter 45 may not be formed on the phase difference detection pixel 40.

Next, in process 7 in FIG. 33, the planarizing film 46 is formed on the color filter 45 by a styrene-based resin, or a copolymer-based resin of an acrylic resin and a styrene-based resin, and planarizes the concavities and convexities on the color filter 45.

Next, in process 8 in FIG. 34, positive photoresist patterns in which a novolac resin is used as a main component are formed on the planarizing film 46, corresponding to the imaging pixel 20 and the phase difference detection pixel 40, and then, a heating process is performed at a temperature of a thermal softening point or higher to obtain a photoresist 77 of a lens shape.

Next, in process 9 in FIG. 34, an overall etch back is performed using the photoresist 77 of the lens shape as a mask. In this etching process, as a plasma generation device, a device such as an ICP device, a CCP device, a TCP device, a magnetron RIE device, or an ECR device is used. Further, by appropriately adjusting temperature, pressure or the like using a fluorocarbon gas-based gas such as $CF_4$ or $C_4F_8$ as a main component, the microlenses 47 and 67 are formed.

(Ninth Example)

Next, a modification example of the eighth example will be described as a ninth example. FIG. 35 is a process diagram illustrating a part of the flow of processes of a forming method of a downward convex in-layer lens according to the ninth example. In the present ninth example, one forming method relating to the planarizing film 48 is shown.

Firstly, the light blocking film 41 is formed corresponding to the unit pixel in process 1 in FIG. 35, and then, a silicon oxide film (SiO) 78 is formed by plasma CVD in process 2 in FIG. 35. Then, in process 3 in FIG. 35, a planarizing process is performed by a CMP (Chemical Mechanical Polishing) method to form the planarizing film 48. The state where the planarizing film 48 is formed corresponds to the state after process 1 in FIG. 32 in the eighth example. Further, processes after process 3 in the ninth example are the same processes as the processes from process 2 in the eighth example.

In the forming method of the downward convex in-layer lens $63_A$ described above, the resist pattern, when the circular hole shaped pattern in a planar view is formed, is formed to have a circular shape in a planar view, in process 3 in the seventh example and in process 3 in the eighth example. Here, the term "circular" includes the strictly circular case and the substantially circular case. The presence of various variations occurring in design or manufacturing is allowed.

The circular resist pattern can be formed by using a photomask having a polygonal shape such as a circle or an octagon shown in FIG. 36, where chrome (Cr) is removed. In FIG. 36, an diagonal line region indicates chrome and a white space region indicates glass.

(Tenth Example)

FIGS. 37, 38 and 39 are process diagrams (diagram 1, diagram 2 and diagram 3) illustrating the flow of processes of a forming method of an upward convex in-layer lens according to a tenth example. The present tenth example is an example of a forming method in a case where the upward convex in-layer lens $63_B$ is formed on the color filter 45.

Firstly, in process 1 in FIG. 37, concavities and convexities of the light blocking film 41 formed corresponding to the unit pixel are planarized using an acrylic resin, and then, the color filter 45 is formed on the planarizing film 48. Here, only red and green color filters $45_R$ and $45_G$ are shown. The color filter 45 may not be formed on the phase difference detection pixel 40.

Next, in process 2 in FIG. 37, the planarizing film 46 is formed on the color filter 45 using a styrene-based resin, or a copolymer-based resin of an acrylic resin and a styrene-based resin, to achieve planarization on the color filter 45.

Then, in process 3 in FIG. 37, a silicon nitride film (SiN) 79 is formed on the planarizing film 46 on the color filter 45 by plasma CVD. It is preferable to form the silicon nitride film 79 at a film formation temperature of about 180 degrees C. to about 220 degrees C., for example, in consideration of heat resistance (yellowing due to heat, for example) or the like of an organic film that includes the color filter 45. The refractive index of the formed silicon nitride film 79 is adjusted to be about 1.85 to about 1.95.

Further, a resin of a high refractive index may be used instead of the silicon nitride film 79. As the high refractive index resin, a material obtained by adding metallic oxide particles is used for the high refractive index. As the metallic oxide particles, for example, zinc oxide, zirconium oxide, niobium oxide, titanium oxide, stannous oxide, or the like may be used as an example. Further, the refractive index of the metallic oxide particle is adjusted to be about 1.85 to about 1.95, in a similar way to the silicon nitride film 79. By using a resin instead of the silicon nitride film 79, it is possible to form the resin by spin coating, and thus, the surface of the resin is formed to be substantially flat.

Next, in process 4 in FIG. 37, a positive photoresist pattern in which a novolac resin is used as a main component is formed corresponding to the phase difference detection pixel 40 on the silicon nitride film 79 (or the high refractive index resin), and a heating process of a thermal softening point or higher is performed to obtain a photoresist 80 of a lens shape.

Next, in process 5 in FIG. 38, an overall etch back is performed using the lens shaped photoresist 80 as a mask. In this etching process, as a plasma generation device, a device such as an ICP device, a CCP device, a TCP device, a magnetron RIE device, or an ECR device is used. Further, by appropriately adjusting temperature, pressure or the like using a fluorocarbon gas-based gas such as $CF_4$ or $C_4F_8$ as a main component, the upward convex in-layer lens $63_B$ is formed.

Next, in process 6 in FIG. 38, a resin 81 (low refractive index resin) having a refractive index lower than that of the lens material of the upward convex in-layer lens $63_B$ is formed. The low refractive index resin 81 corresponds to an acrylic resin (n=1.5), a siloxane-based resin (n=1.42 to 1.45), a resin obtained by introducing a fluorine containing group in a resin side-chain (n=1.40 to 1.44) for low refractive indexes of these resins, or a resin obtained by adding hollow silica particles (n=1.30 to 1.39) thereto, for example.

Although not shown, a silicon oxynitride film (SiON) of a material of which the refractive index is between the upward convex in-layer lens $63_B$ and the low refractive index resin (refractive index: the upward convex in-layer lens $63_B$>the low refractive index resin 81) may be formed on an interface between the upward convex in-layer lens $63_B$ and the low refractive index resin 81 using plasma CVD, for example. At this time, the silicon oxynitride film (SiON) acts as a reflection prevention film.

Next, in process 7 in FIG. 38, a resin 82 of a high refractive index is formed on the low refractive index resin 81, by a styrene-based resin, or a copolymer-based resin of an acrylic resin and a styrene-based resin.

Next, in process 8 in FIG. 39, positive photoresist patterns in which a novolac resin is used as a main component are formed corresponding to the imaging pixel 20 and the phase difference detection pixel 40 on the high refractive index resin 82, and then, a heating process is performed at a temperature of a thermal softening point or higher to obtain a photoresist 77 of a lens shape.

Next, in process 9 in FIG. 39, an overall etch back is performed using the photoresist 77 having the lens shape as a mask. In this etching process, as a plasma generation device, a device such as an ICP device, a CCP device, a TCP device, a magnetron RIE device, or an ECR device is used. Further, by appropriately adjusting temperature, pressure or the like using a fluorocarbon gas-based gas such as $CF_4$ or $C_4F_8$ as a main component, the microlenses 47 and 67 are formed.

(Eleventh Example)

FIGS. 40, 41 and 42 are process diagrams (diagram 1, diagram 2 and diagram 3) illustrating the flow of processes of a forming method of an upward convex in-layer lens according to an eleventh example. The present eleventh example is an example of a forming method in a case where the upward convex in-layer lens $63_B$ is formed under the color filter 45.

Firstly, in process 1 in FIG. 40, concavities and convexities of the light blocking film 41 formed corresponding to the unit pixel are planarized by forming the planarizing film 48 using an acrylic resin. The planarizing film 48 may be formed by the forming method according to the ninth example.

Next, in process 2 in FIG. 40, a silicon nitride film (SiN) 79 is formed on the planarizing film 48 by plasma CVD. It is preferable to form the silicon nitride film 79 at a film formation temperature of about 180 degrees C. to about 220 degrees C., for example, in consideration of heat resistance (yellowing due to heat, for example) or the like of the resin in a case where the acrylic resin is selected as the planarizing film 48. The refractive index of the formed silicon nitride film 79 is adjusted to be about 1.85 to about 1.95. Further, in a case where the silicon nitride film is formed by plasma CVD as the planarizing film 48, the silicon nitride film 79 may be formed at a film formation temperature of about 300 degrees C. to about 350 degrees C., for example. H Further, a resin of a high refractive index may be used, instead of the silicon nitride film 79. As the high refractive index resin, a material obtained by adding metallic oxide particles is used for the high refractive index. As the metallic oxide particles, for example, zinc oxide, zirconium oxide, niobium oxide, titanium oxide, stannous oxide, or the like may be used. Further, the refractive index of the metallic oxide particles is adjusted to be about 1.85 to about 1.95, in a similar way to the silicon nitride film 79. By using the resin instead of the silicon nitride film 79, since it is possible to form the resin by spin coating, the planarizing film 48 formed in process 1 may be removed, according to appropriate adjustment of film thickness conditions or the like (if the surface after formation is substantially flat).

Next, in process 3 in FIG. 40, a positive photoresist in which a novolac resin is used as a main component is formed corresponding to the phase difference detection pixel 40 on the silicon nitride film 79 (or the high refractive index resin), and a heating process of a temperature of a thermal softening point or higher is performed to obtain a photoresist 80 of a lens shape.

Next, in process 4 in FIG. 40, an overall etch back is performed using the lens shaped photoresist 80 as a mask. In this etching process, as a plasma generation device, a device such as an ICP device, a CCP device, a TCP device, a magnetron RIE device, or an ECR device is used. Further, by appropriately adjusting temperature, pressure or the like using a fluorocarbon gas-based gas such as $CF_4$ or $C_4F_8$ as a main component, the upward convex in-layer lens 63$_B$ is formed.

Next, in process 5 in FIG. 41, the resin 81 (low refractive index resin) having a refractive index lower than that of the lens material of the upward convex in-layer lens 63$_B$ is formed. The low refractive index resin 81 corresponds to an acrylic resin (n=1.5), a siloxane-based resin (n=1.42 to 1.45), a resin obtained by introducing a fluorine containing group in a resin side-chain (n=1.40 to 1.44) for low refractive indexes of these resins, or a resin obtained by adding hollow silica particles (n=1.30 to 1.39), for example.

Although not shown, a silicon oxynitride film (SiON) of a material of which the refractive index is between the upward convex in-layer lens 63$_B$ and the low refractive index resin (refractive index: the upward convex in-layer lens 63$_B$>the low refractive index resin 81) may be formed on an interface between the upward convex in-layer lens 63$_B$ and the low refractive index resin 81 using plasma CVD, for example. At this time, the silicon oxynitride film (SiON) acts as a reflection prevention film.

Next, in process 6 in FIG. 41, the color filter 45 is formed on the low refractive index resin 81. Here, only red and green color filters 45$_R$ and 45$_G$ are shown. The color filter 45 may not be formed on the phase difference detection pixel 40.

Next, in process 7 in FIG. 41, the planarizing film 46 is formed on the color filter 45 using a styrene-based resin, or a copolymer-based resin of an acrylic resin and a styrene-based resin, to achieve planarization of concavities and convexities on the color filter 45.

Next, in process 8 in FIG. 42, positive photoresist patterns in which a novolac resin is used as a main component are formed corresponding to the imaging pixel 20 and the phase difference detection pixel 40 on the planarizing film 46, and then, a heating process is performed at a temperature of a thermal softening point or higher to obtain a photoresist 77 of a lens shape.

Next, in process 9 in FIG. 42, an overall etch back is performed using the photoresist 77 having the lens shape as a mask. In this etching process, as a plasma generation device, a device such as an ICP device, a CCP device, a TCP device, a magnetron RIE device, or an ECR device is used. Further, by appropriately adjusting temperature, pressure or the like using a fluorocarbon gas-based gas such as $CF_4$ or $C_4F_8$ as a main component, the microlenses 47 and 67 are formed.

In the forming method of the upward convex in-layer lens 63$_B$ described above, the resist pattern, when the circular hole shaped pattern in a planar view is formed, is formed to have a circular shape in a planar view, in process 4 in the tenth example and in process 3 in the eleventh example. Here, the term "circular" includes the strictly circular case and the substantially circular case. The presence of various variations occurring in design or manufacturing is allowed.

The circular resist pattern can be formed by using a photomask having a polygonal shape such as a circle or an octagon shown in FIG. 43, where chrome (Cr) remains. In FIG. 43, an oblique line region indicates chrome and a white space region indicates glass.

<4-4. Modification Example>

However, the phase difference detection pixels 40 are scattered in the pixel array section (light receiving region) 12, as shown in FIG. 44, for example. In a case where the phase difference detection pixels 40 are scattered, as described above, when the high refractive index resin 74 or the low refractive index resin 81 is formed by spin coating on the auxiliary lenses of the phase difference detection pixels 40 (downward convex in-layer lens 63$_A$ or upward convex in-layer lens 63$_B$), coating unevenness occurs using the auxiliary lens as a starting point. This coating unevenness causes deterioration in image quality in the solid-state imaging device.

Thus, in the present modification example (modification example of the second embodiment), a configuration may be employed in which the auxiliary lens (downward convex in-layer lens 63$_A$ or upward convex in-layer lens 63$_B$) is formed with respect to the imaging pixel 20, in addition to the phase difference detection pixel 40. With such a configuration, even though the phase difference detection pixels 40 are scattered, it is possible to prevent the coating unevenness occurring when the high refractive index resin 74 or the low refractive index resin 81 is formed by spin coating on the downward convex in-layer lens 63$_A$ or the upward convex in-layer lens 63$_B$.

In this regard, in order to achieve the low height, the downward convex in-layer lens 63$_A$ is more effective than the upward convex in-layer lens 63$_B$, but in a relatively large solid-state imaging device in which the pixel size has a dimension of 3 microns or more on all sides, for example, even though the formation of the upward convex in-layer lens 63$_B$ causes a slightly high height, there is no characteristic problem.

Accordingly, the technique according to the present modification example, that is, the technique in which the auxiliary lens is formed with respect to the imaging pixel 20 in addition to the phase difference detection pixel 40 may be applied to a case where the auxiliary lens is the downward convex in-layer lens 63$_A$ and a case where the auxiliary lens is the upward convex in-layer lens 63$_B$. FIG. 45 is a cross-sectional view illustrating a pixel structure according to a modification example in a case where a downward convex in-layer lens is used as the auxiliary lens, and FIG. 46 is a cross-sectional view illustrating a pixel structure according to a modification example in a case where an upward convex in-layer lens is used as the auxiliary lens.

Further, by forming the downward convex in-layer lens 63$_A$ or the upward convex in-layer lens 63$_B$ in both of the phase difference detection pixel 40 and the imaging pixel 20, the following operations and effects can be achieved. The operations and effects will be described with reference to FIGS. 47 and 48.

FIG. 47 is a diagram schematically illustrating the relationship between light (incident light) that is incident on an image sensor and a central pixel and peripheral pixels in a pixel array section. As shown in FIG. 47, incident light is incident on an image sensor 10 through a camera set lens 90. Here, the light is vertically incident on a central pixel 20$_A$ in the pixel array section 12, whereas the light is obliquely incident on peripheral pixels 20$_B$.

Accordingly, if the pixel structure of the peripheral pixel 20$_B$ is the same as the pixel structure of the central pixel 20$_A$, some of the obliquely incident light cannot be condensed on the photodiode 21. Thus, a method of shifting the top lenses (microlenses 47 and 64), the color filter 45 or the like, according to the angle of the obliquely incident light, the position of the peripheral pixels $20_B$ or the like, is employed.

FIG. 48 is a cross-sectional view taken along line X-X' of the peripheral pixel $20_B$ in FIG. 47. In FIG. 48, "a" represents the center of the unit pixel (imaging pixel 20 and phase difference detection pixel 40), "b" represents the center of the upward convex in-layer lens $63_B$, "c" represent the center of the color filter 45, and "d" represents the centers of the top lens (microlens 47 or 64).

Arrows in FIG. 47 represent shift directions and relative shift amounts of the upward convex in-layer lens $63_B$, the color filter 45 and the top lenses (microlenses 47 and 64) with reference to the center "a" of the unit pixel in FIG. 48. The relationship between the shift amounts is as follows: upward convex in-layer lens<color filter<top lenses.

Further, it is necessary to shift at least the top lenses (microlenses 47 and 64) with respect to the shift of the respective members, and the color filter 45 or the upward convex in-layer lens $63_B$ may be appropriately adjusted according to angle characteristics of light beams incident on the image sensor 10 through the camera set lens 90. Herein, the pixel structure having the upward convex in-layer lens $63_B$ has been described, but the above shift and adjustment may be similarly applied to the pixel structure having the downward convex in-layer lens $63_A$.

Further, by forming the phase difference detection pixel 40 and the imaging pixel 20 as the pixel structure having the auxiliary lens (downward convex in-layer lens $63_A$ or upward convex in-layer lens $63_B$), it is possible to reliably condense the obliquely incident light by the photodiode 21, compared with a pixel structure without having the auxiliary lens, in the peripheral pixels $20_B$. As a result, it is possible to achieve more excellent shading characteristics.

5. Electronic Apparatus

The present disclosure is not limited to application of a solid-state imaging device, and may be applied to overall electronic apparatuses that uses a solid-state imaging device as an imaging section (image capturing section) and employs a pupil-division phase difference detection method, such as an imaging device such as a digital still camera or a video camera, or a mobile terminal having an imaging function such as a mobile phone.

<Imaging Device>

FIG. 49 is a block diagram illustrating a configuration example of an imaging device that is an example of an electronic apparatus according to an embodiment of the present disclosure.

As shown in FIG. 49, an imaging device 100 according to an embodiment of the present disclosure includes an optical system having an imaging lens 101 or the like, an imaging element 102, a DSP (Digital Signal Processor) circuit 103 that is a camera signal processing section, a frame memory 104, a display device 105, a recording device 106, an operation system 107, a power supply system 108, and the like. Further, the DSP circuit 103, the frame memory 104, the display device 105, the recording device 106, the operation system 107 and the power supply system 108 are connected to each other in a communicable manner through a bus line 109.

The imaging lens 101 imports incident light (image light) from an object and forms an image on an imaging surface of the imaging element 102. The imaging element 102 converts the light amount of the incident light image-formed on the imaging surface by the imaging lens 101 into an electric signal in the unit of pixels, and outputs the result as a pixel signal. As the imaging element 102, a CMOS image sensor according to the above-described first and second embodiments having phase difference detection pixels may be used.

The display device 105 is configured by a panel display device such as a liquid crystal display device or an organic EL (electro luminescence) display device, and displays a moving image or a still image that is captured by the imaging element 102. The recording device 106 records the moving image or the still image captured by the imaging element 102 on a recording medium such as a memory card, a video tape or a DVD (Digital Versatile Disc).

The operation system 107 gives operation commands with respect to various functions of the present imaging device under the operation of a user. The power supply system 108 appropriately supplies a variety of power that is operation power of the DSP circuit 103, the frame memory 104, the display device 105, the recording device 106 and the operation system 107, to these supply targets.

The imaging device 100 according to the embodiment of the present disclosure further includes a lens drive section 110 that drives the imaging lens 101 in its optical axis direction. The lens drive section 110 forms a focus mechanism that performs focus adjustment, together with the imaging lens 101. Further, the imaging device 100 according to the embodiment of the present disclosure performs various controls such as a control of the focus mechanism or a control of the respective components, by a system controller 111.

With respect to the control of the focus mechanism, on the basis of the phase difference detection signal output from the phase difference detection pixel in the CMOS image sensor according to the above-described first and second embodiments, for example, in the DSP circuit 103, an arithmetic process of calculating the shift direction and shift amount of a focus is performed. With such an arithmetic process, the system controller 111 performs a focus control for focusing by moving the imaging lens 101 through the lens drive section 110 in the optical axis direction.

6. Configuration of Embodiments of the Present Disclosure

Embodiments of the present disclosure may be configured as follows.

(1) A solid-state imaging device including:
an imaging pixel that obtains an imaging signal;
a phase difference detection pixel that is arranged in the same light receiving region as the imaging pixel is and pupil-divides light flux of received light to obtain a phase difference detection signal;
a first microlens that is formed corresponding to the imaging pixel; and
a second microlens that is formed corresponding to the phase difference detection pixel and is smaller than a microlens having substantially the same area in a planar view in difference between a focal distance of an opposite side boundary region including an opposite side central portion of a pixel boundary and a focal distance of a diagonal boundary region including a diagonal boundary.

(2) The solid-state imaging device according to (1),
wherein the second microlens is formed to have a focal distance smaller than a focal distance of the first microlens.

(3) The solid-state imaging device according to (1) or (2),
wherein the second microlens is formed so that a bottom surface of the opposite side boundary region including the opposite side central portion of the pixel boundary is higher than a bottom surface of the diagonal boundary region including the diagonal boundary.

(4) The solid-state imaging device according to any one of (1) to (3), wherein the phase difference detection pixel includes a light blocking film that is formed, on a side of a light receiving surface of a photoelectric conversion section, with an opening through which some of pupil-divided light passes, and wherein the second microlens is formed so that a focal position thereof coincides with a position of the light blocking film.

(5) The solid-state imaging device according to (4), wherein the second microlens is formed so that both focal positions thereof in an opposite side direction and a diagonal direction coincide with the position of the light blocking film.

(6) The solid-state imaging device according to (4), wherein the second microlens is formed so that the difference is smaller than a microlens that has an effective area of 80% or more, that is formed in the same plane as the second microlens and that is formed so that adjacent microlenses are in contact with each other at least in an opposite side direction.

(7) The solid-state imaging device according to any one of (1) to (5), wherein the first microlens is formed in a square pattern shape in a planar view, and wherein the second microlens is formed in a circular or polygonal pattern shape in a planar view.

(8) The solid-state imaging device according to (7), wherein there is the same pattern gap between the second microlens and the first microlens, as a pattern gap between the first microlens and another first microlens.

(9) The solid-state imaging device according to any one of (1) to (8), wherein a plurality of the second microlenses are arranged side by side in a transverse direction, a longitudinal direction or an oblique direction in an array of the first microlenses.

(10) The solid-state imaging device according to (4), further including:

an auxiliary lens between the second microlens and the light blocking film.

(11) The solid-state imaging device according to (10), wherein the auxiliary lens is formed so that the radius of curvature of a circumferential cross section around a central point in a planar view is uniform regardless of a circumferential position.

(12) The solid-state imaging device according to (10) or (11), wherein the auxiliary lens has a circular shape in a planar view.

(13) The solid-state imaging device according to any one of (10) to (12), wherein the auxiliary lens is an in-layer lens that is formed inside a layer under the second microlens.

(14) The solid-state imaging device according to any one of (10) to (13), wherein the auxiliary lens is made of the same material as in the second microlens.

(15) The solid-state imaging device according to any one of (10) to (14), wherein the auxiliary lens has a convex shape.

(16) The solid-state imaging device according to any one of (10) to (14), wherein the auxiliary lens has a convex shape on the side of the second microlens.

(17) The solid-state imaging device according to any one of (10) to (16), wherein the imaging pixel and the phase difference detection pixel have a back side irradiation type pixel structure in which incident light is introduced from a side opposite to a side on which a wiring layer is formed.

(18) The solid-state imaging device according to any one of (10) to (17), wherein the auxiliary lens is further provided between the first microlens and the light blocking film.

(19) A method of forming a microlens in a solid-state imaging device including an imaging pixel that obtains an imaging signal, a phase difference detection pixel that is arranged in the same light receiving region as the imaging pixel is and pupil-divides light flux of received light to obtain a phase difference detection signal, a first microlens that is formed corresponding to the imaging pixel, and a second microlens that is formed corresponding to the phase difference detection pixel, the method including:

forming the second microlens that is smaller than a microlens having substantially the same area in a planar view in difference between a focal distance of an opposite side boundary region including an opposite side central portion of a pixel boundary and a focal distance of a diagonal boundary region including a diagonal boundary.

(20) An electronic apparatus including:

a solid-state imaging device including an imaging pixel that obtains an imaging signal, a phase difference detection pixel that is arranged in the same light receiving region as the imaging pixel is and pupil-divides light flux of received light to obtain a phase difference detection signal, a first microlens that is formed corresponding to the imaging pixel, and a second microlens that is formed corresponding to the phase difference detection pixel and is smaller than a microlens having substantially the same area in a planar view in difference between a focal distance of an opposite side boundary region including an opposite side central portion of a pixel boundary and a focal distance of a diagonal boundary region including a diagonal boundary; and a focus mechanism that is able to perform focus adjustment on the basis of a phase difference detection signal output from the phase difference detection pixel.

(21) A solid-state imaging device comprising:

an imaging pixel located in a light receiving region, the imaging pixel being a component of a unit pixel, the unit pixel being one of a plurality of unit pixels arranged in an array direction;

a phase difference detection pixel located in the light receiving region and being a component of the unit pixel;

a photodiode corresponding to at least the phase difference detection pixel and having an upper surface;

a first microlens corresponding to the imaging pixel; and a second microlens corresponding to the phase difference detection pixel, the second microlens having a first bottom surface in the array direction and a second bottom surface in a direction diagonal to the array direction, the second bottom surface being closer to the upper surface of the photodiode than the first bottom surface.

(22) The solid-state imaging device according to (21), wherein the first bottom surface is located at an outer boundary of the second microlens in the array direction, and the second bottom surface is located at an outer boundary of the second microlens in the diagonal direction.

(23) The solid-state imaging device according to (21), wherein the second microlens is configured such that a first focal distance corresponding to the array direction coincides with a second focal distance corresponding to the diagonal direction.

(24) The solid-state imaging device according to (21), wherein the phase difference detection pixel includes a light blocking film, and the second microlens is configured such that a focal distance thereof coincides with a position of the light blocking film.

(25) The solid-state imaging device according to (23), wherein the phase difference detection pixel includes a light blocking film, and the second microlens is configured such that the first and second focal distances coincide with the position of the light blocking film.

(26) The solid-state imaging device according to (21), wherein the second microlens is configured such that a focal length difference defined as the difference between a first focal distance corresponding to the array direction and a second focal distance corresponding to the diagonal direction is smaller than the focal length difference of a microlens adjacent to the second microlens.

(27) The solid-state imaging device according to (21), wherein an other imaging pixel is a component of the pixel unit, a third microlens corresponding to the other imaging pixel, a gap between the first microlens and the third microlens in a planar view being substantially similar to the gap between the first microlens and the second microlens in the planar view.

(28) The solid-state imaging device according to (21), wherein an other phase difference detection pixel is a component of the pixel unit, the first phase difference detection pixel being adjacent to the other phase difference detection pixel in the array direction.

(29) The solid-state imaging device according to (21), further comprising:
a first auxiliary lens corresponding to the first microlens and located between the first microlens and the upper surface of the photodiode, the first auxiliary lens being concave in a light incident direction of the solid-state imaging device.

(30) The solid-state imaging device according to (21), further comprising:
a second auxiliary lens corresponding to the second microlens and located between the second microlens and the upper surface of the photodiode, the second auxiliary lens being convex in a light incident direction of the solid-state imaging device.

(31) The solid-state imaging device according to (30), wherein the second microlens has a width in the array direction that is greater than a width of the second auxiliary lens in the array direction.

(32) The solid-state imaging device according to (21), wherein in a cross section along a light incident direction for a central pixel having a corresponding peripheral pixel, a vertical center line of a microlens of the peripheral pixel is offset from a vertical center line of the peripheral pixel.

(33) The solid-state imaging device according to (21), wherein in a cross section along a light incident direction for a central pixel having a corresponding peripheral pixel, a vertical center line of a microlens of the peripheral pixel is offset from a vertical center line of an auxiliary lens corresponding to the microlens of the peripheral pixel.

(34) A solid-state imaging device comprising:
an imaging pixel located in a light receiving region, the imaging pixel being a component of a unit pixel, the unit pixel being one of a plurality of unit pixels arranged in an array direction;
a phase difference detection pixel located in the light receiving region and being a component of the unit pixel;
a first microlens corresponding to the imaging pixel; and
a second microlens corresponding to the phase difference detection pixel, wherein the second microlens is configured such that a focal length difference defined as a difference between a first focal distance corresponding to a cross section of the array direction and a second focal distance corresponding to a cross section of the diagonal direction is smaller than a corresponding focal length difference of a microlens adjacent to the second microlens.

(35) The solid-state imaging device according to (34), wherein the second microlens is configured such that the first focal distance coincides with a second focal distance.

(36) The solid-state imaging device according to (35), wherein the phase difference detection pixel includes a light blocking film, and the second microlens is configured such that the first and second focal distances coincide with the position of the light blocking film.

(37) An electronic apparatus comprising:
a solid-state imaging device comprising:
an imaging pixel located in a light receiving region, the imaging pixel being a component of a unit pixel, the unit pixel being one of a plurality of unit pixels arranged in an array direction;
a phase difference detection pixel located in the light receiving region and being a component of the unit pixel;
a photodiode corresponding to at least the phase difference detection pixel and having an upper surface;
a first microlens corresponding to the imaging pixel; and
a second microlens corresponding to the phase difference detection pixel, the second microlens having a first bottom surface in the array direction and a second bottom surface in a direction diagonal to the array direction, the second bottom surface being closer to the upper surface of the photodiode than the first bottom surface.

The present disclosure contains subject matter related to that disclosed in Japanese Priority Patent Application JP 2012-045286 filed in the Japan Patent Office on Mar. 1, 2012, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

10 CMOS image sensor
11 Semiconductor substrate (chip)
12 pixel array section
13 row scanning section
14 column processing section
15 column scanning section
16 system controller
17 pixel drive line
18 vertical signal line
19 horizontal bus
20 unit pixel (imaging pixel)
21 photodiode
22 transfer transistor (reading gate section)
23 reset transistor
24 amplification transistor
25 selection transistor
40 phase difference detection pixel
41 light blocking film
42 wiring layer
43 interlayer insulator film
44 insulator film
45 color filter 46 planarizing film
47 phase difference detection pixel microlens (second microlens)
$63_A$ downward convex in-layer lens
$63_B$ upward convex in-layer lens
64 imaging pixel microlens (first microlens)

The invention claimed is:

1. A solid-state imaging device, comprising:
   a matrix of microlenses in a planar view of the solid-state imaging device, wherein a surface of the matrix has convex portions,
   wherein a first one of the microlenses has a first one of the convex portions and a second one of the microlenses has a second one of the convex portions, the second one of the convex portions protruding from the surface of the matrix less than the first one of the convex portions, and
   wherein the first one of the microlenses is adjacent to a third one of the microlenses along one of a row direction or a diagonal direction in a planar view of the matrix, each of the first one of the microlenses and the third one of the microlenses corresponding to a phase difference detection pixel.

2. The solid-state imaging device according to claim 1, wherein in the planar view of the solid-state imaging device, a pattern shape for the first one of the convex portions differs from a pattern shape for the second one of the convex portions.

3. The solid-state imaging device according to claim 1, wherein the second one of the microlenses corresponds to an imaging pixel.

4. The solid-state imaging device according to claim 1, wherein the third one of the microlenses has a third one of the convex portions, and wherein the third one of the convex portions protrudes from the surface of the matrix less than the first one of the convex portions.

5. The solid-state imaging device according to claim 1, wherein the first one of the convex portions is between the third one of the convex portions and a fourth one of the convex portions along the diagonal direction in the planar view, and wherein the fourth one of the convex portions protrudes from the surface of the matrix.

6. The solid-state imaging device according to claim 5, wherein the first one of the convex portions is between the second one of the convex portions and a fifth one of the convex portions along a row direction in the planar view, and wherein the fifth one of the convex portions protrudes from the surface of the matrix.

7. The solid-state imaging device according to claim 6, wherein along another diagonal direction in the planar view, the first one of the convex portions is between a sixth one of the convex portions and a seventh one of the convex portions.

8. The solid-state imaging device according to claim 7, wherein along a column direction in the planar view, the second one of the convex portions is between the third one of the convex portions and the sixth one of the convex portions.

9. The solid-state imaging device according to claim 8, wherein along a direction parallel to the column direction in the planar view, the fifth one of the convex portions is between the fourth one of the convex portions and the seventh one of the convex portions.

10. The solid-state imaging device according to claim 1, further comprising:
    a light blocking film between a semiconductor substrate and the first one of the microlenses in a cross-sectional view of the solid-state imaging device.

11. The solid-state imaging device according to claim 10, further comprising: a color filter between the substrate and the first one of the microlenses.

12. The solid-state imaging device according to claim 10, further comprising: a photodiode in the semiconductor substrate.

13. The solid-state imaging device according to claim 12, wherein a portion of the light blocking film is between the photodiode and the first one of the microlenses.

14. The solid-state imaging device according to claim 12, further comprising:
    an opening through the light blocking film, the opening is between the photodiode and the first one of the microlenses.

15. The solid-state imaging device according to claim 14, wherein the light blocking film completely surrounds the opening in a planar view of the light blocking film.

16. The solid-state imaging device according to claim 1, further comprising:
    a light blocking film between a semiconductor substrate and the first one of the microlenses in a cross-sectional view of the solid-state imaging device, the light blocking film having an opening of size equivalent to half a size of a unit pixel in a planar view.

17. The solid-state imaging device according to claim 16, wherein the light blocking film is made of a material having tungsten or titanium.

18. An electronic apparatus, comprising:
    a solid-state imaging device comprising:
        a matrix of microlenses in a planar view of the solid-state imaging device, wherein a surface of the matrix has convex portions,
        wherein a first one of the microlenses has a first one of the convex portions and a second one of the microlenses has a second one of the convex portions, the second one of the convex portions protruding from the surface of the matrix less than the first one of the convex portions, and
        wherein the first one of the microlenses is adjacent to a third one of the microlenses along one of a row direction or a diagonal direction in a planar view of the matrix, each of the first one of the microlenses and the third one of the microlenses corresponding to a phase difference detection pixel; and
    a display device configured display a moving image or a still image that is captured by the solid-state imaging device.

* * * * *